(12) United States Patent
Or-Bach et al.

(10) Patent No.: US 9,954,080 B2
(45) Date of Patent: Apr. 24, 2018

(54) 3D INTEGRATED CIRCUIT DEVICE

(71) Applicant: Monolithic 3D Inc., San Jose, CA (US)

(72) Inventors: Zvi Or-Bach, San Jose, CA (US);
Deepak C. Sekar, San Jose, CA (US);
Brian Cronquist, San Jose, CA (US)

(73) Assignee: MONOLITHIC 3D INC., San Jose, CA (US)

( * ) Notice: Subject to any disclaimer, the term of this patent is extended or adjusted under 35 U.S.C. 154(b) by 0 days.

(21) Appl. No.: 15/622,124

(22) Filed: Jun. 14, 2017

(65) Prior Publication Data
US 2017/0287844 A1 Oct. 5, 2017

Related U.S. Application Data

(63) Continuation-in-part of application No. 14/880,276, filed on Oct. 11, 2015, now Pat. No. 9,691,869, which
(Continued)

(51) Int. Cl.
*H01L 29/76* (2006.01)
*H01L 29/94* (2006.01)
(Continued)

(52) U.S. Cl.
CPC ...... *H01L 29/66704* (2013.01); *H01L 21/743* (2013.01); *H01L 23/34* (2013.01); *H01L 23/481* (2013.01); *H01L 23/50* (2013.01); *H01L 23/544* (2013.01); *H01L 27/0207* (2013.01); *H01L 27/0688* (2013.01); *H01L 27/088* (2013.01); *H01L 27/0886* (2013.01); *H01L 27/10802* (2013.01); *H01L 27/10894* (2013.01); *H01L 27/10897* (2013.01); *H01L 27/11526* (2013.01); *H01L 27/11551* (2013.01); *H01L 27/11573* (2013.01); *H01L 27/11578* (2013.01); *H01L 27/11807* (2013.01); *H01L 29/1066* (2013.01); *H01L 29/66272* (2013.01); *H01L 29/66825* (2013.01); *H01L 29/66901* (2013.01); *H01L 29/732* (2013.01); *H01L 29/7841* (2013.01); *H01L 29/808* (2013.01); *H01L 27/0623* (2013.01); *H01L 27/249* (2013.01); *H01L 27/2436* (2013.01); *H01L 2224/16225* (2013.01); *H01L 2224/73253* (2013.01); *H01L 2924/00* (2013.01); *H01L 2924/12032* (2013.01); *H01L 2924/1305* (2013.01);
(Continued)

(58) Field of Classification Search
CPC . H01L 23/544; H01L 27/0207; H01L 27/088; H01L 29/66704; H01L 29/456
USPC .................................................. 257/369, 499
See application file for complete search history.

(56) References Cited

U.S. PATENT DOCUMENTS

| 5,563,084 | A | * | 10/1996 | Ramm | ................ H01L 21/6835 |
| | | | | | 148/DIG. 135 |
| 7,521,806 | B2 | * | 4/2009 | Trezza | .............. H01L 21/76898 |
| | | | | | 257/774 |

(Continued)

*Primary Examiner* — David S Blum
(74) *Attorney, Agent, or Firm* — Tran & Associates

(57) ABSTRACT

A 3D integrated circuit device, including: a first transistor; a second transistor; and a third transistor, where the third transistor is overlaying the second transistor and the second transistor is overlaying the first transistor, where the first transistor controls the supply of a ground or a power signal to the third transistor, and where the first transistor, the second transistor and the third transistor are aligned to each other with less than 100 nm misalignment.

20 Claims, 56 Drawing Sheets

Related U.S. Application Data is a continuation-in-part of application No. 14/472,108, filed on Aug. 28, 2014, now Pat. No. 9,305,867, which is a continuation of application No. 13/959,994, filed on Aug. 6, 2013, now Pat. No. 8,836,073, which is a continuation of application No. 13/441,923, filed on Apr. 9, 2012, now Pat. No. 8,557,632.

(51) Int. Cl.

| | | |
|---|---|---|
| H01L 31/062 | (2012.01) | |
| H01L 31/113 | (2006.01) | |
| H01L 31/119 | (2006.01) | |
| H01L 29/00 | (2006.01) | |
| H01L 29/66 | (2006.01) | |
| H01L 23/544 | (2006.01) | |
| H01L 27/02 | (2006.01) | |
| H01L 27/088 | (2006.01) | |
| H01L 21/74 | (2006.01) | |
| H01L 27/11551 | (2017.01) | |
| H01L 29/78 | (2006.01) | |
| H01L 23/34 | (2006.01) | |
| H01L 27/11573 | (2017.01) | |
| H01L 23/50 | (2006.01) | |
| H01L 27/11526 | (2017.01) | |
| H01L 23/48 | (2006.01) | |
| H01L 27/118 | (2006.01) | |
| H01L 29/10 | (2006.01) | |
| H01L 27/108 | (2006.01) | |
| H01L 29/732 | (2006.01) | |
| H01L 27/11578 | (2017.01) | |
| H01L 29/808 | (2006.01) | |
| H01L 27/06 | (2006.01) | |
| H01L 27/24 | (2006.01) | |

(52) U.S. Cl.
CPC ............. *H01L 2924/13062* (2013.01); *H01L 2924/13091* (2013.01); *H01L 2924/1461* (2013.01); *H01L 2924/16152* (2013.01)

(56) References Cited

U.S. PATENT DOCUMENTS 8,841,777 B2 * 9/2014 Farooq ................ H01L 21/2007
                                                          257/777
9,000,557 B2 * 4/2015 Or-Bach ............. H01L 21/8221
                                                          257/506

* cited by examiner

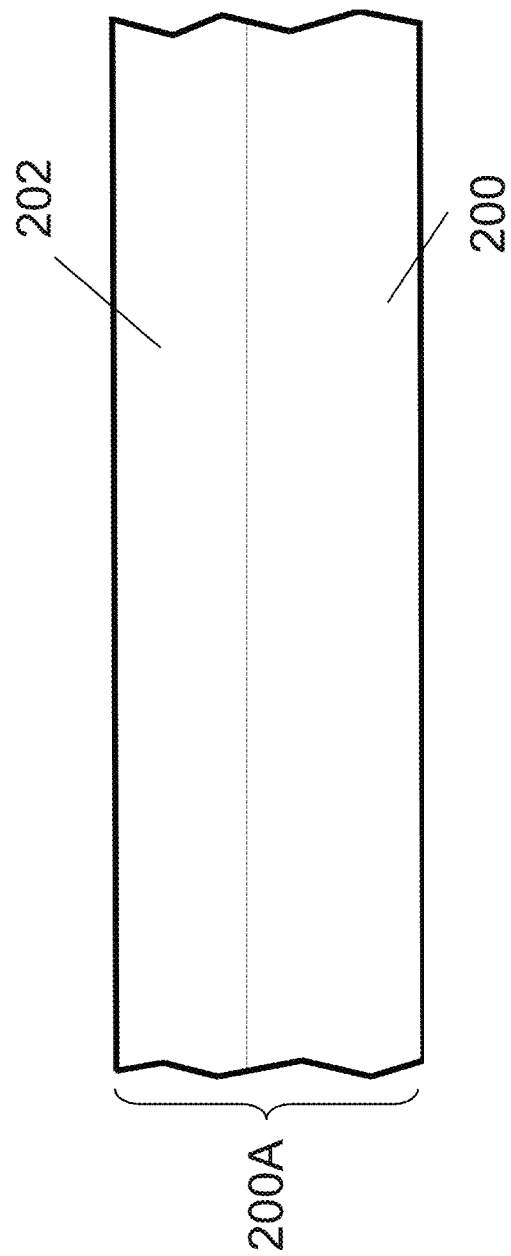

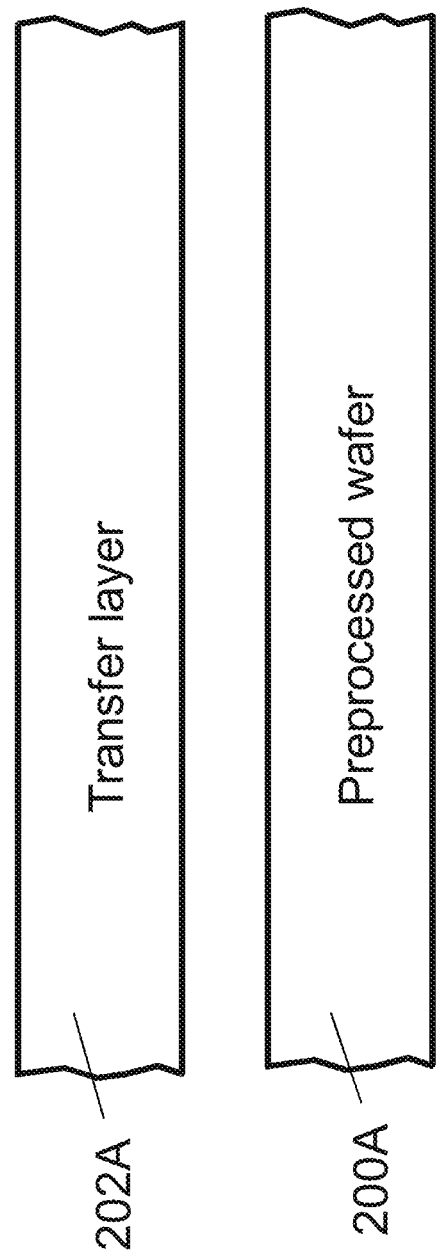

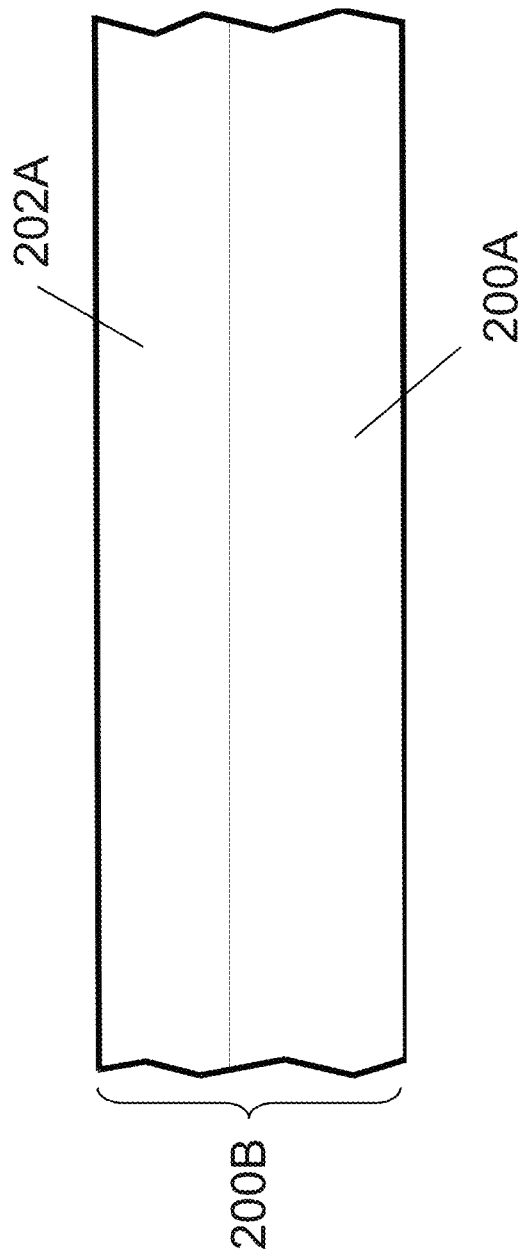

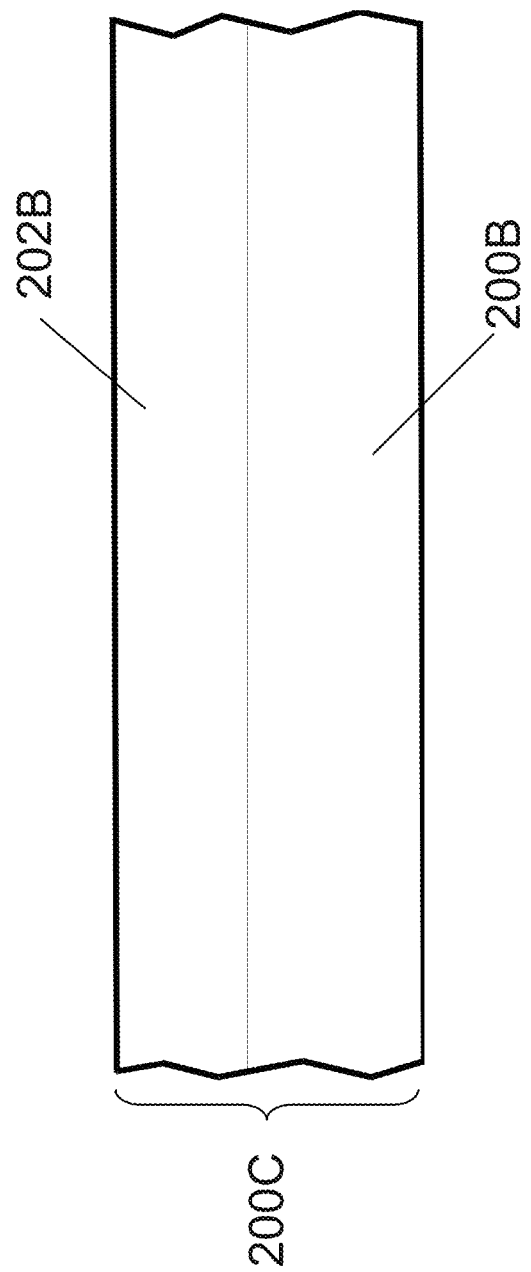

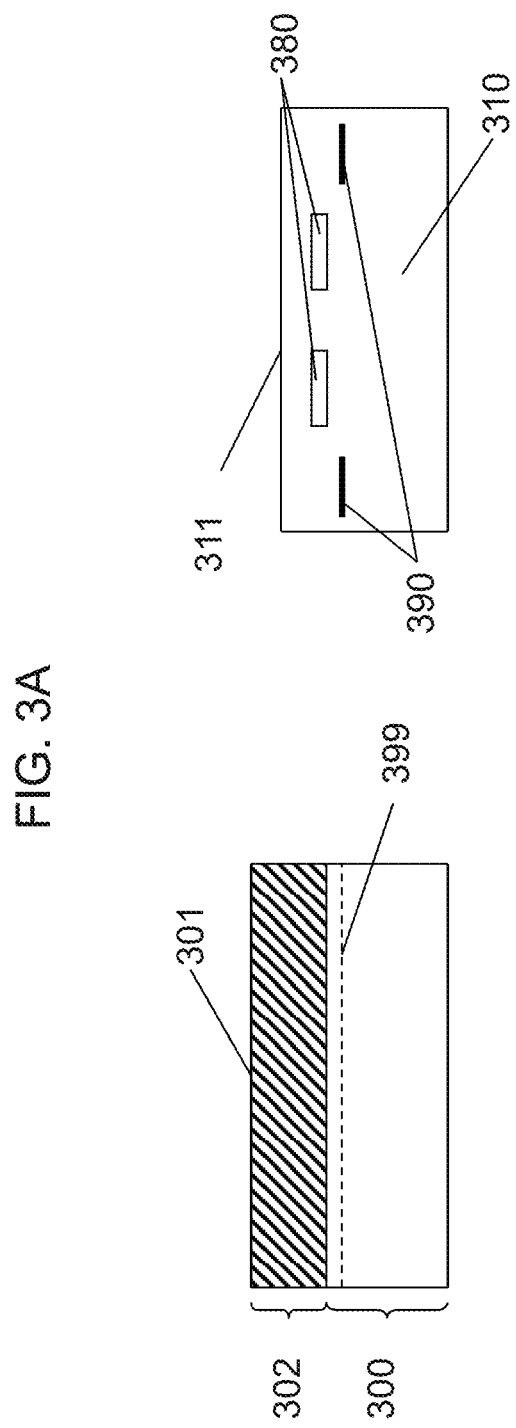

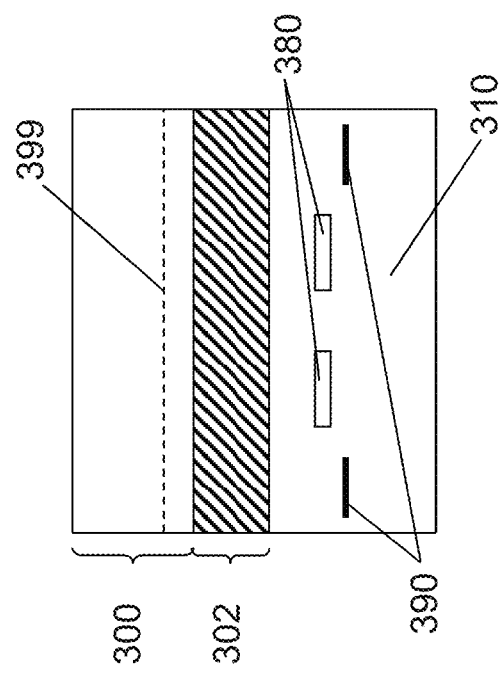

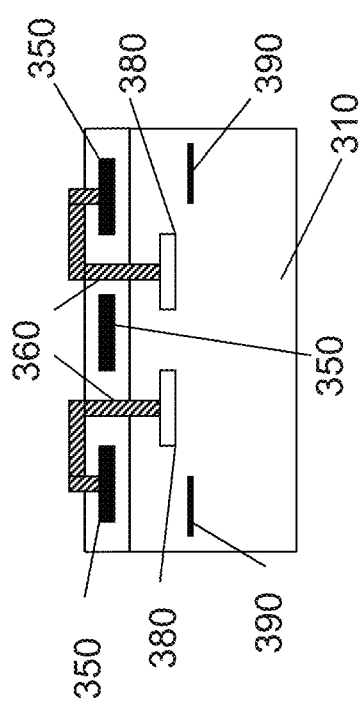

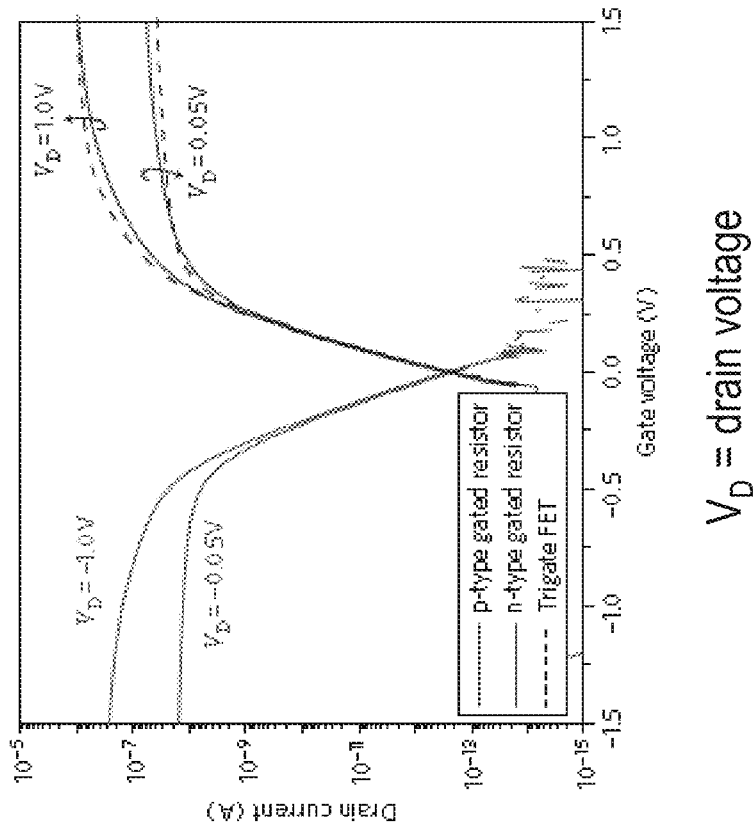
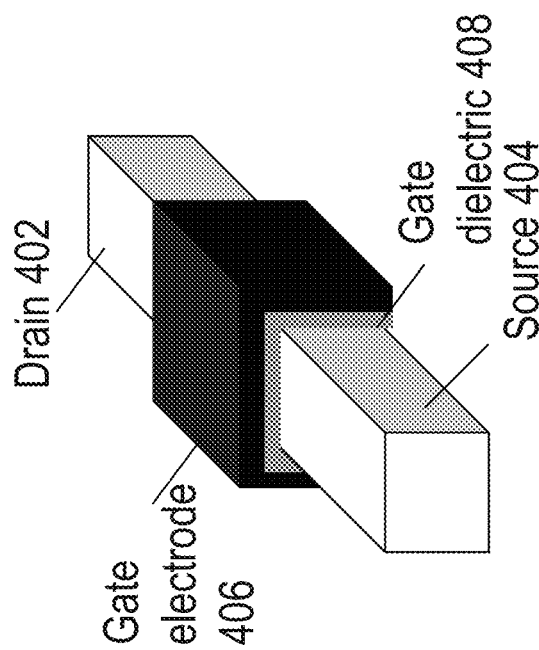
Fig. 4

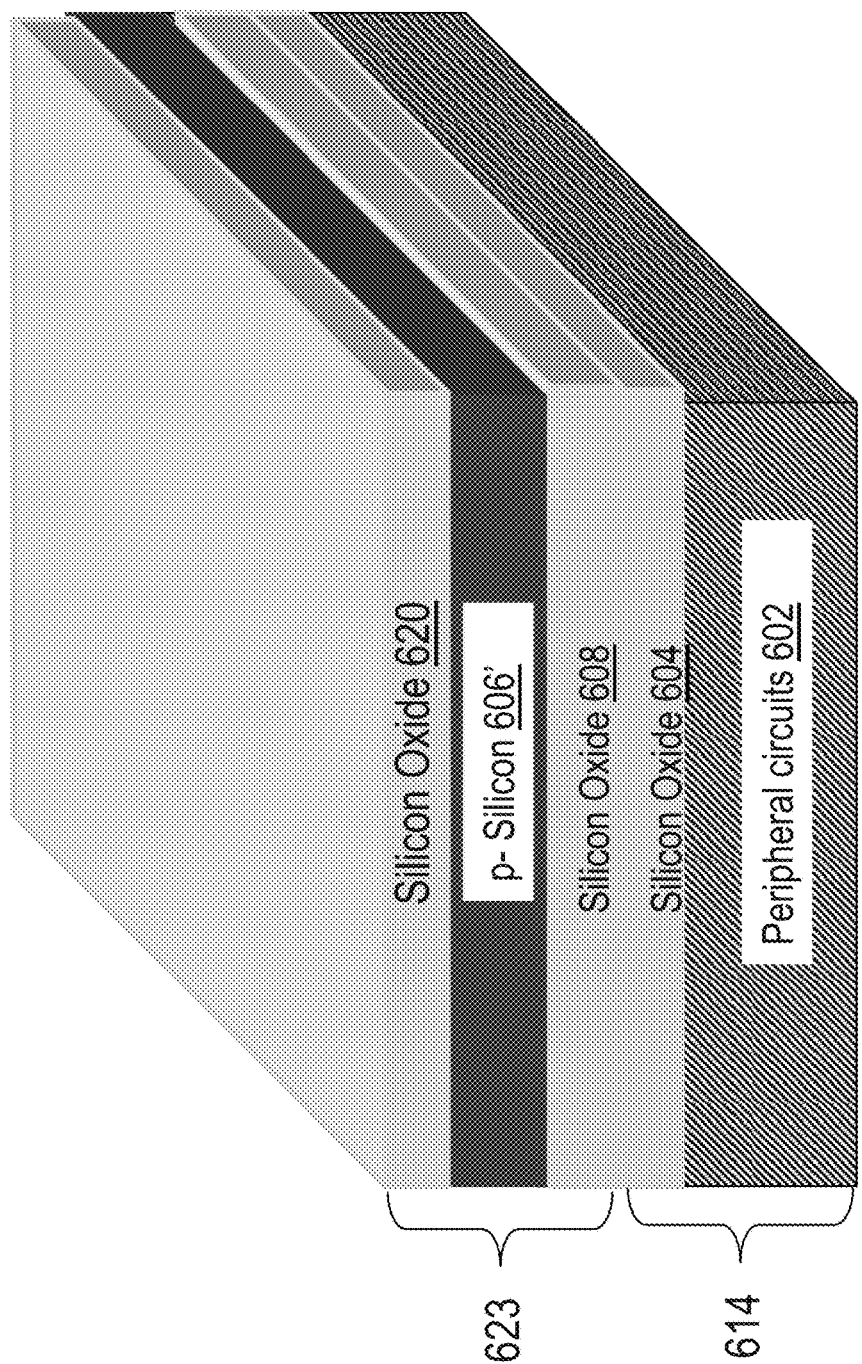

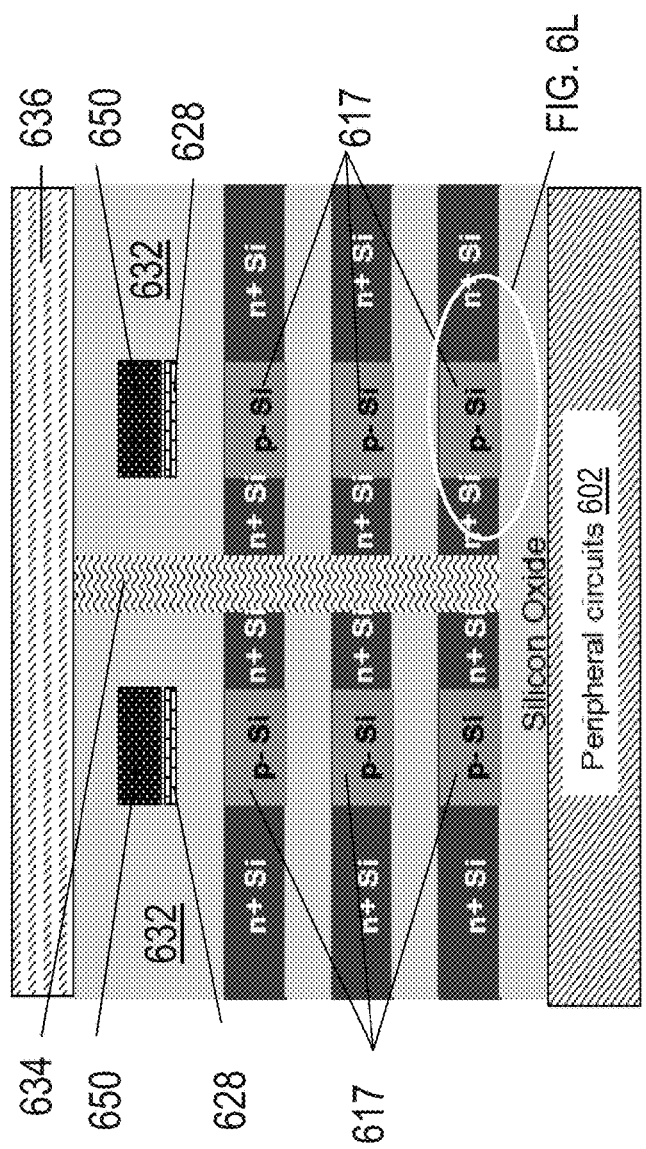
FIG. 6K1

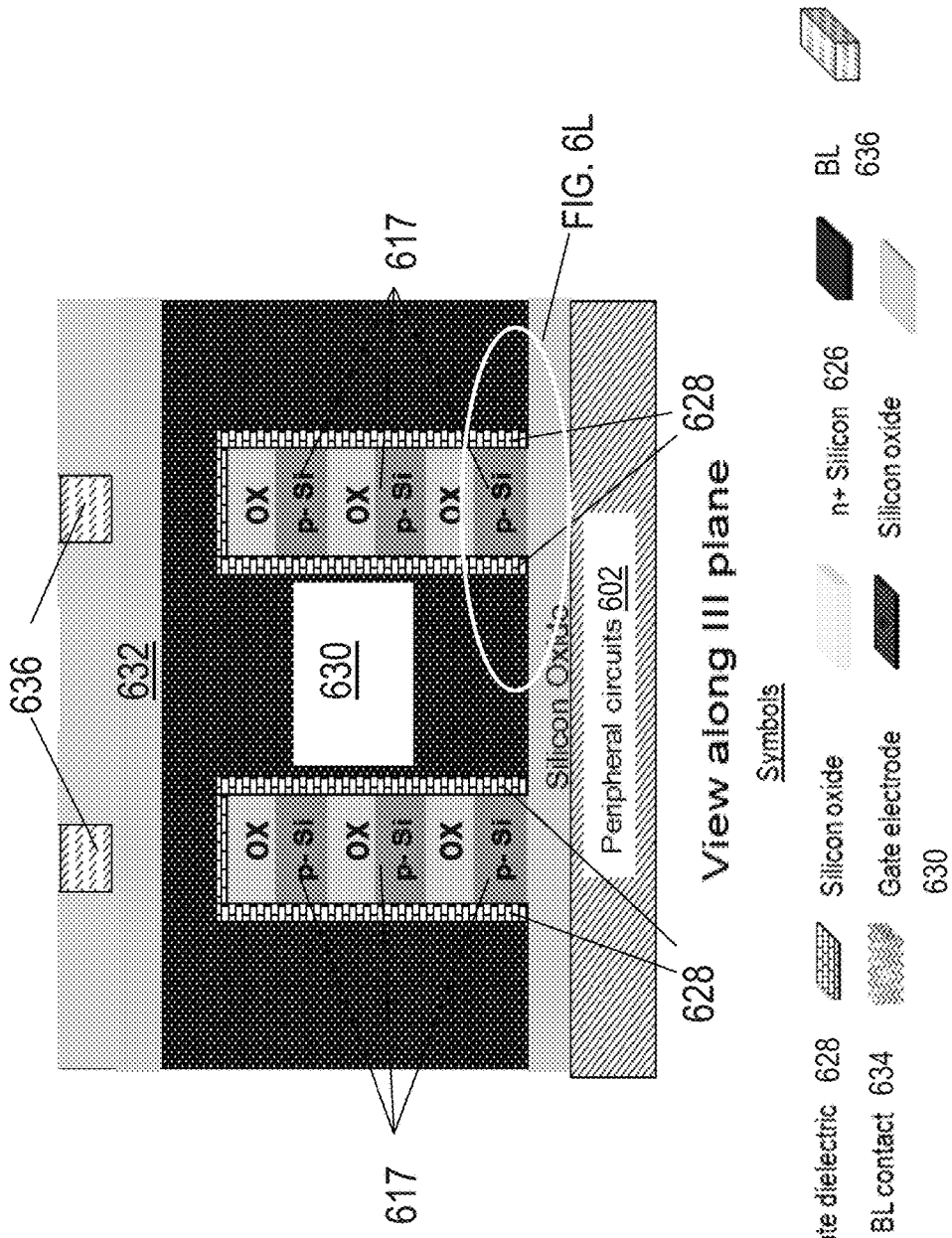
FIG. 6K2

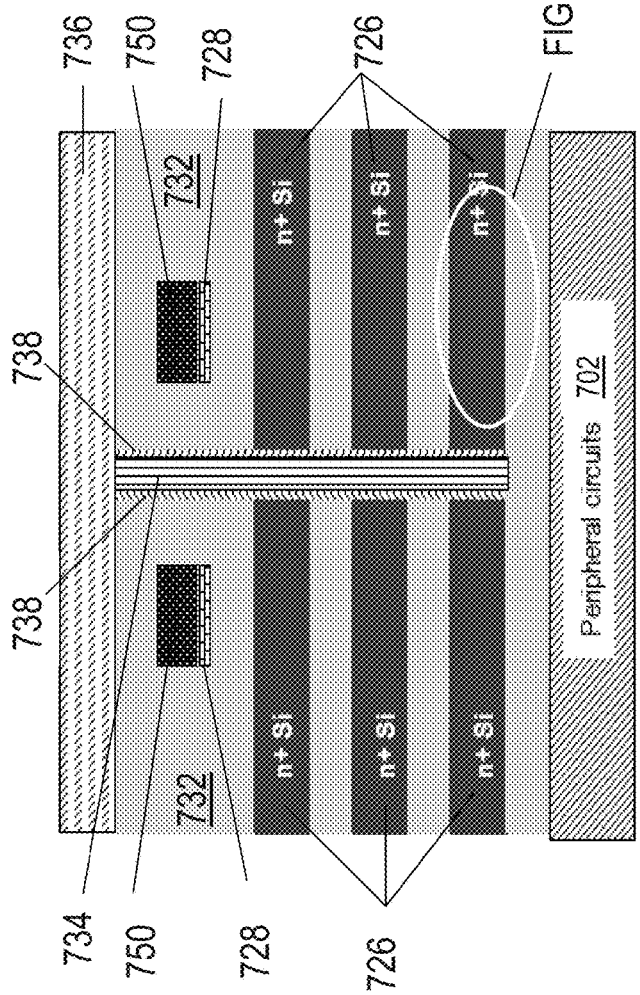

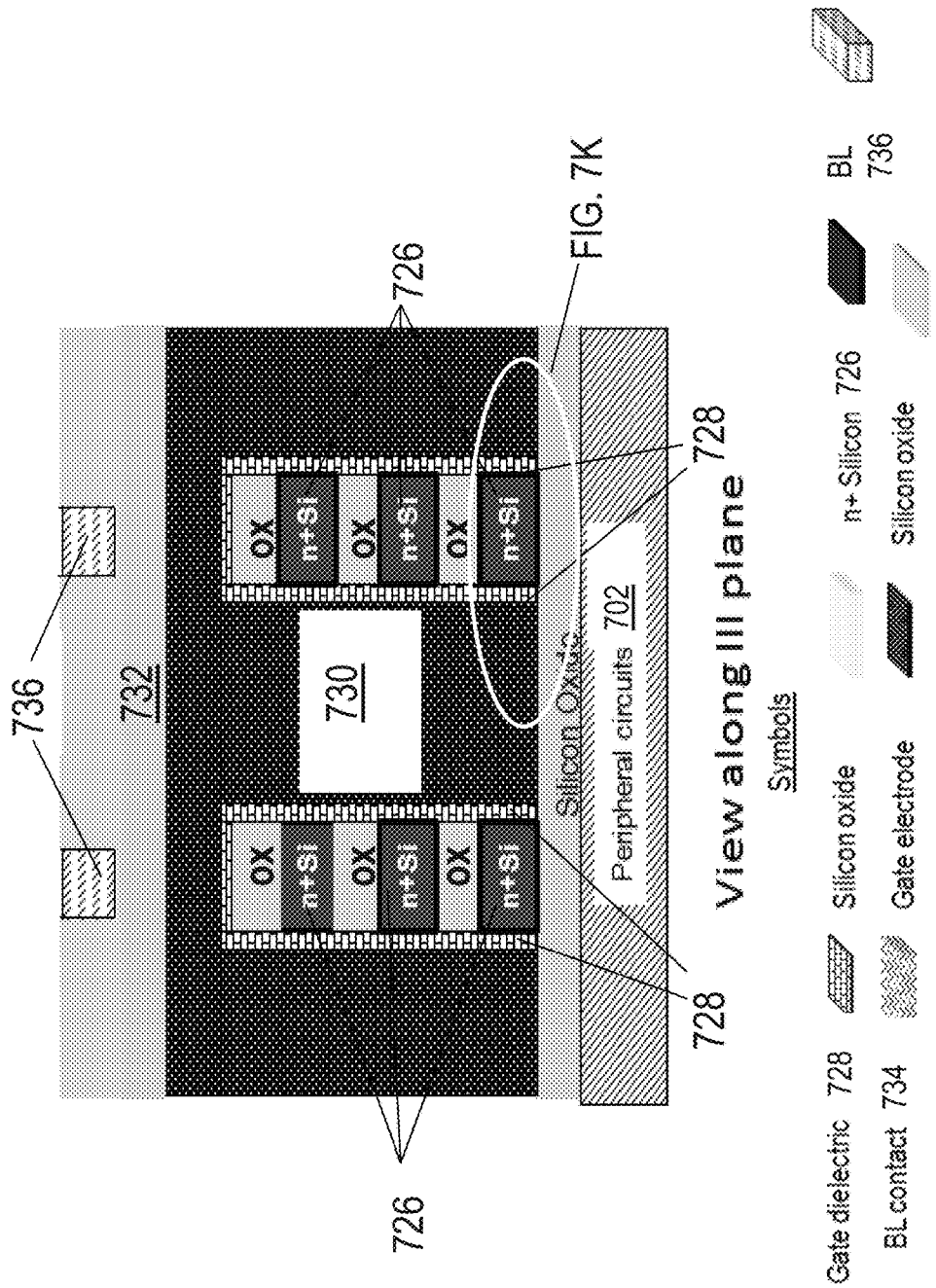

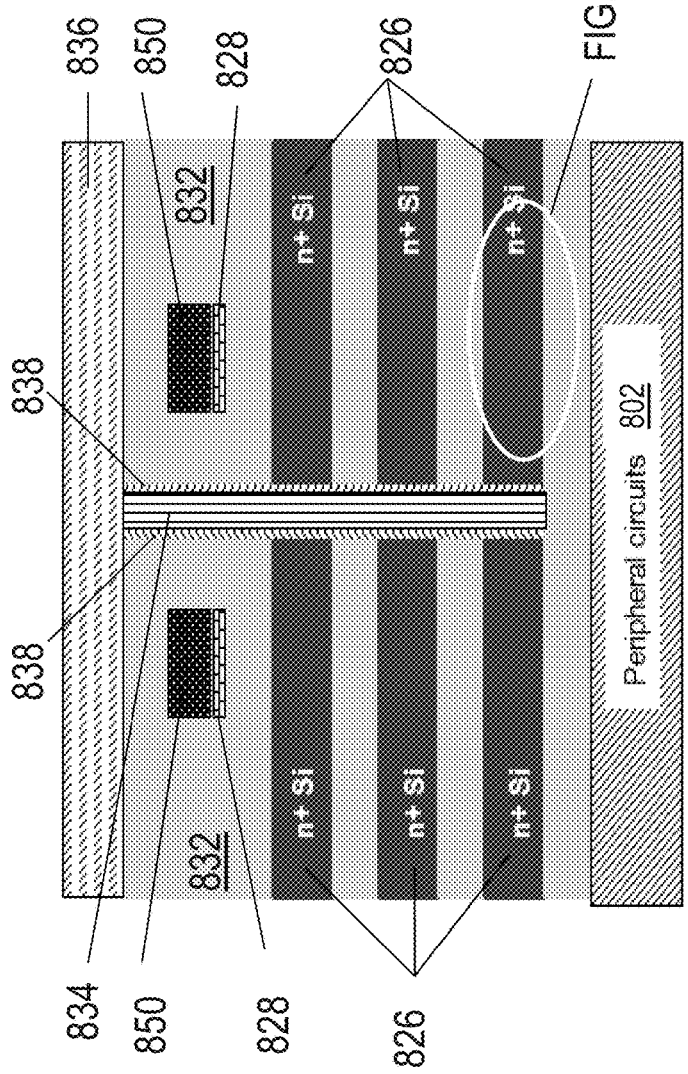

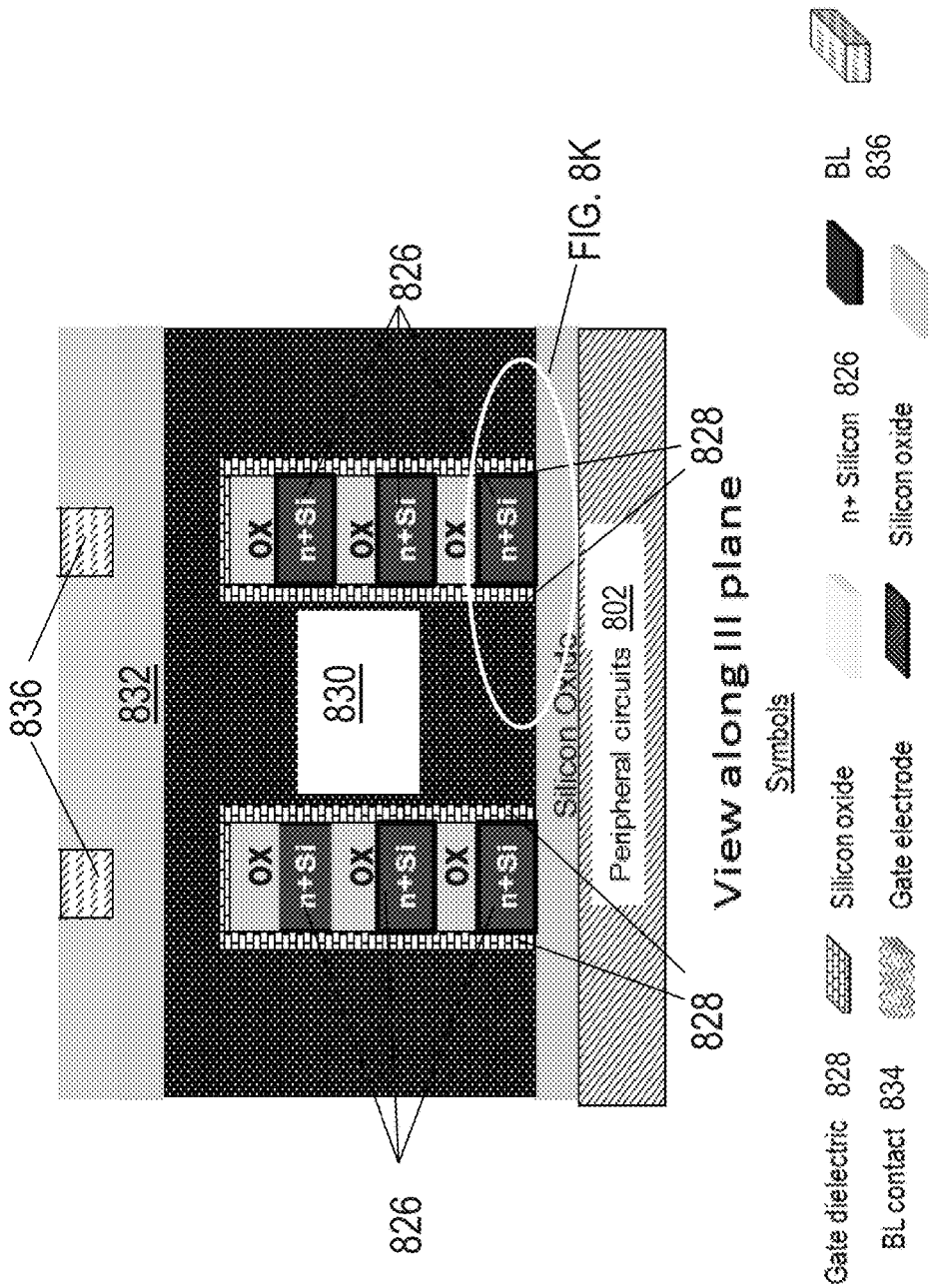
FIG. 8J2

3D INTEGRATED CIRCUIT DEVICE

CROSS-REFERENCE OF RELATED APPLICATIONS

This application is a continuation-in-part application of U.S. patent application Ser. No. 14/880,276, (now U.S. Pat. No. 9,691,869), which was filed on Oct. 11, 2015, which is a continuation-in-part application of U.S. patent application Ser. No. 14/472,108, which was filed on Aug. 28, 2014 (now U.S. Pat. No. 9,305,867 issued on Apr. 5, 2016), which is a continuation application of U.S. patent application Ser. No. 13/959,994, which was filed on Aug. 6, 2013 (now U.S. Pat. No. 8,836,073 issued on Sep. 25, 2014), which is a continuation application of U.S. patent application Ser. No. 13/441,923, which was filed on Apr. 9, 2012 (now U.S. Pat. No. 8,557,632 issued on Oct. 15, 2013), the entire contents of the foregoing are incorporated herein by reference.

BACKGROUND OF THE INVENTION

1. Field of the Invention

This application relates to the general field of Integrated Circuit (IC) devices and fabrication methods, and more particularly to multilayer or Three Dimensional Integrated Circuit (3D IC) devices and fabrication methods.

2. Discussion of Background Art

Performance enhancements and cost reductions in generations of electronic device technology has generally been achieved by reducing the size of the device, resulting in an enhancement in device speed and a reduction in the area of the device, and hence, its cost. This may be generally referred to as 'device scaling'. The dominant electronic device technology in use today may be the Metal-Oxide-Semiconductor field effect transistor (MOSFET) technology.

Performance and cost are driven by transistor scaling and the interconnection, or wiring, between those transistors. As the dimensions of the device elements have approached the nanometer scale, the interconnection wiring now dominates the performance, power, and density of integrated circuit devices as described in J. A. Davis, et. al., Proc. IEEE, vol. 89, no. 3, pp. 305-324, March 2001 (Davis).

Davis further teaches that three dimensional integrated circuits (3D ICs), i.e. electronic chips in which active layers of transistors are stacked one above the other, separated by insulating oxides and connected to each other by metal interconnect wires, may be the best way to continue Moore's Law, especially as device scaling slows, stops, or becomes too costly to continue. 3D integration would provide shorter interconnect wiring and hence improved performance, lower power consumption, and higher density devices.

One approach to a practical implementation of a 3D IC independently processes two fully interconnected integrated circuits including transistors and wiring, thins one of the wafers, bonds the two wafers together, and then makes electrical connections between the bonded wafers with Thru Silicon Vias (TSV) that may be fabricated prior to or after the bonding. This approach may be less than satisfactory as the density of TSVs may be limited, because they may require large landing pads for the TSVs to overcome the poor wafer to wafer alignment and to allow for the large (about one to ten micron) diameter of the TSVs as a result of the thickness of the wafers bonded together. Additionally, handling and processing thinned silicon wafers may be very difficult and prone to yield loss. Current prototypes of this approach only obtain TSV densities of 10,000 s per chip, in comparison to the millions of interconnections currently obtainable within a single chip.

By utilizing Silicon On Insulator (SOI) wafers and glass handle wafers, A. W. Topol, et. al, in the IEDM Tech Digest, p 363-5 (2005), describe attaining TSVs of tenths of microns. The TSV density may be still limited as a result from misalignment issues resulting from pre-forming the random circuitry on both wafers prior to wafer bonding. In addition, SOI wafers are more costly than bulk silicon wafers.

Another approach may be to monolithically build transistors on top of a wafer of interconnected transistors. The utility of this approach may be limited by the requirement to maintain the reliability of the high performance lower layer interconnect metallization, such as, for example, aluminum and copper, and low-k intermetal dielectrics, and hence limits the allowable temperature exposure to below approximately 400° C. Some of the processing steps to create useful transistor elements may require temperatures above about 700° C., such as activating semiconductor doping or crystallization of a previously deposited amorphous material such as silicon to create a poly-crystalline silicon (polysilicon or poly) layer. It may be very difficult to achieve high performance transistors with only low temperature processing and without mono-crystalline silicon channels. However, this approach may be useful to construct memory devices where the transistor performance may not be critical.

Bakir and Meindl in the textbook "Integrated Interconnect Technologies for 3D Nanosystems", Artech House, 2009, Chapter 13, illustrate a 3D stacked Dynamic Random Access Memory (DRAM) where the silicon for the stacked transistors is produced using selective epitaxy technology or laser recrystallization. This concept may be unsatisfactory as the silicon processed in this manner may have a higher defect density when compared to single crystal silicon and hence may suffer in performance, stability, and control. It may also require higher temperatures than the underlying metallization or low-k intermetal dielectric could be exposed to without reliability concerns.

Sang-Yun Lee in U.S. Pat. No. 7,052,941 discloses methods to construct vertical transistors by preprocessing a single crystal silicon wafer with doping layers activated at high temperature, layer transferring the wafer to another wafer with preprocessed circuitry and metallization, and then forming vertical transistors from those doping layers with low temperature processing, such as etching silicon. This may be less than satisfactory as the semiconductor devices in the market today utilize horizontal or horizontally oriented transistors and it would be very difficult to convince the industry to move away from the horizontal. Additionally, the transistor performance may be less than satisfactory as a result from large parasitic capacitances and resistances in the vertical structures, and the lack of self-alignment of the transistor gate.

A key technology for 3D IC construction may be layer transfer, whereby a thin layer of a silicon wafer, called the donor wafer, may be transferred to another wafer, called the acceptor wafer, or target wafer. As described by L. DiCioccio, et. al., at ICICDT 2010 pg 110, the transfer of a thin (about tens of microns to tens of nanometers) layer of mono-crystalline silicon at low temperatures (below approximately 400° C.) may be performed with low temperature direct oxide-oxide bonding, wafer thinning, and surface conditioning. This process is called "Smart Stacking" by Soitec (Crolles, France). In addition, the "SmartCut"

process is a well understood technology used for fabrication of SOI wafers. The "SmartCut" process employs a hydrogen implant to enable cleaving of the donor wafer after the layer transfer. These processes with some variations and under different names may be commercially available from SiGen (Silicon Genesis Corporation, San Jose, Calif.). A room temperature wafer bonding process utilizing ion-beam preparation of the wafer surfaces in a vacuum has been recently demonstrated by Mitsubishi Heavy Industries Ltd., Tokyo, Japan. This process allows room temperature layer transfer.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,557,632, 8,298,875, 8,642,416, 8,362,482, 8,378,715, 8,379,458, 8,450,804, 8,574,929, 8,581,349, 8,642,416, 8,687,399, 8,742,476, 8,674,470, 8,803,206, 8,836,073, 8,902,663, 8,994,404, 9,021,414, 9,023,688, 9,030,858, 9,117,749, 9,142,553, 9,219,005, 9,385,088, 9,406,670, 9,460,978, 9,509,313; U.S. patent publications 2011/0092030, 2016/0218046; and U.S. Patent Applications, 62/077,280, 62/042,229, 61/932, 617, 14/607,077, 14/642,724, 14/880,276, 62/139,636, 62/149,651, 62/198,126, 62/239,931, 62/246,054, 62/307, 568, 62/297,857, 15/095,187, 15/150,395, 15/173,686, 62/383,463, 62/440,720, 62/443,751, 15/243,941, PCT/US16/52726, 62/406,376, 62/432,575, 62/440,720, 62/297, 857, 15/333,138, 15/344,562, and 15/351,389. The entire contents of the foregoing patents, publications, and applications are incorporated herein by reference.

Electro-Optics: There is also work done for integrated monolithic 3D including layers of different crystals, such as U.S. Pat. No. 8,283,215, U.S. Pat. Nos. 8,163,581, 8,753, 913, 8,823,122, 9,197,804, 9,419,031; and U.S. patent publication 2016/0064439. The entire contents of the foregoing patents, publications, and applications are incorporated herein by reference.

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices and fabrication methods.

In one aspect, a 3D integrated circuit device, comprising: a first transistor; a second transistor; and a third transistor, wherein said third transistor is overlaying said second transistor and said second transistor is overlaying said first transistor, wherein said first transistor controls the supply of a ground or a power signal to said third transistor, and wherein said first transistor, said second transistor and said third transistor are aligned to each other with less than 100 nm misalignment.

In another aspect, a 3D integrated circuit device, comprising: a first transistor; a second transistor, said second transistor has a second transistor gate dielectric; and a third transistor, said third transistor has a third transistor gate dielectric, wherein said third transistor is overlaying said second transistor and said second transistor is overlaying said first transistor, wherein said second transistor and said third transistor are junction-less transistors, wherein said second transistor gate dielectric and said third transistor gate dielectric are part of the same layer, and wherein said first transistor, said second transistor and said third transistor are aligned to each other with less than 100 nm misalignment.

In another aspect, a 3D integrated circuit device, comprising: a first transistor; a second transistor; and a third transistor, wherein said third transistor is overlaying said second transistor and said second transistor is overlaying said first transistor, wherein said second transistor and said third transistor each have a first gate and a second gate, wherein said second transistor first gate is connected to said third transistor first gate, wherein said first gate is not connected to said second gate, and wherein said first transistor, said second transistor and said third transistor are aligned to each other with less than 100 nm misalignment.

BRIEF DESCRIPTION OF THE DRAWINGS

Various embodiments of the invention will be understood and appreciated more fully from the following detailed description, taken in conjunction with the drawings in which:

FIGS. 2A-2H are exemplary drawing illustrations of the preprocessed wafers and layers and generalized layer transfer;

FIGS. 3A-3D are exemplary drawing illustrations of a generalized layer transfer process flow;

FIG. 4 is an exemplary drawing illustration and a transistor characteristic graph of a junction-less transistor;

FIGS. 6A-6K, 6K1, 6K2, and 6L are exemplary drawing illustrations of the formation of a floating body DRAM transistor and device;

FIGS. 7A-7J, 7J1, 7J2, and 7K are exemplary drawing illustrations of the formation of a resistive memory transistor and device;

FIGS. 8A-8J, 8J1, 8J2, and 8K are exemplary drawing illustrations of the formation of a resistive memory transistor and device.

DESCRIPTION

Figure 1:
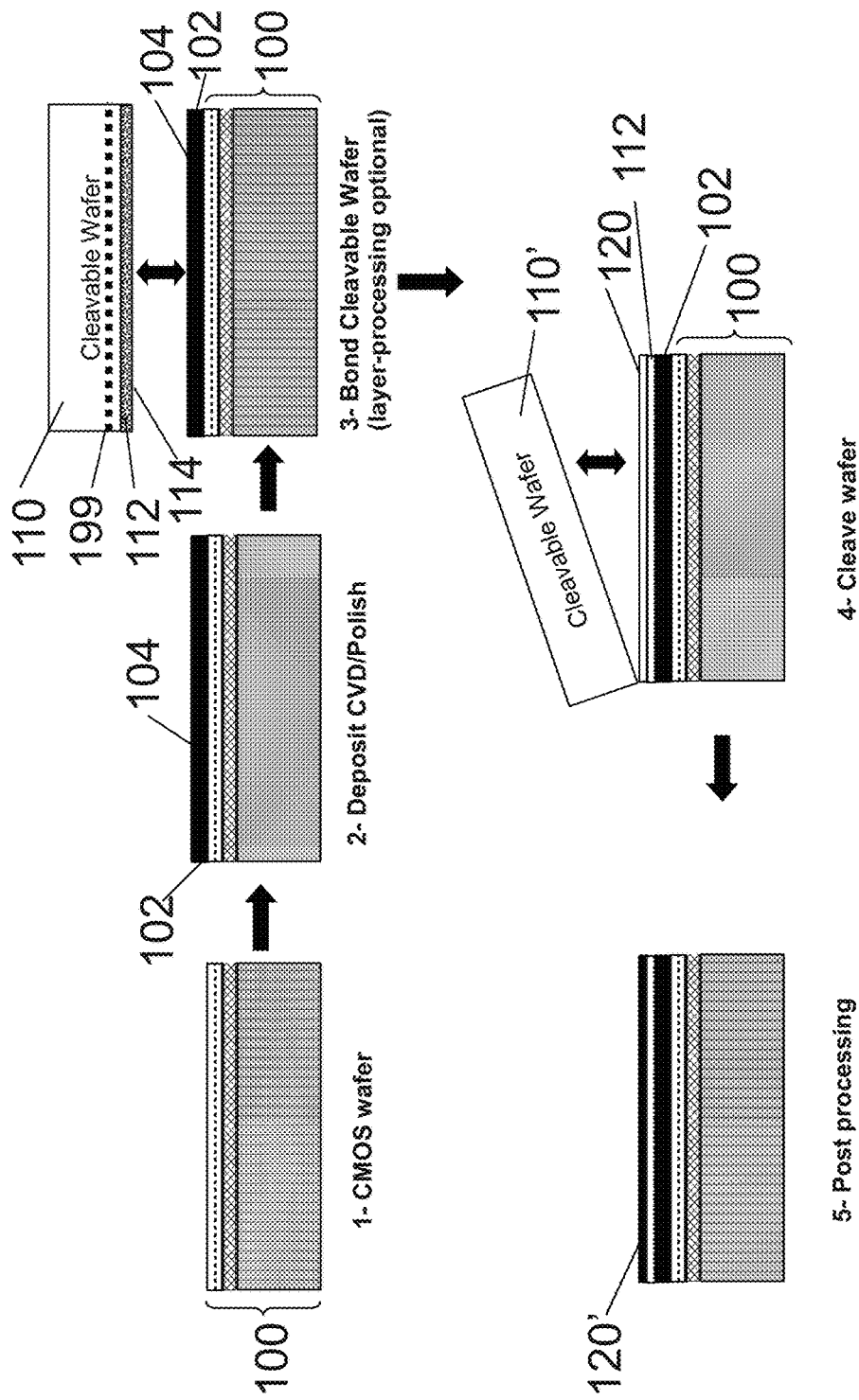
FIG. 1 is an exemplary drawing illustration of a layer transfer process flow.

Some embodiments of the invention are described herein with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Many figures may describe process flows for building devices. These process flows, which may be a sequence of steps for building a device, may have many structures, numerals and labels that may be common between two or more adjacent steps. In such cases, some labels, numerals and structures used for a certain step's figure may have been described in the previous steps' figures.

As illustrated in FIG. 1, a generalized single layer transfer procedure that utilizes the above techniques may begin with acceptor substrate 100, which may be a preprocessed CMOS silicon wafer, or a partially processed CMOS, or other prepared silicon or semiconductor substrate. CMOS may include n-type transistors and p-type transistors. Acceptor substrate 100 may include elements such as, for example, transistors, alignment marks, metal layers, and metal connection strips. The metal layers may be utilized to interconnect the transistors. The acceptor substrate may also be called target wafer. The acceptor substrate 100 may be prepared for oxide to oxide wafer bonding by a deposition of an oxide 102, and the acceptor substrate surface 104 may be made ready for low temperature bonding by various surface treatments, such as, for example, an RCA pre-clean that may include dilute ammonium hydroxide or hydrochloric acid, and may include plasma surface preparations, wherein gases such as oxygen, argon, and other gases or combinations of gases and plasma energies that changes the oxide surfaces so to lower the oxide to oxide bonding energy. In addition, polishes may be employed to achieve satisfactory flatness.

A donor wafer or substrate 110 may be prepared for cleaving by an implant or implants of atomic species, such as, for example, Hydrogen and Helium, to form a layer transfer demarcation plane 199, shown as a dashed line. Layer transfer demarcation plane 199 may be formed before or after other processing on the donor wafer or substrate 110. The donor wafer or substrate 110 may be prepared for oxide to oxide wafer bonding by a deposition of an oxide 112, and the donor wafer surface 114 may be made ready for low temperature bonding by various surface treatments, such as, for example, an RCA pre-clean that may include dilute ammonium hydroxide or hydrochloric acid, and may include plasma surface preparations, wherein gases such as oxygen, argon, and other gases or combinations of gases and plasma energies that change the oxide surfaces so to lower the oxide to oxide bonding energy. In addition, polishes may be employed to achieve satisfactory flatness. The donor wafer or substrate 110 may have prefabricated layers, structures, alignment marks, transistors or circuits.

Donor wafer or substrate 110 may be bonded to acceptor substrate 100, or target wafer, by bringing the donor wafer surface 114 in physical contact with acceptor substrate surface 104, and then applying mechanical force and/or thermal annealing to strengthen the oxide to oxide bond. Alignment of the donor wafer or substrate 110 with the acceptor substrate 100 may be performed immediately prior to the wafer bonding. Acceptable bond strengths may be obtained with bonding thermal cycles that do not exceed approximately 400° C.

The donor wafer or substrate 110 may be cleaved at or near the layer transfer demarcation plane 199 and removed leaving transferred layer 120 bonded and attached to acceptor substrate 100, or target wafer. The cleaving may be accomplished by various applications of energy to the layer transfer demarcation plane, such as, for example, a mechanical strike by a knife, or jet of liquid or jet of air, or by local laser heating, or other suitable cleaving methods that propagate a fracture or separation approximately at the layer transfer demarcation plane 199. The transferred layer 120 may be polished chemically and mechanically to provide a suitable surface for further processing. The transferred layer 120 may be of thickness approximately 200 nm or less to enable formation of nanometer sized thru layer vias and create a high density of interconnects between the donor wafer and acceptor wafer. The thinner the transferred layer 120, the smaller the thru layer via diameter obtainable, as a result of maintaining manufacturable via aspect ratios. Thus, the transferred layer 120 may be, for example, less than about 2 microns thick, less than about 1 micron thick, less than about 0.4 microns thick, less than about 200 nm thick, less than about 150 nm thick, or less than about 100 nm thick. The thickness of the layer or layers transferred according to some embodiments of the invention may be designed as such to match and enable the most suitable lithographic resolution capability of the manufacturing process employed to create the thru layer vias or any other structures on the transferred layer or layers. The donor wafer or substrate 110 may now also be processed and reused for more layer transfers.

Transferred layer 120 may then be further processed to create a monolithic layer of interconnected devices 120' and the formation of thru layer vias (TLVs, or through-layer vias) to electrically couple (connection path) donor wafer circuitry with acceptor wafer circuitry. Alignment marks in acceptor substrate 100 and/or in transferred layer 120 may be utilized to contact transistors and circuitry in transferred layer 120 and electrically couple them to transistors and circuitry in the acceptor substrate 100. The use of an implanted atomic species, such as, for example, Hydrogen or Helium or a combination, to create a cleaving plane, such as, for example, layer transfer demarcation plane 199, and the subsequent cleaving at or near the cleaving plane as described above may be referred to in this document as "ion-cut", and may be the typically illustrated layer transfer method. As the TLVs are formed through the transferred layer 120, the thickness of the TLVs may be, for example, less than about 2 microns thick, less than about 1 micron thick, less than about 0.4 microns thick, less than about 200 nm thick, less than about 150 nm thick, or less than about 100 nm thick. TLVs may be constructed mostly out of electrically conductive materials including, for example, copper, aluminum, conductive carbon, or tungsten. Barrier metals, including, for example, TiN and TaN, may be utilized to form TLVs.

Persons of ordinary skill in the art will appreciate that the illustrations in FIG. 1 are exemplary only and are not drawn to scale. Such skilled persons will further appreciate that many variations are possible such as, for example, a heavily doped (greater than 1e20 atoms/cm3) boron layer or a silicon germanium (SiGe) layer may be utilized as an etch stop layer either within the ion-cut process flow, wherein the layer transfer demarcation plane may be placed within the etch stop layer or into the substrate material below, or the etch stop layers may be utilized without an implant cleave or ion-cut process and the donor wafer may be preferentially etched away until the etch stop layer may be reached. Such skilled persons will further appreciate that the oxide layer within an SOI or GeOI donor wafer may serve as the etch stop layer. Many other modifications within the scope of the invention will suggest themselves to such skilled persons after reading this specification. Thus the invention is to be limited only by the appended claims.

Alternatively, other technologies and techniques may be utilized for layer transfer as described in, for example, IBM's layer transfer method shown at IEDM 2005 by A. W. Topol, et. al. The IBM's layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) may be selectively etched off. The now thinned donor wafer may be subsequently aligned and low-temperature oxide-to-oxide bonded to the acceptor wafer topside. A low temperature release of the glass handle wafer from the thinned donor wafer may be next performed, and then thru layer via (or layer to layer) connections may be made.

Additionally, the inventors contemplate that other technology can be used. For example, an epitaxial liftoff (ELO) technology as shown by P. Demeester, et. al, of IMEC in Semiconductor Science Technology 1993 may be utilized for layer transfer. ELO makes use of the selective removal of a very thin sacrificial layer between the substrate and the layer structure to be transferred. The to-be-transferred layer of GaAs or silicon may be adhesively 'rolled' up on a cylinder or removed from the substrate by utilizing a flexible carrier, such as, for example, black wax, to bow up the to-be-transferred layer structure when the selective etch, such as, for example, diluted Hydrofluoric (HF) Acid, etches the exposed release layer, such as, for example, the silicon oxide in SOI or a layer of AlAs. After liftoff, the transferred layer may be then aligned and bonded to the desired acceptor substrate or wafer. The manufacturability of the ELO process for multilayer layer transfer use was recently improved by J. Yoon, et. al., of the University of Illinois at Urbana-Champaign as described in Nature May 20, 2010.

Canon developed a layer transfer technology called ELTRAN—Epitaxial Layer TRANsfer from porous silicon. ELTRAN may be utilized as a layer transfer method. The Electrochemical Society Meeting abstract No. 438 from year 2000 and the JSAP International July 2001 paper show a seed wafer being anodized in an HF/ethanol solution to create pores in the top layer of silicon, the pores may be treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

Figure 2A:
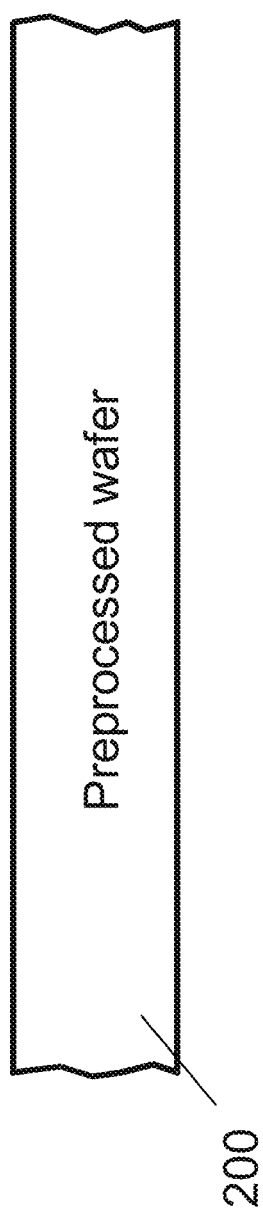

FIG. 2A is a drawing illustration of a generalized preprocessed wafer or layer 200. The wafer or layer 200 may have preprocessed circuitry, such as, for example, logic circuitry, microprocessors, circuitry including transistors of various types, and other types of digital or analog circuitry including, but not limited to, the various embodiments described herein. Preprocessed wafer or layer 200 may have preprocessed metal interconnects, such as, for example, of copper or aluminum. The preprocessed metal interconnects, such as, for example, metal strips pads, or lines, may be designed and prepared for layer transfer and electrical coupling from preprocessed wafer or layer 200 to the layer or layers to be transferred.

Figure 2B:
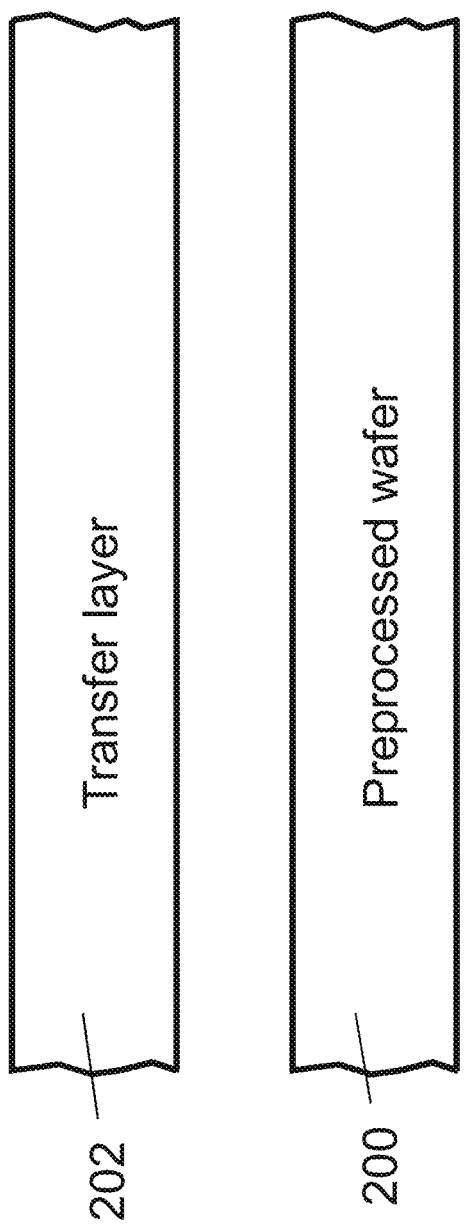

FIG. 2B is a drawing illustration of a generalized transfer layer 202 prior to being attached to preprocessed wafer or layer 200. Preprocessed wafer or layer 200 may be called a target wafer or acceptor substrate. Transfer layer 202 may be attached to a carrier wafer or substrate during layer transfer. Transfer layer 202 may have metal interconnects, such as, for example, metal strips, pads, or lines, designed and prepared for layer transfer and electrical coupling to preprocessed wafer or layer 200. Transfer layer 202, which may also be called the second semiconductor layer, may include mono-crystalline silicon, or doped mono-crystalline silicon layer or layers, or other semiconductor, metal (including such as aluminum or copper interconnect layers), and insulator materials, layers; or multiple regions of single crystal silicon, or mono-crystalline silicon, or dope mono-crystalline silicon, or other semiconductor, metal, or insulator materials. A preprocessed wafer that can withstand subsequent processing of transistors on top at high temperatures may be a called the "Foundation" or a foundation wafer, layer or circuitry. The terms 'mono-crystalline silicon' and 'single crystal silicon' may be used interchangeably.

FIG. 2C is a drawing illustration of a preprocessed wafer or layer 200A created by the layer transfer of transfer layer 202 on top of preprocessed wafer or layer 200. The top of preprocessed wafer or layer 200A may be further processed with metal interconnects, such as, for example, metal strips, pads, or lines, designed and prepared for layer transfer and electrical coupling from preprocessed wafer or layer 200A to the next layer or layers to be transferred.

FIG. 2D is a drawing illustration of a generalized transfer layer 202A prior to being attached to preprocessed wafer or layer 200A. Transfer layer 202A may be attached to a carrier wafer or substrate during layer transfer. Transfer layer 202A may have metal interconnects, such as, for example, metal strips, pads, or lines, designed and prepared for layer transfer and electrical coupling to preprocessed wafer or layer 200A. Transfer layer 202A may include mono-crystalline silicon, or doped mono-crystalline silicon layer or layers, or other semiconductor, metal, and insulator materials, layers; or multiple regions of single crystal silicon, or mono-crystalline silicon, or dope mono-crystalline silicon, or other semiconductor, metal, or insulator materials.

FIG. 2E is a drawing illustration of a preprocessed wafer or layer 200B created by the layer transfer of transfer layer 202A on top of preprocessed wafer or layer 200A. Transfer layer 202A may also be called the third semiconductor layer. The top of preprocessed wafer or layer 200B may be further processed with metal interconnects, such as, for example, metal strips, pads, or lines, designed and prepared for layer transfer and electrical coupling from preprocessed wafer or layer 200B to the next layer or layers to be transferred.

Figure 2F:
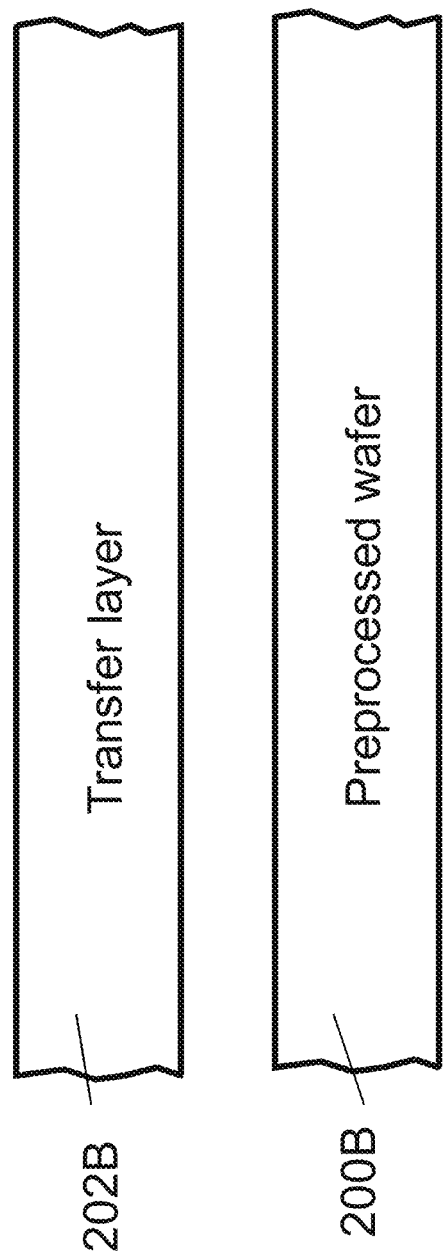

FIG. 2F is a drawing illustration of a generalized transfer layer 202B prior to being attached to preprocessed wafer or layer 200B. Transfer layer 202B may be attached to a carrier wafer or substrate during layer transfer. Transfer layer 202B may have metal interconnects, such as, for example, metal strips, pads, or lines, designed and prepared for layer transfer and electrical coupling to preprocessed wafer or layer 200B. Transfer layer 202B may include mono-crystalline silicon, or doped mono-crystalline silicon layer or layers, or other semiconductor, metal, and insulator materials, layers; or multiple regions of single crystal silicon, or mono-crystalline silicon, or dope mono-crystalline silicon, or other semiconductor, metal, or insulator materials.

FIG. 2G is a drawing illustration of preprocessed wafer or layer 200C created by the layer transfer of transfer layer 202B on top of preprocessed wafer or layer 200B. The top of preprocessed wafer or layer 200C may be further processed with metal interconnect, such as, for example, metal strips, pads, or lines, designed and prepared for layer transfer and electrical coupling from preprocessed wafer or layer 200C to the next layer or layers to be transferred.

Figure 2H:
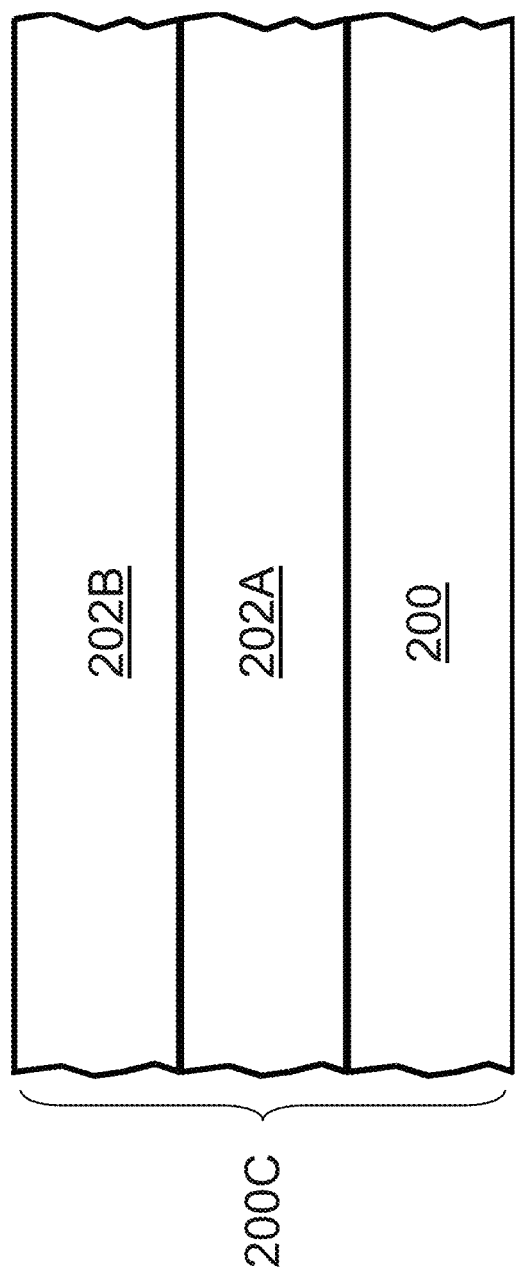

FIG. 2H is a drawing illustration of preprocessed wafer or layer 200C, a 3D IC stack, which may include transferred layers 202A and 202B on top of the original preprocessed wafer or layer 200. Transferred layers 202A and 202B and the original preprocessed wafer or layer 200 may include transistors of one or more types in one or more layers, metallization such as, for example, copper or aluminum in one or more layers, interconnections to and among layers above and below (connection paths, such as TLVs or TSVs), and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be, for example, junction-less transistors or recessed channel transistors or other types of transistors described in this document. Transferred layers 202A and 202B and the original preprocessed wafer or layer 200 may further include semiconductor devices such as, for example, resistors and capacitors and inductors, one or more programmable interconnects, memory structures and devices, sensors, radio frequency devices, or optical interconnect with associated transceivers. The terms carrier wafer or carrier substrate may also be called holder wafer or holder substrate.

This layer transfer process can be repeated many times, thereby creating preprocessed wafers that may include many different transferred layers which, when combined, can then become preprocessed wafers or layers for future transfers. This layer transfer process may be sufficiently flexible that preprocessed wafers and transfer layers, if properly prepared, can be flipped over and processed on either side with further transfers in either direction as a matter of design choice.

Persons of ordinary skill in the art will appreciate that the illustrations in FIGS. 2A through 2H are exemplary only and are not drawn to scale. Such skilled persons will further appreciate that many variations are possible such as, for example, the preprocessed wafer or layer 200 may act as a base or substrate layer in a wafer transfer flow, or as a preprocessed or partially preprocessed circuitry acceptor wafer in a wafer transfer process flow. Many other modifications within the scope of the invention will suggest themselves to such skilled persons after reading this specification. Thus the invention is to be limited only by the appended claims.

One industry method to form a low temperature gate stack may be called a high-k metal gate (HKMG) and may be referred to in later discussions. The high-k metal gate structure may be formed as follows. Following an industry standard HF/SC1/SC2 cleaning to create an atomically smooth surface, a high-k dielectric may be deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, may have a dielectric constant twice as much as that of hafnium silicate/hafnium silicon oxynitride (HfSiO/HfSiON k~15). The choice of the metal may be critical for the device to perform properly. A metal replacing $N^+$ poly as the gate electrode may need to have a work function of approximately 4.2 eV for the device to operate properly and at the right threshold voltage. Alternatively, a metal replacing $P^+$ poly as the gate electrode may need to have a work function of approximately 5.2 eV to operate properly. The TiAl and TiAlN based family of metals, for example, could be used to tune the work function of the metal from 4.2 eV to 5.2 eV.

Alternatively, a low temperature gate stack may be formed with a gate oxide formed by a microwave oxidation technique, such as, for example, the TEL SPA (Tokyo Electron Limited Slot Plane Antenna) oxygen radical plasma, that grows or deposits a low temperature Gate Dielectric to serve as the MOSFET gate oxide, or an atomic layer deposition (ALD) deposition technique may be utilized. A metal gate of proper work function, such as, for example, aluminum or tungsten, or low temperature doped amorphous silicon gate electrode, may then be deposited.

Transistors constructed in this document can be considered "planar transistors" when the current flow in the transistor channel may be substantially in the horizontal direction. The horizontal direction may be defined as the direction being parallel to the largest area of surface of the substrate or wafer that the transistor may be built or layer transferred onto. These transistors can also be referred to as horizontal transistors, horizontally oriented transistors, or lateral transistors. In some embodiments of the invention the horizontal transistor may be constructed in a two-dimensional plane where the source and the drain are in the same two dimensional horizontal plane.

An embodiment of the invention is to pre-process a donor wafer by forming wafer sized layers of various materials without a process temperature restriction, then layer transferring the pre-processed donor wafer to the acceptor wafer, and processing at either low temperature (below approximately 400° C.) or high temperature (greater than approximately 400° C.) after the layer transfer to form device structures, such as, for example, transistors and metal interconnect, on or in the donor wafer that may be physically aligned and may be electrically coupled or connected to the acceptor wafer. A wafer sized layer denotes a continuous layer of material or combination of materials that may extend across the wafer to substantially the full extent of the wafer edges and may be approximately uniform in thickness. If the wafer sized layer compromises dopants, then the dopant concentration may be substantially the same in the x and y direction across the wafer, but can vary in the z direction perpendicular to the wafer surface.

As illustrated in FIG. 3A, a generalized process flow may begin with a donor wafer 300 that may be preprocessed with wafer sized layers 302 of conducting, semi-conducting or insulating materials that may be formed by deposition, ion implantation and anneal, oxidation, epitaxial growth, combinations of above, or other semiconductor processing steps and methods. The donor wafer 300 may be preprocessed with a layer transfer demarcation plane (shown as dashed line) 399, such as, for example, a hydrogen implant cleave plane, before or after layers 302 are formed. Acceptor wafer 310 may be a preprocessed wafer that may have fully functional circuitry including metal layers (including aluminum or copper metal interconnect layers that may connect acceptor wafer 310 transistors) or may be a wafer with previously transferred layers, or may be a blank carrier or holder wafer, or other kinds of substrates suitable for layer transfer processing. Acceptor wafer 310 may have alignment marks 390 and metal connect pads or strips 380. Acceptor wafer 310 and the donor wafer 300 may be a bulk monocrystalline silicon wafer or a Silicon On Insulator (SOI) wafer or a Germanium on Insulator (GeOI) wafer.

Both bonding surfaces 301 and 311 may be prepared for wafer bonding by depositions, polishes, plasma, or wet chemistry treatments to facilitate successful wafer to wafer bonding.

As illustrated in FIG. 3B, the donor wafer 300 with layers 302 and layer transfer demarcation plane 399 may then be flipped over, aligned, and bonded to the acceptor wafer 310. The donor wafer 300 with layers 302 may have alignment marks (not shown).

Figure 3C:
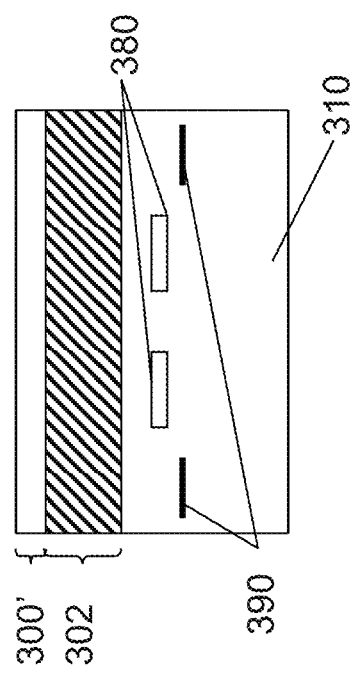

As illustrated in FIG. 3C, the donor wafer 300 may be cleaved at or thinned to the layer transfer demarcation plane 399, leaving a portion of the donor wafer 300' and the pre-processed layers 302 bonded to the acceptor wafer 310, by methods such as, for example, ion-cut or other layer transfer methods.

As illustrated in FIG. 3D, the remaining donor wafer portion 300' may be removed by polishing or etching and the transferred layers 302 may be further processed to create donor wafer device structures 350 that may be precisely aligned to the acceptor wafer alignment marks 390. Donor wafer device structures 350 may include, for example, CMOS transistors such as N type and P type transistors, or any of the other transistor or device types discussed herein this document. These donor wafer device structures 350 may utilize thru layer vias (TLVs) 360 to electrically couple (connection paths) the donor wafer device structures 350 to the acceptor wafer metal connect pads or strips 380. TLVs 360 may be formed through the transferred layers 302. As the transferred layers 302 may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers 302, the smaller the thru layer via diameter obtainable, which may result from maintaining manufacturable via aspect ratios. Thus, the transferred layers 302 (and hence, TLVs 360) may be, for example, less than about 2 microns thick, less than about 1 micron thick, less than about 0.4 microns thick, less than about 200 nm thick, less than about 150 nm thick, or less than about 100 nm thick. The thickness of the layer or layers transferred according to some embodiments of the invention may be designed as such to match and enable the most suitable obtainable lithographic resolution, such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers. Transferred layers 302 may be considered to be overlying the metal layer or layers of acceptor wafer 310. Alignment marks in acceptor substrate 310 and/or in transferred layers 302 may be utilized to enable reliable contact to transistors and circuitry in transferred layers 302 and donor wafer device structures 350 and electrically couple them to the transistors and circuitry in the acceptor substrate 310. The donor wafer 300 may now also be processed and reused for more layer transfers.

There may be multiple methods by which a transistor or other devices may be formed to enable a 3D IC.

Junction-less Transistors (JLTs) are another transistor family that may utilize layer transfer and etch definition to construct a low-temperature monolithic 3D IC. The junction-less transistor structure avoids the increasingly sharply graded junctions necessary for sufficient separation between source and drain regions as silicon technology scales. This allows the JLT to have a thicker gate oxide than a conventional MOSFET for an equivalent performance. The junction-less transistor may also be known as a nanowire transistor without junctions, or gated resistor, or nanowire transistor as described in a paper by Jean-Pierre Colinge, et. al., (Colinge) published in Nature Nanotechnology on Feb. 21, 2010.

As illustrated in FIG. 4 the junction-less transistor may be constructed whereby the transistor channel may be a thin solid piece of evenly and heavily doped single crystal silicon. Single crystal silicon may also be referred to as mono-crystalline silicon. The doping concentration of the channel underneath the gate 406 and gate dielectric 408 may be identical to that of the source 404 and drain 402. As a result of the high channel doping, the channel must be thin and narrow enough to allow for full depletion of the carriers when the device may be turned off. Additionally, the channel doping must be high enough to allow a reasonable current to flow when the device may be on. A multi-sided gate may provide increased control of the channel. The JLT may have a very small channel area (typically less than about 20 nm on one or more sides), so the gate can deplete the channel of charge carriers at approximately 0V and turn the source to drain current substantially off. I-V curves from Colinge of n channel and p channel junction-less transistors are shown in FIG. 4. This illustrates that the JLT can obtain comparable performance to the tri-gate transistor (junction-ed) that may be commonly researched and reported by transistor developers.

Turning the channel off with minimal leakage at an approximately zero gate bias may be a major challenge for a junction-less transistor device. To enhance gate control over the transistor channel, the channel may be doped unevenly; whereby the heaviest doping may be closest to the gate or gates and the channel doping may be lighter farther away from the gate electrode. For example, the cross-sectional center of a 2, 3, or 4 gate sided junction-less transistor channel may be more lightly doped than the edges. This may enable much lower transistor off currents for the same gate work function and control.

Figures 5A, 5B:
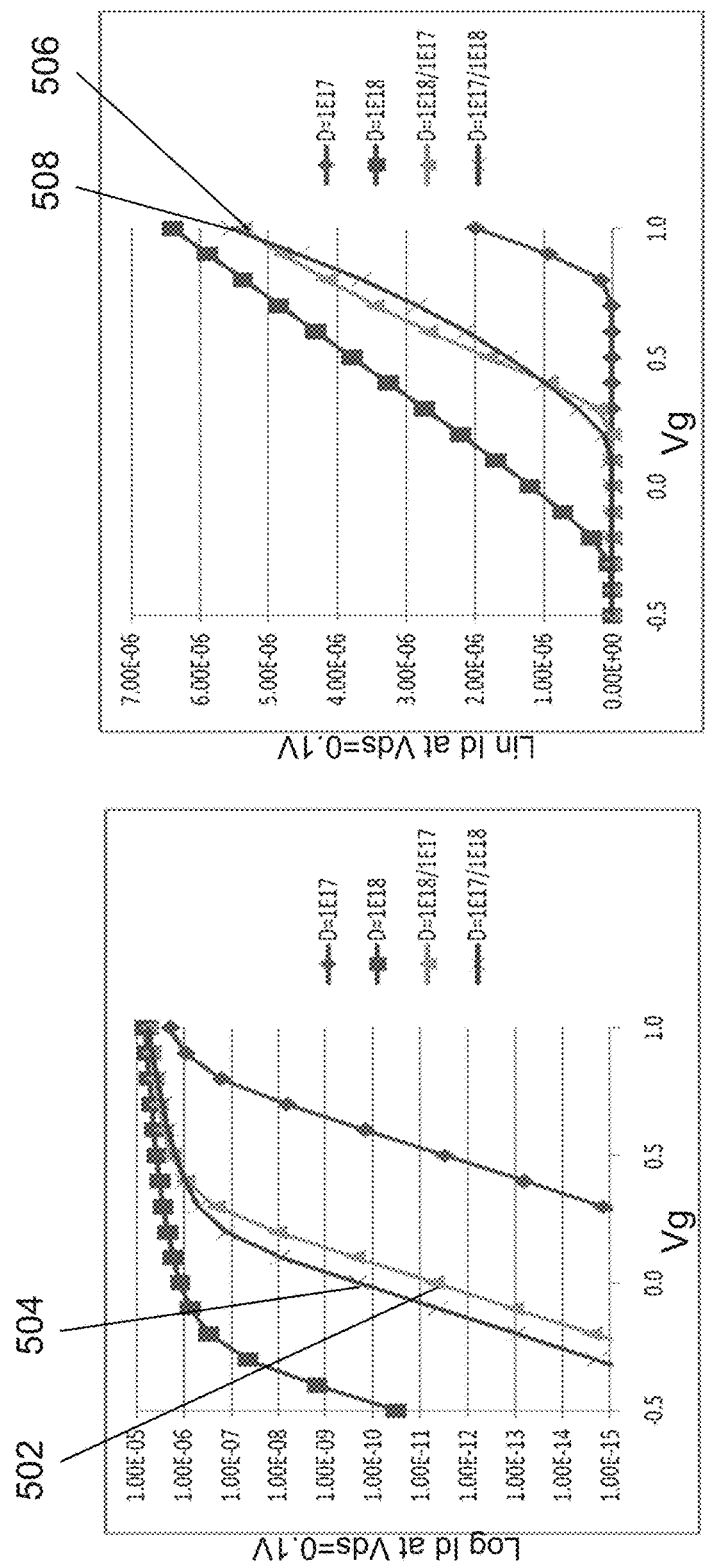
FIGS. 5A-5B are exemplary device simulations of a junction-less transistor.

As illustrated in FIGS. 5A and 5B, drain to source current (Ids) as a function of the gate voltage (Vg) for various junction-less transistor channel doping levels may be simulated where the total thickness of the n-type channel may be about 20 nm. The y-axis of FIG. 5A is plotted as logarithmic and FIG. 5B as linear. Two of the four curves in each figure correspond to evenly doping the 20 nm channel thickness to 1E17 and 1E18 atoms/cm3, respectively. The remaining two curves show simulation results where the 20 nm channel has two layers of 10 nm thickness each. In the legend denotations for the remaining two curves, the first number corresponds to the 10 nm portion of the channel that is the closest to the gate electrode. For example, the curve D=1E18/1E17 illustrates the simulated results where the 10 nm channel portion doped at 1E18 is closest to the gate electrode while the 10 nm channel portion doped at 1E17 is farthest away from the gate electrode. In FIG. 5A, curves 502 and 504 correspond to doping patterns of D=1E18/1E17 and D=1E17/1E18, respectively. According to FIG. 5A, at a Vg of 0 volts, the off current for the doping pattern of D=1E18/1E17 is approximately 50 times lower than that of the reversed doping pattern of D=1E17/1E18. Likewise, in FIG. 5B, curves 506 and 508 correspond to doping patterns of D=1E18/1E17 and D=1E17/1E18, respectively. FIG. 5B illustrates that at a Vg of 1 volt, the Ids of both doping patterns are within a few percent of each other.

The junction-less transistor channel may be constructed with even, graded, or discrete layers of doping. The channel may be constructed with materials other than doped mono-crystalline silicon, such as, for example, poly-crystalline silicon, or other semi-conducting, insulating, or conducting material, such as, for example, graphene or other graphitic material, and may be in combination with other layers of similar or different material. For example, the center of the channel may include a layer of oxide, or of lightly doped silicon, and the edges more heavily doped single crystal silicon. This may enhance the gate control effectiveness for the off state of the resistor, and may increase the on-current as a result of strain effects on the other layer or layers in the channel. Strain techniques may be employed from covering and insulator material above, below, and surrounding the transistor channel and gate. Lattice modifiers may be employed to strain the silicon, such as, for example, an embedded SiGe implantation and anneal. The cross section of the transistor channel may be rectangular, circular, or oval shaped, to enhance the gate control of the channel. Alternatively, to optimize the mobility of the P-channel junctionless transistor in the 3D layer transfer method, the donor wafer may be rotated with respect to the acceptor wafer prior to bonding to facilitate the creation of the P-channel in the <110> silicon plane direction or may include other silicon crystal orientations such as <511>.

3D memory device structures may also be constructed in layers of mono-crystalline silicon and utilize pre-processing a donor wafer by forming wafer sized layers of various materials without a process temperature restriction, then layer transferring the pre-processed donor wafer to the acceptor wafer, followed by some processing steps, and repeating this procedure multiple times, and then processing with either low temperature (below approximately 400° C.) or high temperature (greater than approximately 400° C.) after the final layer transfer to form memory device structures, such as, for example, transistors, capacitors, resistors, or memristors, on or in the multiple transferred layers that may be physically aligned and may be electrically coupled to the acceptor wafer.

Novel monolithic 3D Dynamic Random Access Memories (DRAMs) may be constructed in the above manner. Some embodiments of the invention utilize the floating body DRAM type.

Further details of a floating body DRAM and its operation modes can be found in U.S. Pat. Nos. 7,541,616, 7,514,748, 7,499,358, 7,499,352, 7,492,632, 7,486,563, 7,477,540, and 7,476,939. Background information on floating body DRAM and its operation is given in "Floating Body RAM Technology and its Scalability to 32 nm Node and Beyond," *Electron Devices Meeting*, 2006. *IEDM '06. International, vol., no., pp.* 1-4, 11-13 Dec. 2006 by T. Shino, et. al.; "Overview and future challenges of floating body RAM (FBRAM) technology for 32 nm technology node and beyond", *Solid-State Electronics*, Volume 53, Issue 7; "Papers Selected from the 38th European Solid-State Device Research Conference"-*ESSDERC* '08, July 2009, pages 676-683, ISSN 0038-1101, DOI: 10.1016/j.sse.2009.03.010 by Takeshi Hamamoto, et al.; "New Generation of Z-RAM," *Electron Devices Meeting*, 2007. *IEDM* 2007. *IEEE International, vol., no., pp.* 925-928, 10-12 Dec. 2007 by Okhonin, S., et al. Prior art for constructing monolithic 3D DRAMs used planar transistors where crystalline silicon layers were formed with either selective epitaxy technology or laser recrystallization. Both selective epitaxy technology and laser recrystallization may not provide perfectly monocrystalline silicon and often may require a high thermal budget. A description of these processes is given in the book entitled "Integrated Interconnect Technologies for 3D Nanoelectronic Systems" by Bakir and Meindl. The contents of these documents are incorporated in this specification by reference.

As illustrated in FIGS. 6A to 6L, a horizontally-oriented monolithic 3D DRAM that utilizes zero additional masking steps per memory layer by sharing mask steps after substantially all the layers have been transferred may be constructed that may be suitable for 3D IC manufacturing.

Figure 6A:
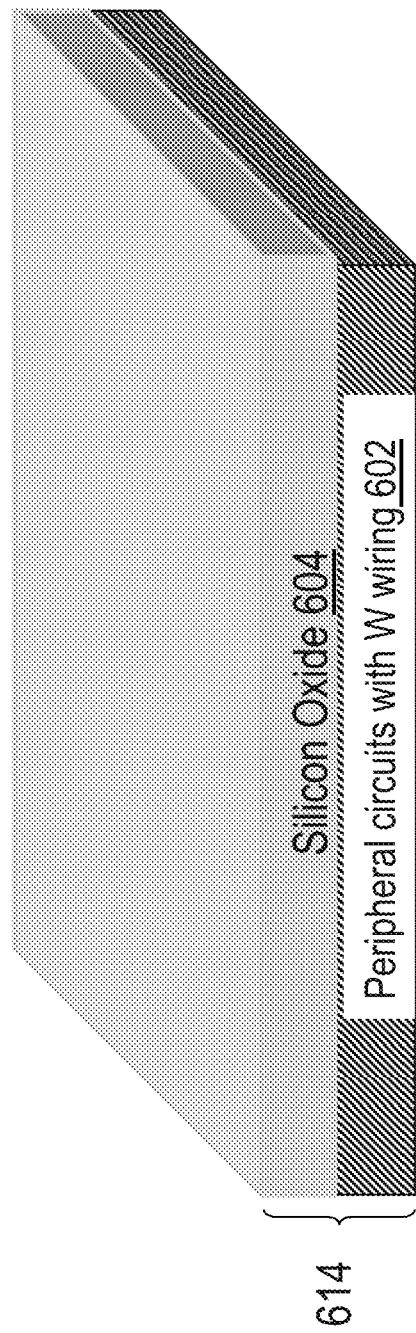

As illustrated in FIG. 6A, a silicon substrate with peripheral circuitry 602 may be constructed with high temperature (greater than approximately 400° C.) resistant wiring, such as, for example, Tungsten. The peripheral circuitry substrate 602 may include memory control circuits as well as circuitry for other purposes and of various types, such as, for example, analog, digital, RF, or memory. The peripheral circuitry substrate 602 may include peripheral circuits that can withstand an additional rapid-thermal-anneal (RTA) and still remain operational and retain good performance. For this purpose, the peripheral circuits may be formed such that they have not been subjected to a weak RTA or no RTA for activating dopants in anticipation of anneals later in the process flow. The top surface of the peripheral circuitry substrate 602 may be prepared for oxide wafer bonding with a deposition of a silicon oxide layer 604, thus forming acceptor wafer 614.

Figure 6B:
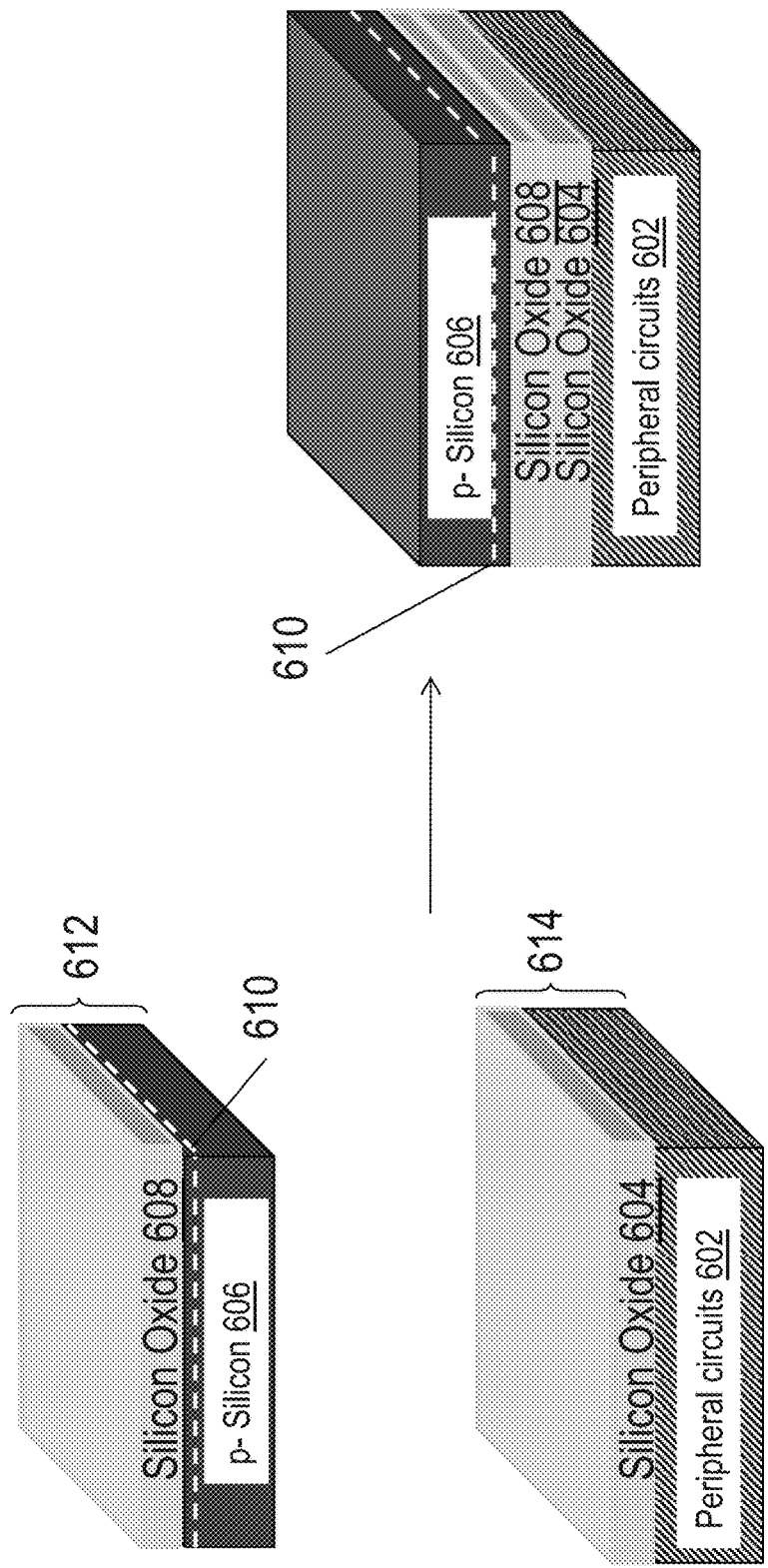

As illustrated in FIG. 6B, a mono-crystalline silicon donor wafer 612 may be processed to include a wafer sized layer of P-doping (not shown) which may have a different dopant concentration than the P-substrate 606. The P-doping layer may be formed by ion implantation and thermal anneal. A screen oxide layer 608 may be grown or deposited prior to the implant to protect the silicon from implant contamination and to provide an oxide surface for later wafer to wafer bonding. A layer transfer demarcation plane 610 (shown as a dashed line) may be formed in donor wafer 612 within the P-substrate 606 or the P-doping layer (not shown) by hydrogen implantation or other methods as previously described. Both the donor wafer 612 and acceptor wafer 614 may be prepared for wafer bonding as previously described and then bonded at the surfaces of oxide layer 604 and oxide layer 608, for example, at a low temperature (less than approximately 400° C.) for lowest stresses, or a moderate temperature (less than approximately 900° C.).

As illustrated in FIG. 6C, the portion of the P-layer (not shown) and the P-substrate 606 that may be above the layer transfer demarcation plane 610 may be removed by cleaving and polishing, or other processes as previously described, such as, for example, ion-cut or other methods, thus forming the remaining mono-crystalline silicon P-layer 606'. Remaining P-layer 606' and oxide layer 608 have been layer transferred to acceptor wafer 614. The top surface of P-layer 606' may be chemically or mechanically polished smooth and flat. Now transistors or portions of transistors may be formed and aligned to the acceptor wafer 614 alignment marks (not shown). Oxide layer 620 may be deposited to prepare the surface for later oxide to oxide bonding. This now forms the first Si/SiO2 layer 623 which includes silicon oxide layer 620, P-layer 606', and oxide layer 608.

Figure 6D:
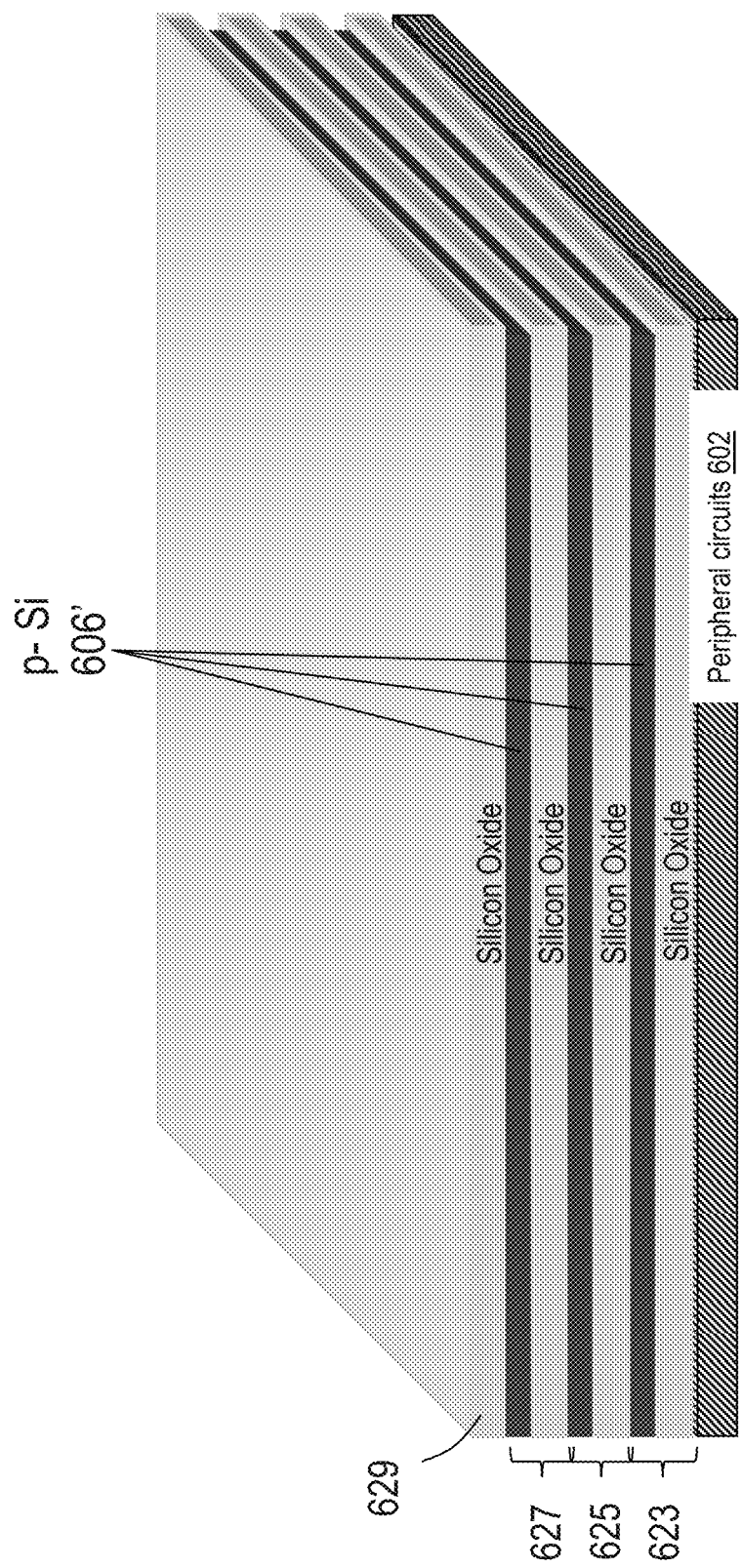

As illustrated in FIG. 6D, additional Si/SiO2 layers, such as, for example, second Si/SiO2 layer 625 and third Si/SiO2 layer 627, may each be formed as described in FIGS. 6A to 6C. Oxide layer 629 may be deposited to electrically isolate the top silicon layer.

Figure 6E:
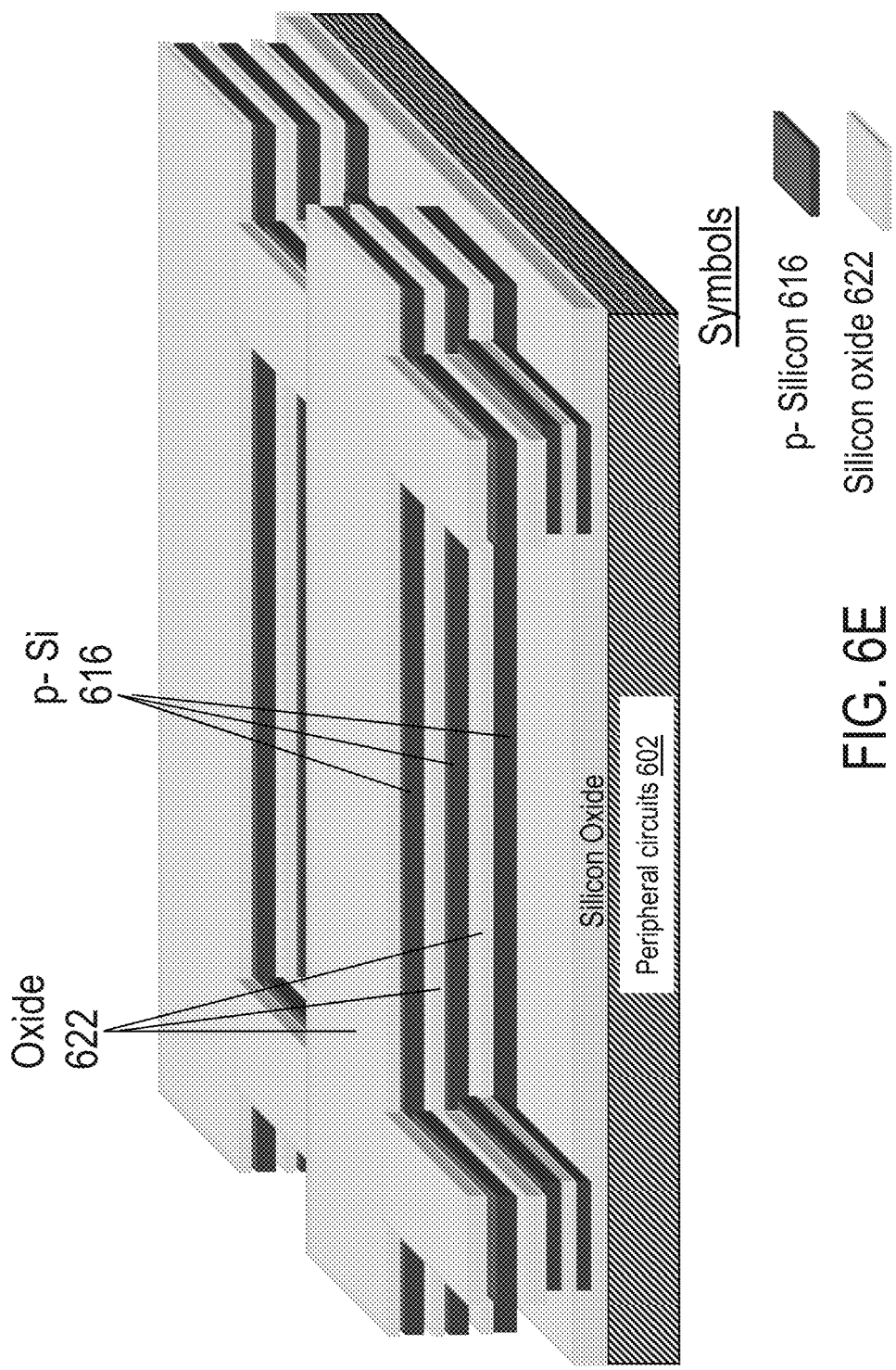

As illustrated in FIG. 6E, oxide layer 629, third Si/SiO2 layer 627, second Si/SiO2 layer 625 and first Si/SiO2 layer 623 may be lithographically defined and plasma/RIE etched to form a portion of the memory cell structure, which may include regions of P-silicon 616 and oxide 622.

Figure 6F:
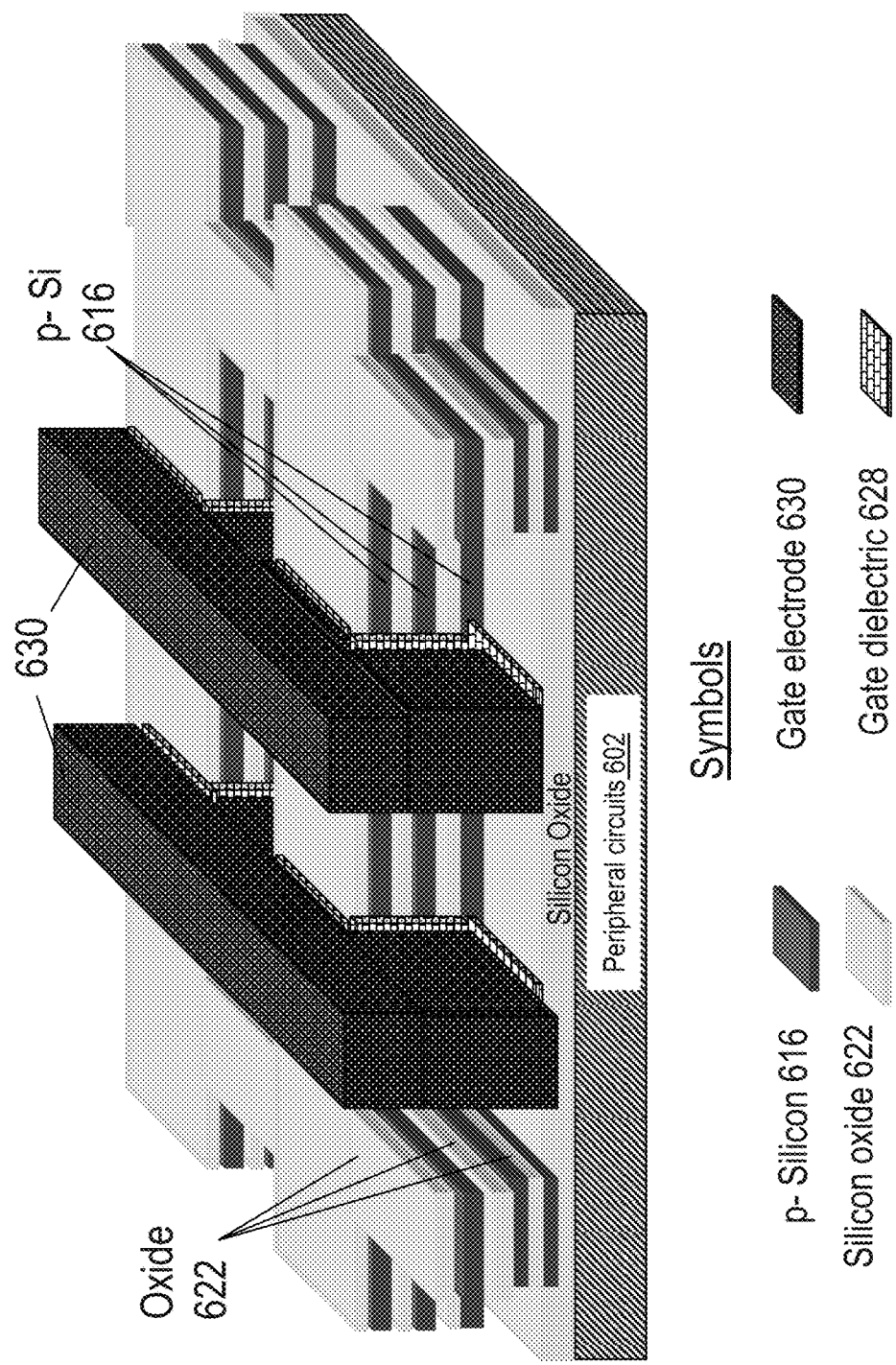

As illustrated in FIG. 6F, a gate dielectric and gate electrode material may be deposited, planarized with a chemical mechanical polish (CMP), and then lithographically defined and plasma/RIE etched to form gate dielectric regions 628 which may either be self-aligned to and substantially covered by gate electrodes 630 (shown), or substantially cover the entire silicon/oxide multi-layer structure. The gate stack including gate electrode 630 and gate dielectric regions 628 may be formed with a gate dielectric, such as, for example, thermal oxide, and a gate electrode material, such as, for example, poly-crystalline silicon. Alternatively, the gate dielectric may be an atomic layer deposited (ALD) material that may be paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 6G:
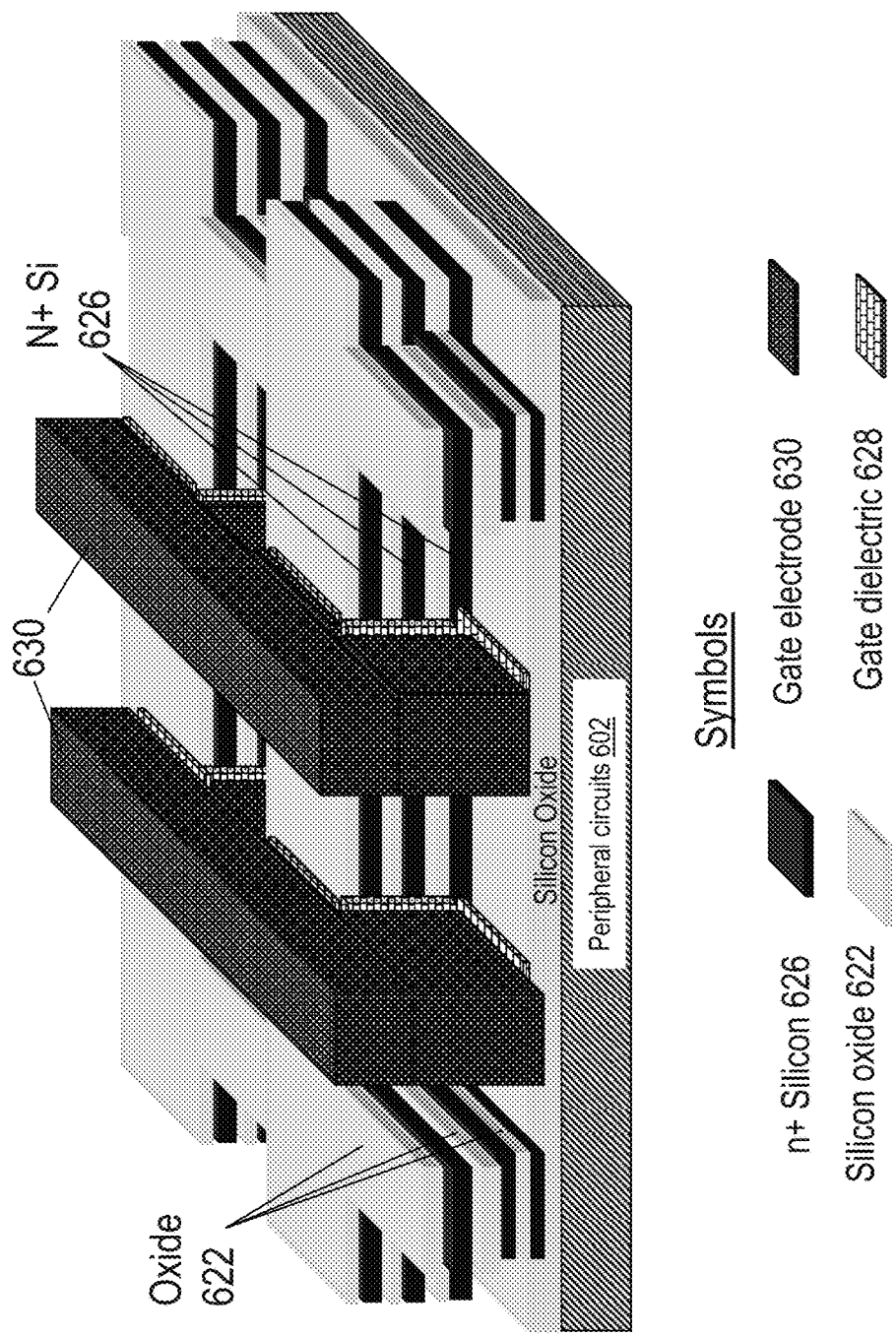

As illustrated in FIG. 6G, N+ silicon regions 626 may be formed in a self-aligned manner to the gate electrodes 630 by ion implantation of an N type species, such as, for example, Arsenic, into the portions of P-silicon regions 616 that may not be blocked by the gate electrodes 630. This forms remaining regions of P-silicon 617 (not shown) in the gate electrode 630 blocked areas. Different implant energies or angles, or multiples of each, may be utilized to place the N type species into each layer of P-silicon regions 616. Spacers (not shown) may be utilized during this multi-step implantation process and layers of silicon present in different layers of the stack may have different spacer widths to account for the differing lateral straggle of N type species implants. Bottom layers, such as, for example, first Si/SiO2 layer 623, could have larger spacer widths than top layers, such as, for example, third Si/SiO2 layer 627. Alternatively, angular ion implantation with substrate rotation may be utilized to compensate for the differing implant straggle. The top layer implantation may have a steeper angle than perpendicular to the wafer surface and hence land ions slightly underneath the gate electrode 630 edges and closely match a more perpendicular lower layer implantation which may land ions slightly underneath the gate electrode 630 edge as a result of the straggle effects of the greater implant energy necessary to reach the lower layer. A rapid thermal anneal (RTA) may be conducted to activate the dopants in substantially all of the memory layers 623, 625, 627 and in the peripheral circuitry substrate 602. Alternatively, optical anneals, such as, for example, a laser based anneal, may be performed.

Figure 6H:
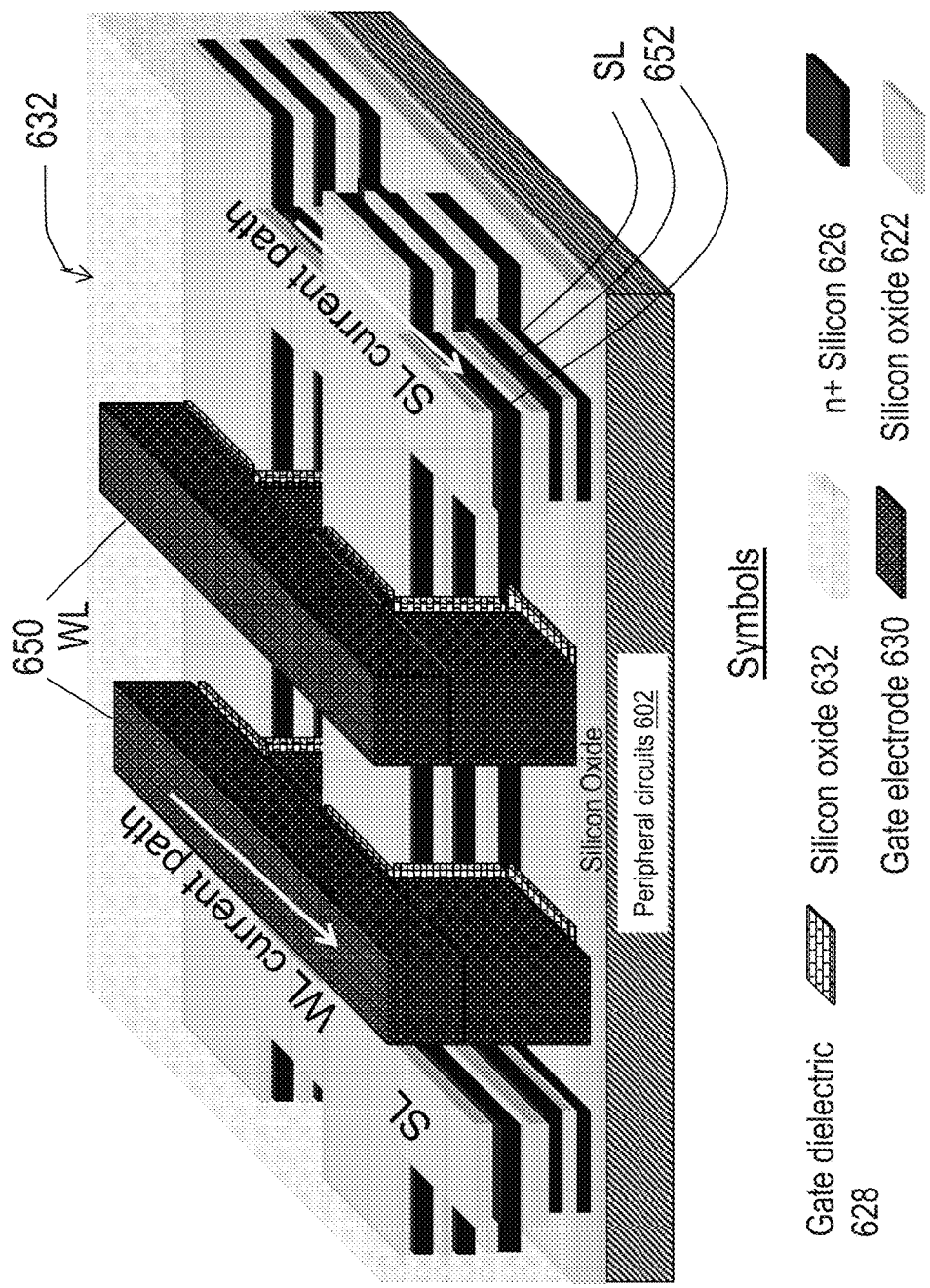
Figure 61:
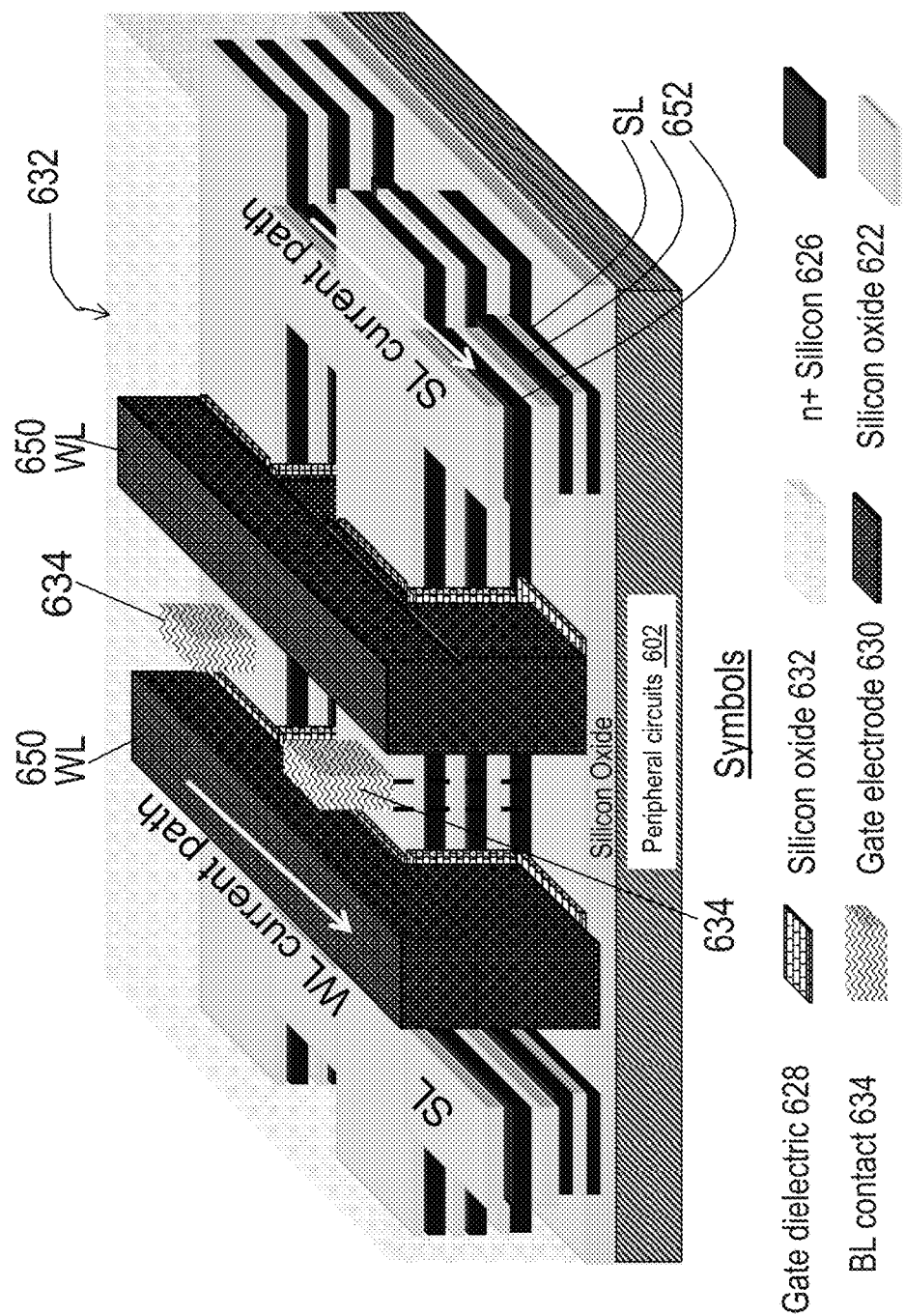

As illustrated in FIG. 6H, the entire structure may be substantially covered with a gap fill oxide 632, which may be planarized with chemical mechanical polishing. The oxide 632 is shown transparent in the figure for clarity. Word-line regions (WL) 650, coupled with and composed of gate electrodes 630, and source-line regions (SL) 652, composed of indicated N+ silicon regions 626, are shown.

As illustrated in FIG. 6I, bit-line (BL) contacts 634 may be lithographically defined, etched with plasma/RIE, photoresist removed, and then metal, such as, for example, copper, aluminum, or tungsten, may be deposited to fill the contact and etched or polished to the top of oxide 632. Each BL contact 634 may be shared among substantially all layers of memory, shown as three layers of memory in FIG. 6I. A thru layer via (not shown) may be formed to electrically couple the BL, SL, and WL metallization to the acceptor wafer 614 peripheral circuitry via an acceptor wafer metal connect pad (not shown).

Figure 6J:
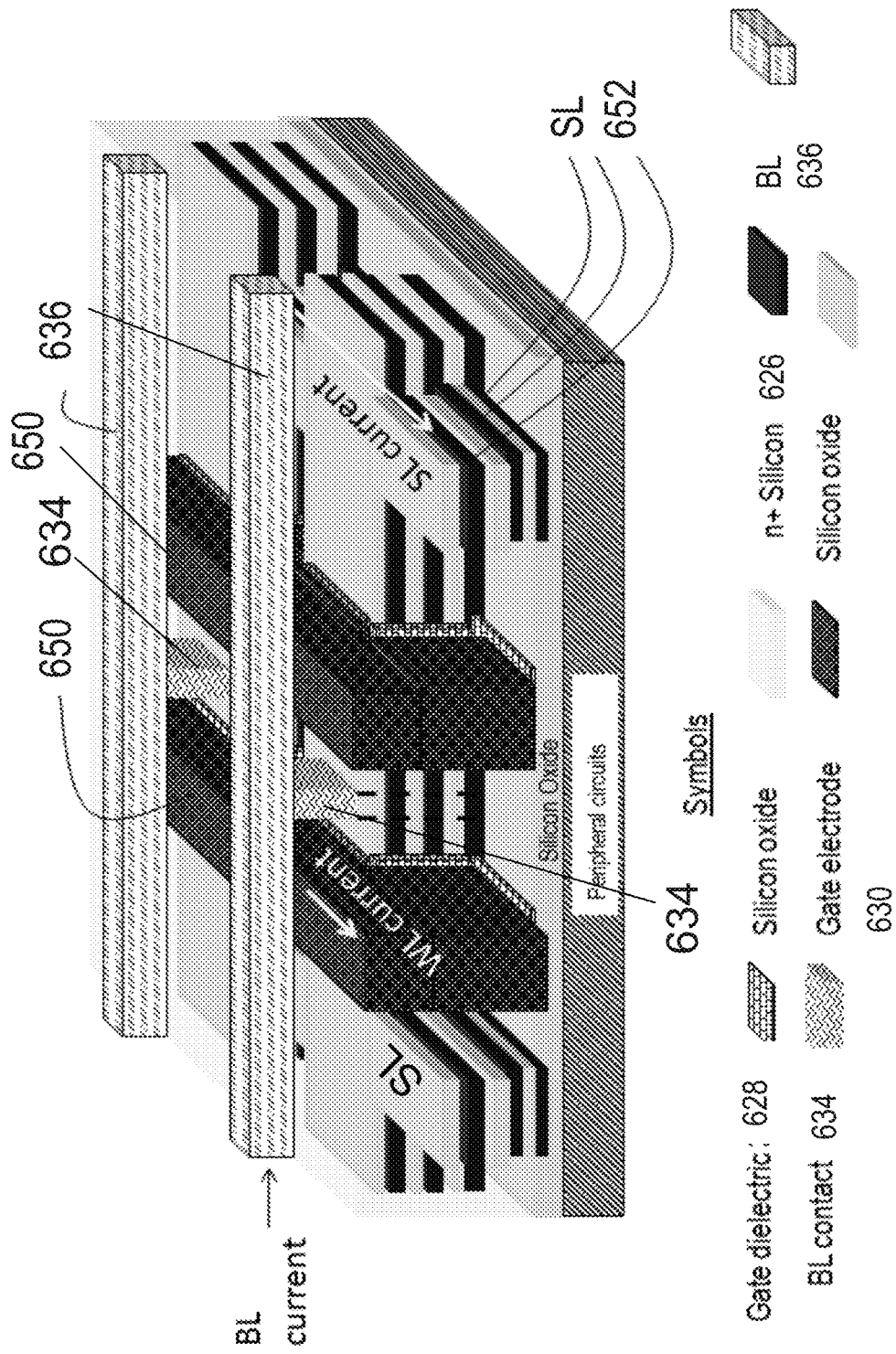

As illustrated in FIG. 6J, BL metal lines 636 may be formed and connect to the associated BL contacts 634. Contacts and associated metal interconnect lines (not shown) may be formed for the WL and SL at the memory array edges.

Figure 6K:
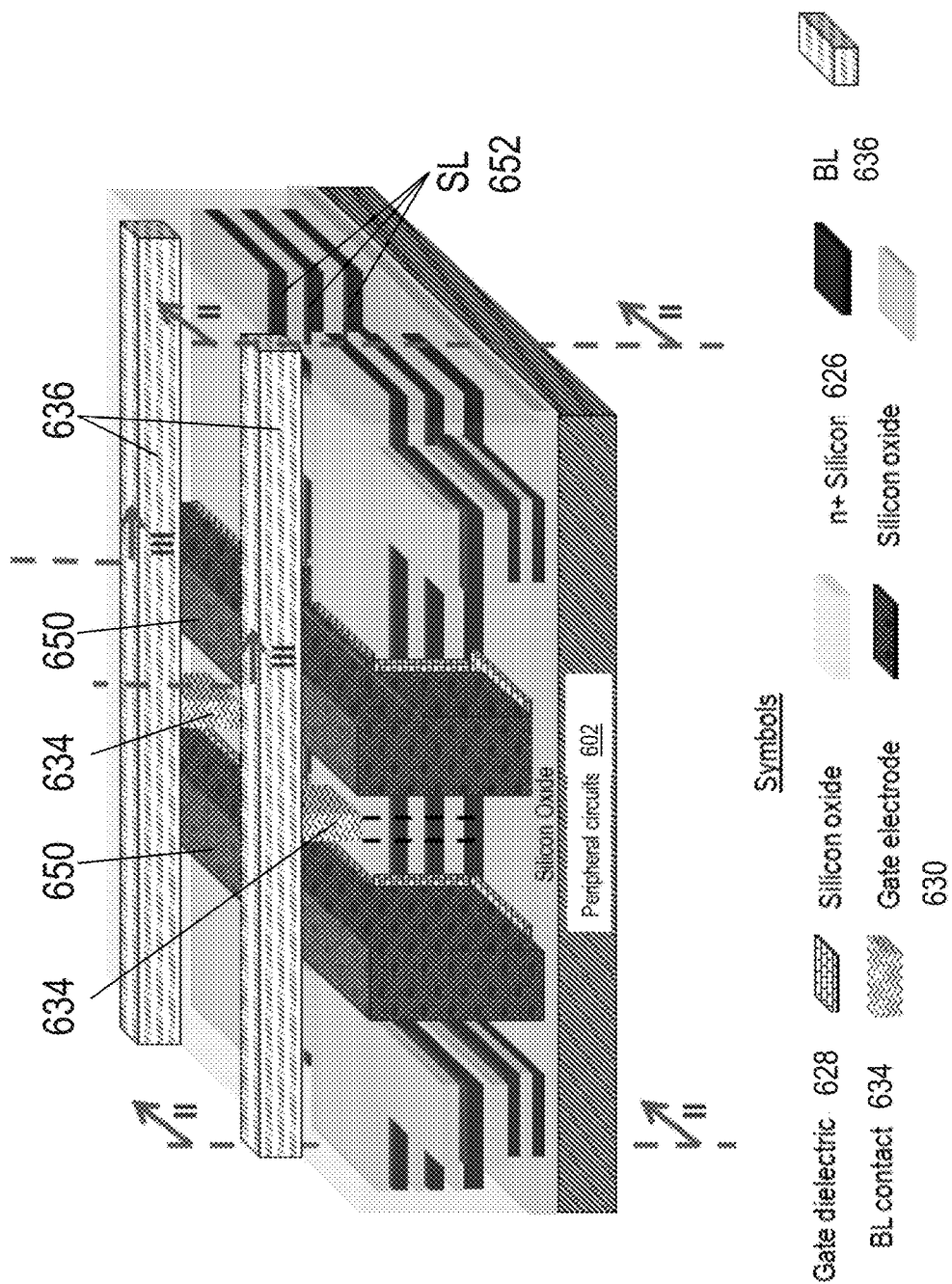

As illustrated in FIGS. 6K, 6K1 and 6K2, cross section cut II of FIG. 6K is shown in FIG. 6K1, and cross section cut III of FIG. 6K is shown in FIG. 6K2. BL metal lines 636, oxide 632, BL contact 634, WL regions 650, gate dielectric regions 628, N+ silicon regions 626, P-silicon regions 617, and peripheral circuitry substrate 602 are shown in FIG. 6K1. The BL contact 634 couples to one side of the three levels of floating body transistors that may include two N+ silicon regions 626 in each level with their associated P-silicon region 617. BL metal lines 636, oxide 632, gate electrode 630, gate dielectric regions 628, P-silicon regions 617, interlayer oxide region ('ox'), and peripheral circuitry substrate 602 are shown in FIG. 6K2. The gate electrode 630 may be common to substantially all six P-silicon regions 617 and forms six two-sided gated floating body transistors.

Figure 6L:
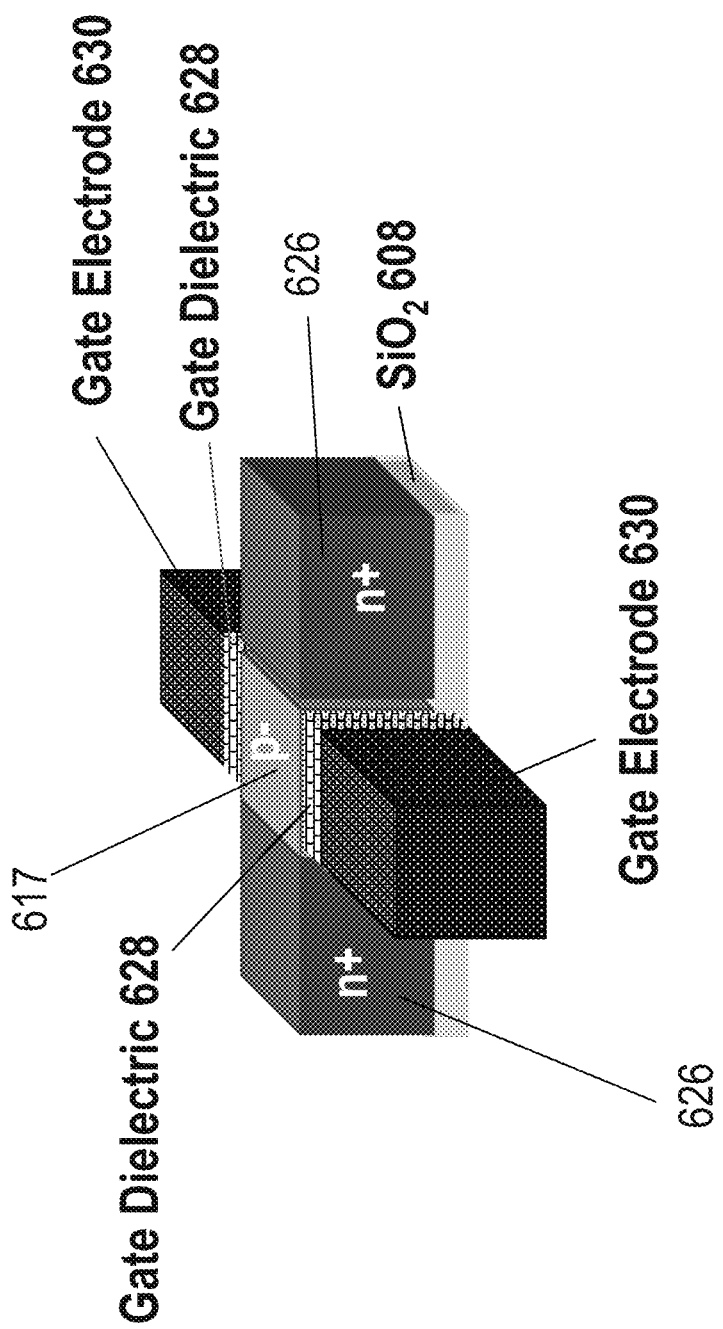

As illustrated in FIG. 6L, a single exemplary floating body two gate transistor on the first Si/SiO2 layer 623 may include P-silicon region 617 (functioning as the floating body transistor channel), N+ silicon regions 626 (functioning as source and drain), and two gate electrodes 630 with associated gate dielectric regions 628. The transistor may be electrically isolated from beneath by oxide layer 608.

This flow enables the formation of a horizontally-oriented monolithic 3D DRAM that utilizes zero additional masking steps per memory layer and may be constructed by layer transfers of wafer sized doped mono-crystalline silicon layers and may be connected to an underlying multi-metal layer semiconductor device.

Persons of ordinary skill in the art will appreciate that the illustrations in FIGS. 6A through 6L are exemplary only and are not drawn to scale. Such skilled persons will further appreciate that many variations are possible such as, for example, the transistors may be of another type such as RCATs, or junction-less. Additionally, the contacts may utilize doped poly-crystalline silicon, or other conductive materials. Moreover, the stacked memory layer may be connected to a periphery circuit that may be above the memory stack. Further, each gate of the double gate 3D DRAM can be independently controlled for increased control of the memory cell. Many other modifications within the scope of the invention will suggest themselves to such skilled persons after reading this specification. Thus the invention is to be limited only by the appended claims.

Novel monolithic 3D memory technologies utilizing material resistance changes may be constructed in a similar manner. There are many types of resistance-based memories including phase change memory, Metal Oxide memory, resistive RAM (RRAM), memristors, solid-electrolyte memory, ferroelectric RAM, and MRAM. Background information on these resistive-memory types is given in "Overview of candidate device technologies for storage-class memory," *IBM Journal of Research and Development*, vol. 52, no. 4.5, pp. 449-464, July 2008 by Burr, G. W., et al. The contents of this document are incorporated in this specification by reference.

As illustrated in FIGS. 7A to 7K, a resistance-based zero additional masking steps per memory layer 3D memory may be constructed that may be suitable for 3D IC manufacturing. This 3D memory utilizes junction-less transistors and may have a resistance-based memory element in series with a select or access transistor.

Figure 7A:
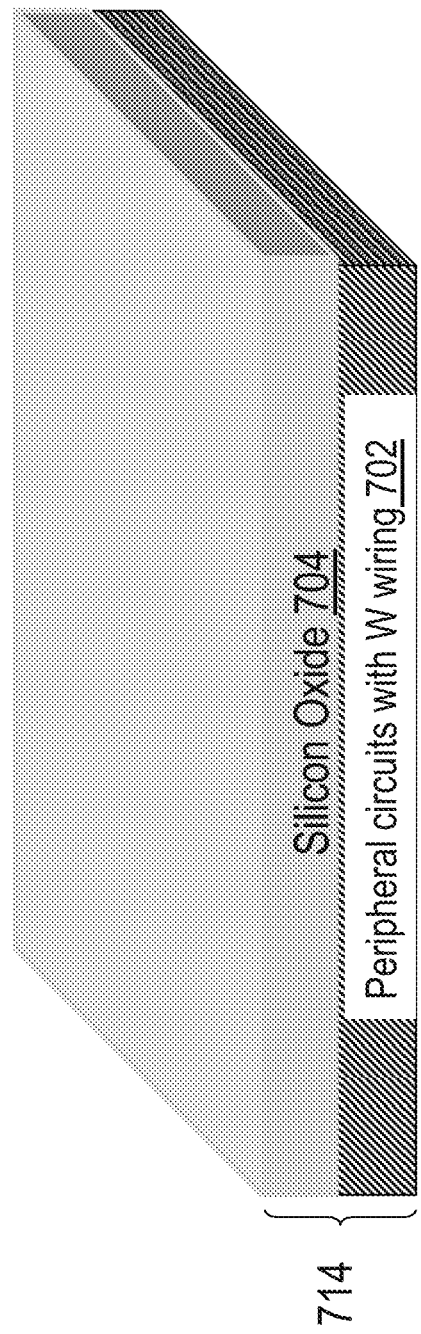

As illustrated in FIG. 7A, a silicon substrate with peripheral circuitry 702 may be constructed with high temperature (greater than approximately 400° C.) resistant wiring, such as, for example, Tungsten. The peripheral circuitry substrate 702 may include memory control circuits as well as circuitry for other purposes and of various types, such as, for example, analog, digital, RF, or memory. The peripheral circuitry substrate 702 may include peripheral circuits that can withstand an additional rapid-thermal-anneal (RTA) and still remain operational and retain good performance. For this purpose, the peripheral circuits may be formed such that they have not been subjected to a weak RTA or no RTA for activating dopants in anticipation of anneals later in the process flow. The top surface of the peripheral circuitry substrate 702 may be prepared for oxide wafer bonding with a deposition of a silicon oxide layer 704, thus forming acceptor wafer 714.

Figure 7B:
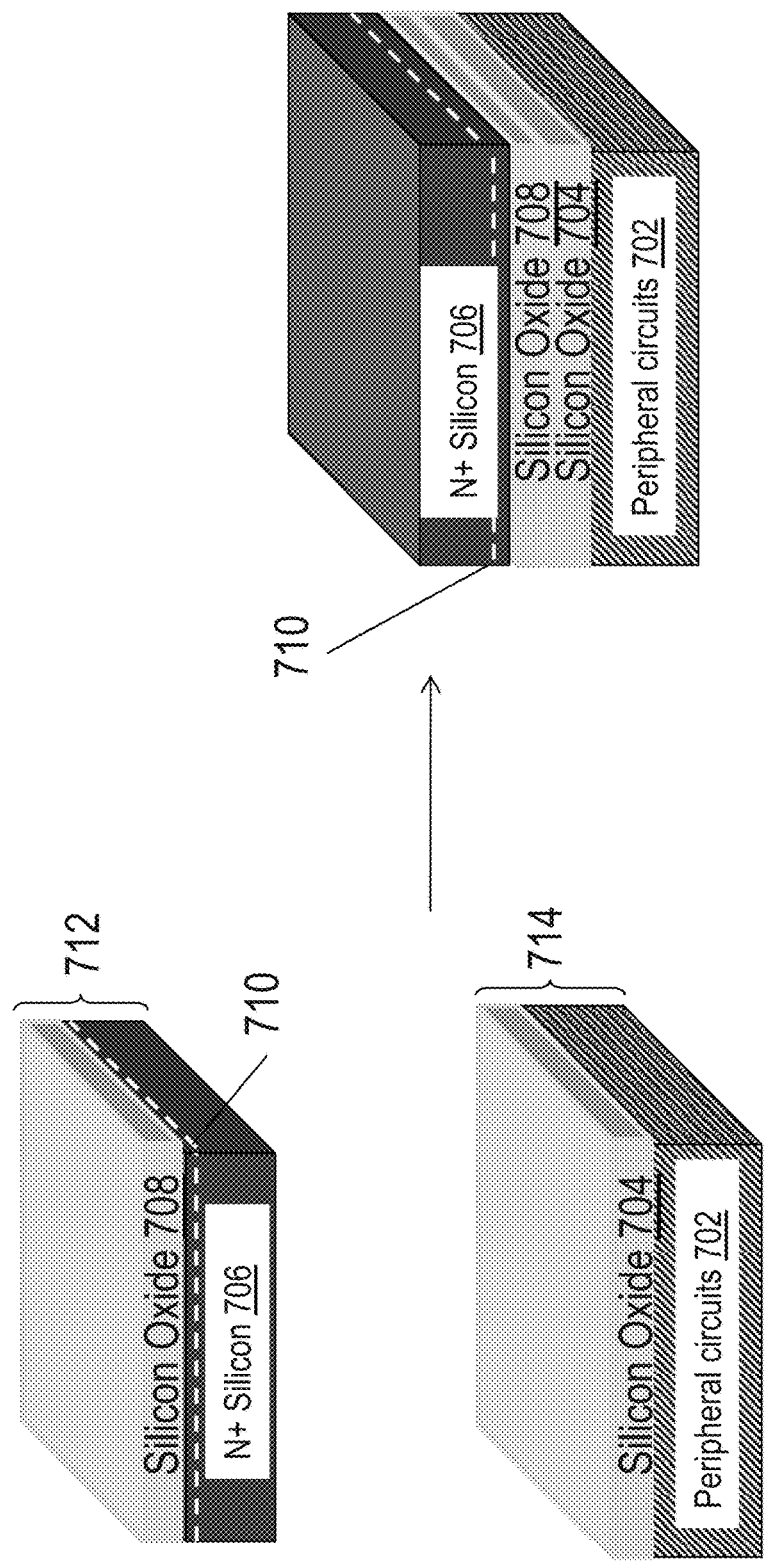

As illustrated in FIG. 7B, a mono-crystalline silicon donor wafer 712 may be processed to include a wafer sized layer of N+ doping (not shown) which may have a different dopant concentration than the N+ substrate 706. The N+ doping layer may be formed by ion implantation and thermal anneal. A screen oxide layer 708 may be grown or deposited prior to the implant to protect the silicon from implant contamination and to provide an oxide surface for later wafer to wafer bonding. A layer transfer demarcation plane 710 (shown as a dashed line) may be formed in donor wafer 712 within the N+ substrate 706 or the N+ doping layer (not shown) by hydrogen implantation or other methods as previously described. Both the donor wafer 712 and acceptor wafer 714 may be prepared for wafer bonding as previously described and then bonded at the surfaces of oxide layer 704 and oxide layer 708, for example, at a low temperature (less than approximately 400° C.) for lowest stresses, or a moderate temperature (less than approximately 900° C.).

Figure 7C:
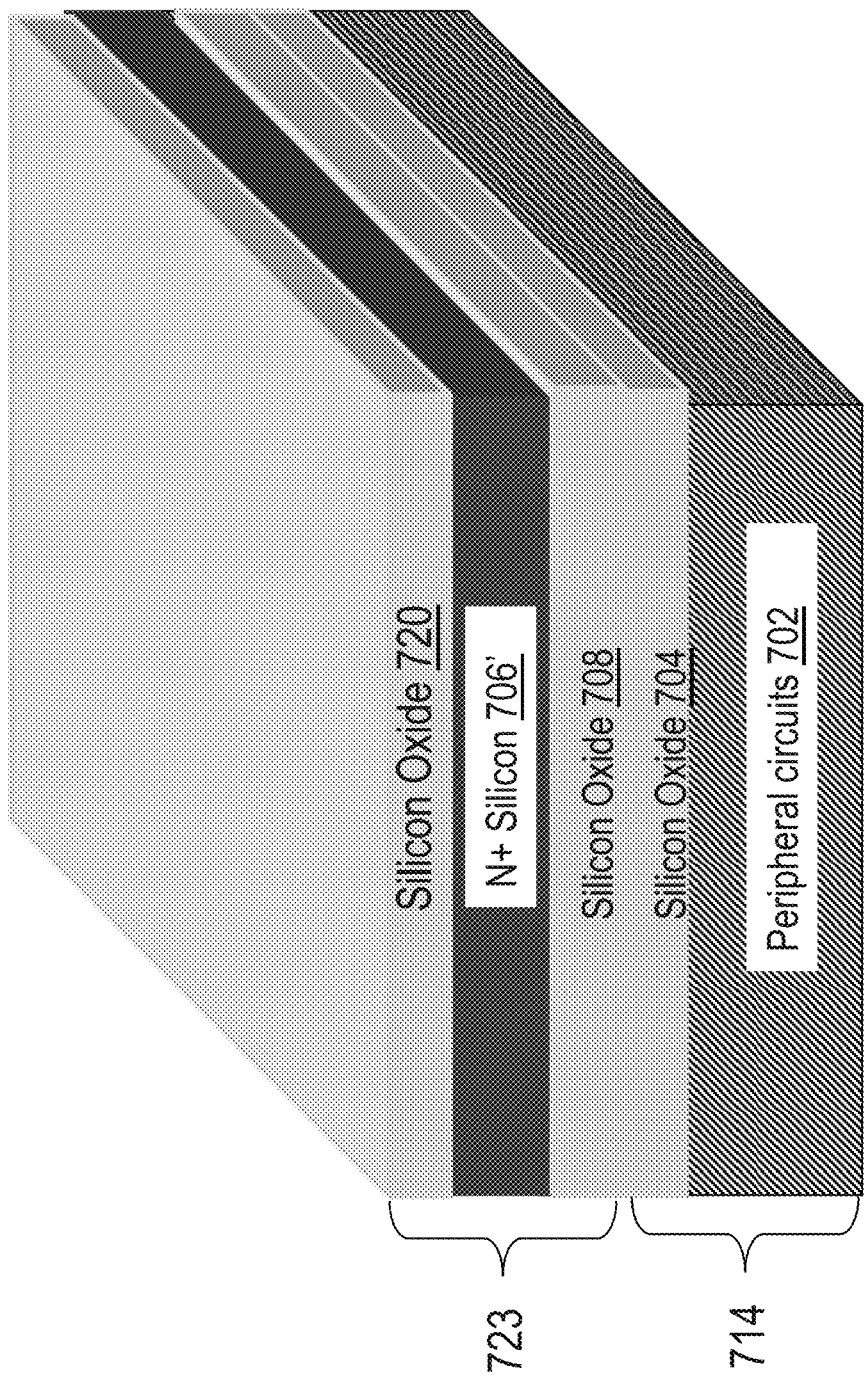

As illustrated in FIG. 7C, the portion of the N+ layer (not shown) and the N+ wafer substrate 706 that may be above the layer transfer demarcation plane 710 may be removed by cleaving and polishing, or other processes as previously described, such as, for example, ion-cut or other methods, thus forming the remaining mono-crystalline silicon N+ layer 706'. Remaining N+ layer 706' and oxide layer 708 have been layer transferred to acceptor wafer 714. The top surface of N+ layer 706' may be chemically or mechanically polished smooth and flat. Now transistors or portions of transistors may be formed and aligned to the acceptor wafer 714 alignment marks (not shown). Oxide layer 720 may be deposited to prepare the surface for later oxide to oxide bonding. This now forms the first Si/SiO2 layer 723 which includes silicon oxide layer 720, N+ silicon layer 706', and oxide layer 708.

Figure 7D:
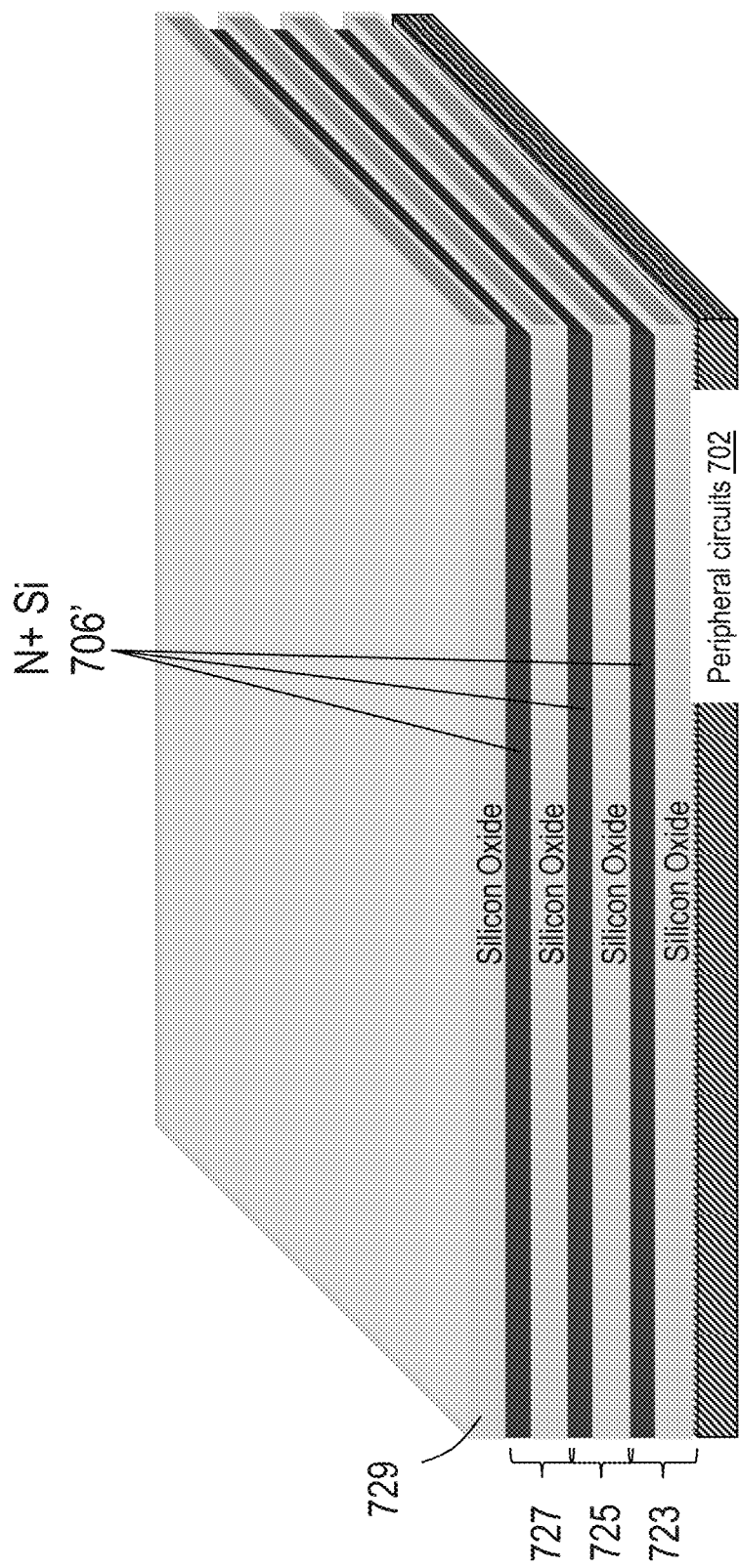

As illustrated in FIG. 7D, additional Si/SiO2 layers, such as, for example, second Si/SiO2 layer 725 and third Si/SiO2 layer 727, may each be formed as described in FIGS. 7A to 7C. Oxide layer 729 may be deposited to electrically isolate the top N+ silicon layer.

Figure 7E:
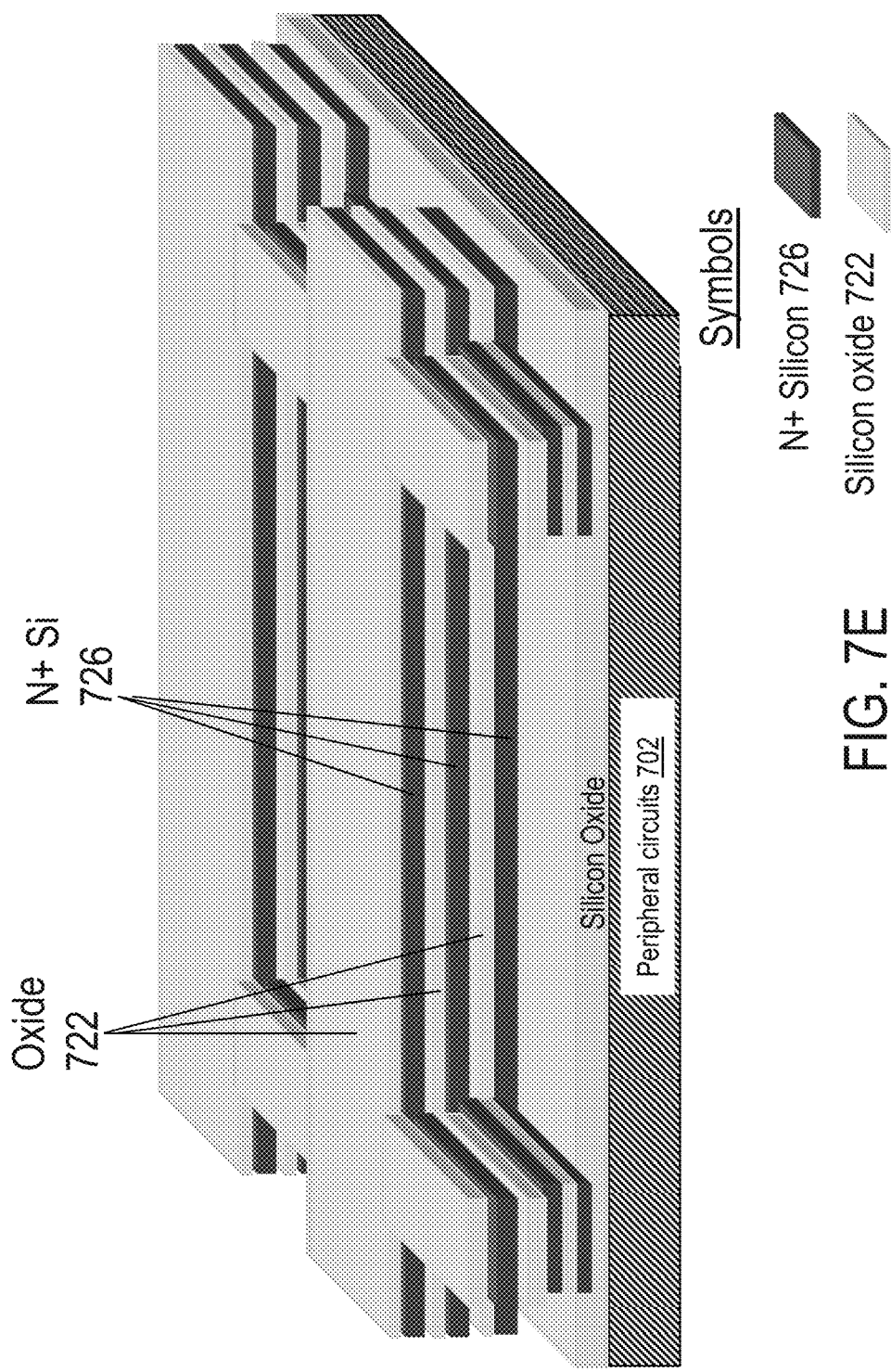

As illustrated in FIG. 7E, oxide layer 729, third Si/SiO2 layer 727, second Si/SiO2 layer 725 and first Si/SiO2 layer 723 may be lithographically defined and plasma/RIE etched to form a portion of the memory cell structure, which now includes regions of N+ silicon 726 and oxide 722.

Figure 7F:
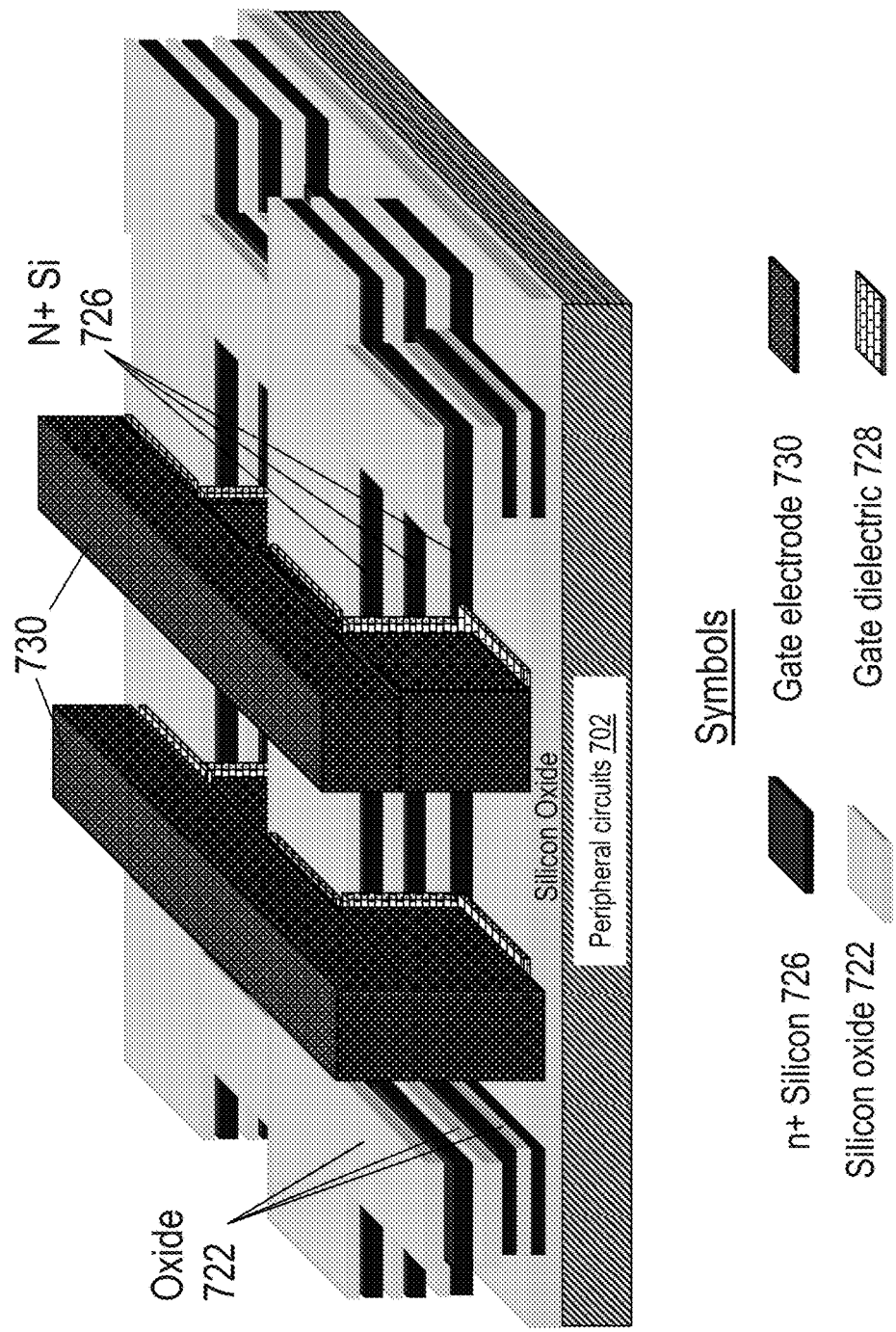

As illustrated in FIG. 7F, a gate dielectric and gate electrode material may be deposited, planarized with a chemical mechanical polish (CMP), and then lithographically defined and plasma/RIE etched to form gate dielectric regions 728 which may either be self-aligned to and substantially covered by gate electrodes 730 (shown), or substantially cover the entire N+ silicon 726 and oxide 722 multi-layer structure. The gate stack including gate electrodes 730 and gate dielectric regions 728 may be formed with a gate dielectric, such as, for example, thermal oxide, and a gate electrode material, such as, for example, polycrystalline silicon. Alternatively, the gate dielectric may be an atomic layer deposited (ALD) material that may be paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 7G:
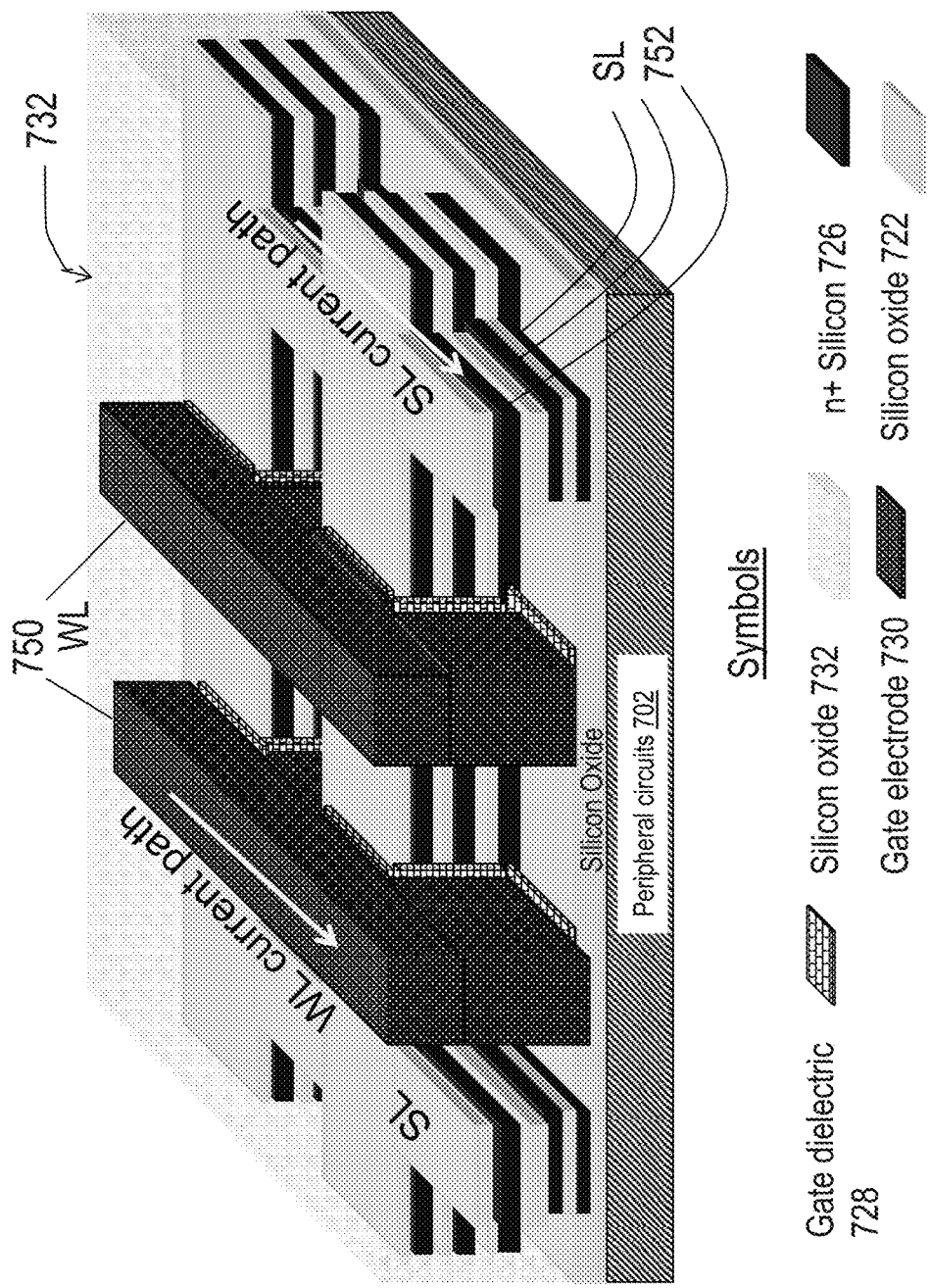

As illustrated in FIG. 7G, the entire structure may be substantially covered with a gap fill oxide 732, which may be planarized with chemical mechanical polishing. The oxide 732 is shown transparent in the figure for clarity. Word-line regions (WL) 750, coupled with and composed of gate electrodes 730, and source-line regions (SL) 752, composed of N+ silicon regions 726, are shown.

Figure 7H:
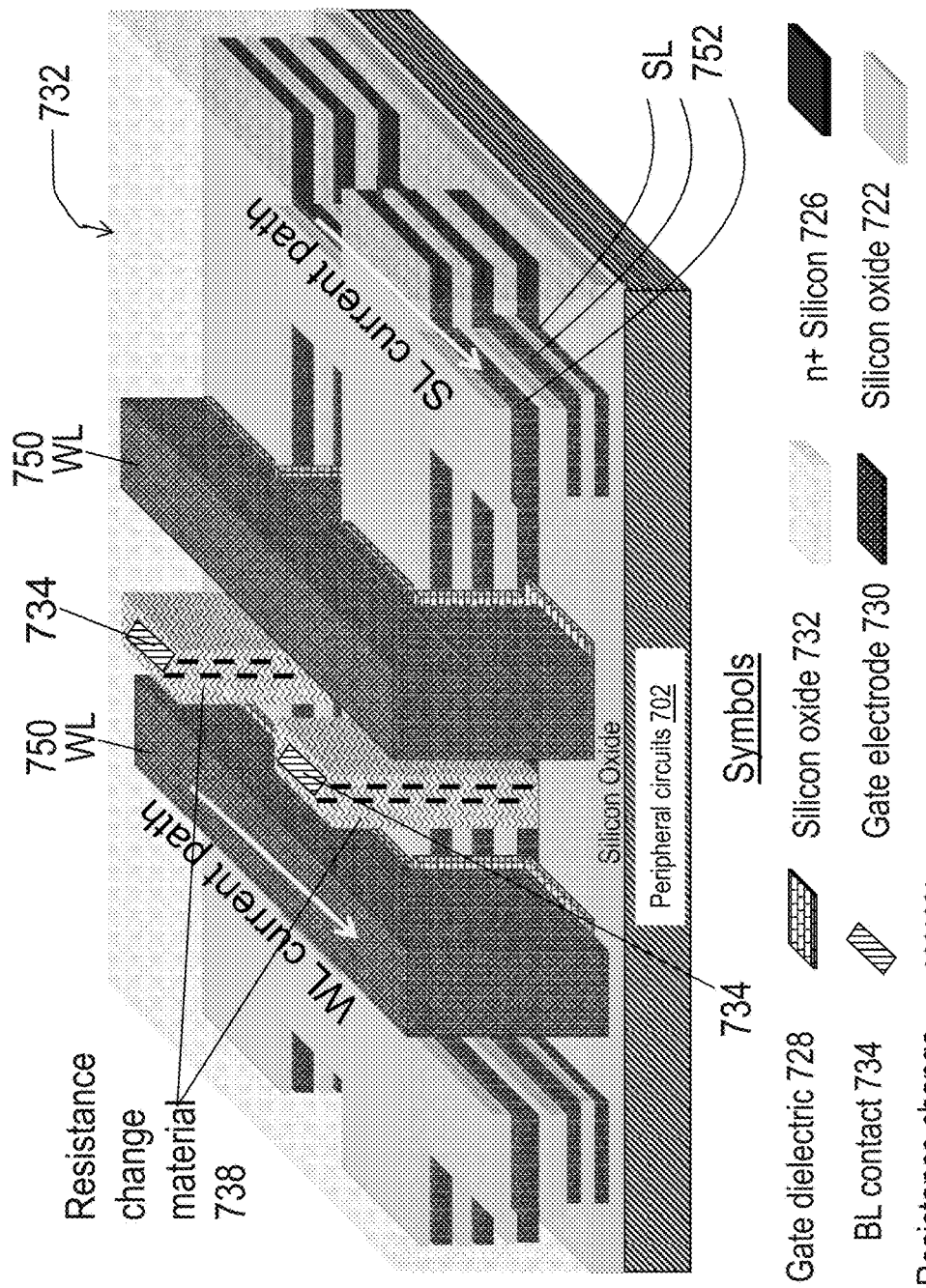

As illustrated in FIG. 7H, bit-line (BL) contacts 734 may be lithographically defined, etched with plasma/RIE through oxide 732, the three N+ silicon regions 726, and associated oxide vertical isolation regions to connect substantially all memory layers vertically, and photoresist removed. Resistance change material 738, such as, for example, hafnium oxide, may then be deposited, for example, with atomic layer deposition (ALD). The electrode for the resistance change memory element may then be deposited by ALD to form the electrode/BL contact 734. The excess deposited material may be polished to planarity at or below the top of oxide 732. Each BL contact 734 with resistive change material 738 may be shared among substantially all layers of memory, shown as three layers of memory in FIG. 7H.

Figure 7I:
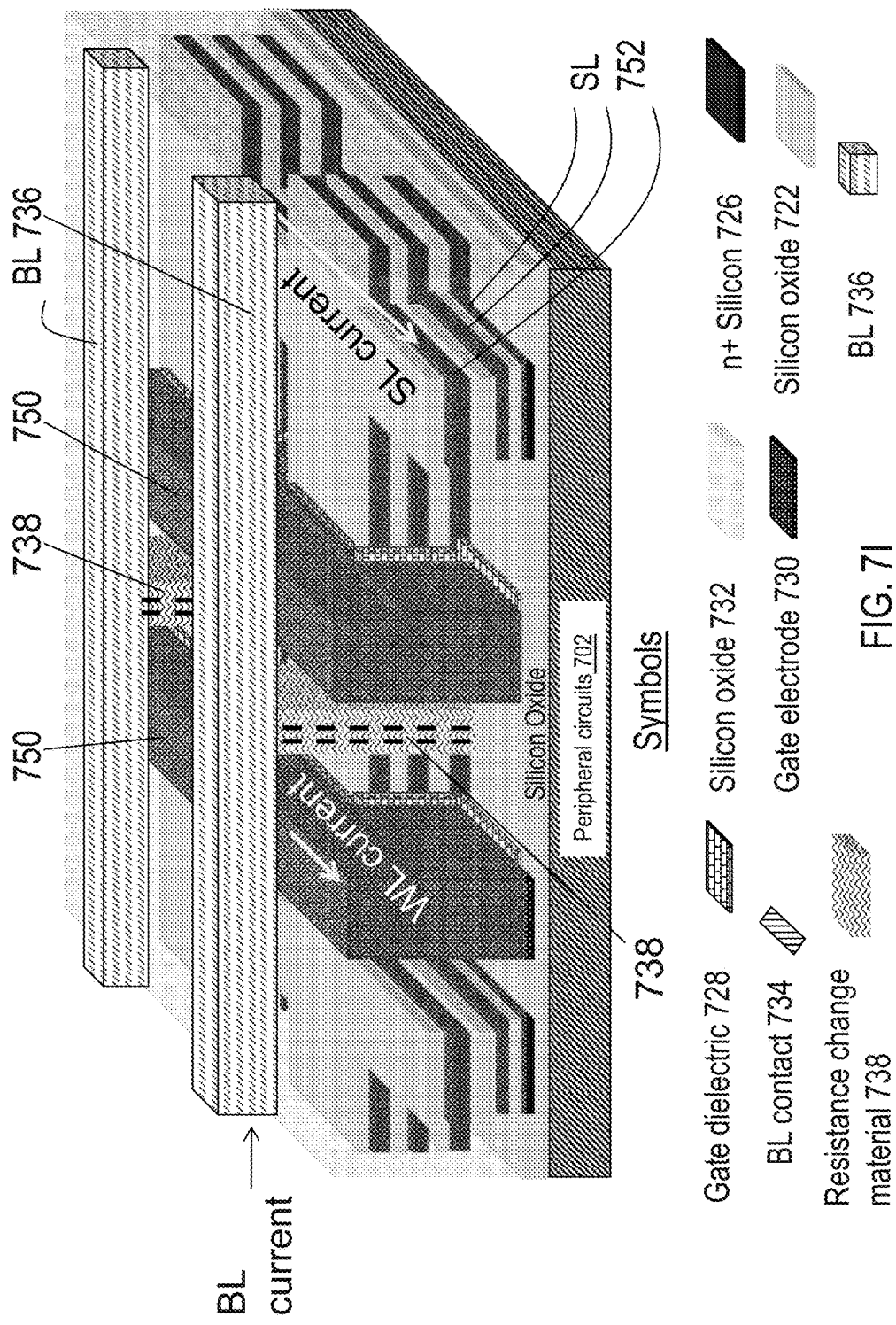

As illustrated in FIG. 7I, BL metal lines 736 may be formed and connect to the associated BL contacts 734 with resistive change material 738. Contacts and associated metal interconnect lines (not shown) may be formed for the WL and SL at the memory array edges. A thru layer via (not shown) may be formed to electrically couple the BL, SL, and WL metallization to the acceptor wafer 714 peripheral circuitry via an acceptor wafer metal connect pad (not shown).

Figure 7J:
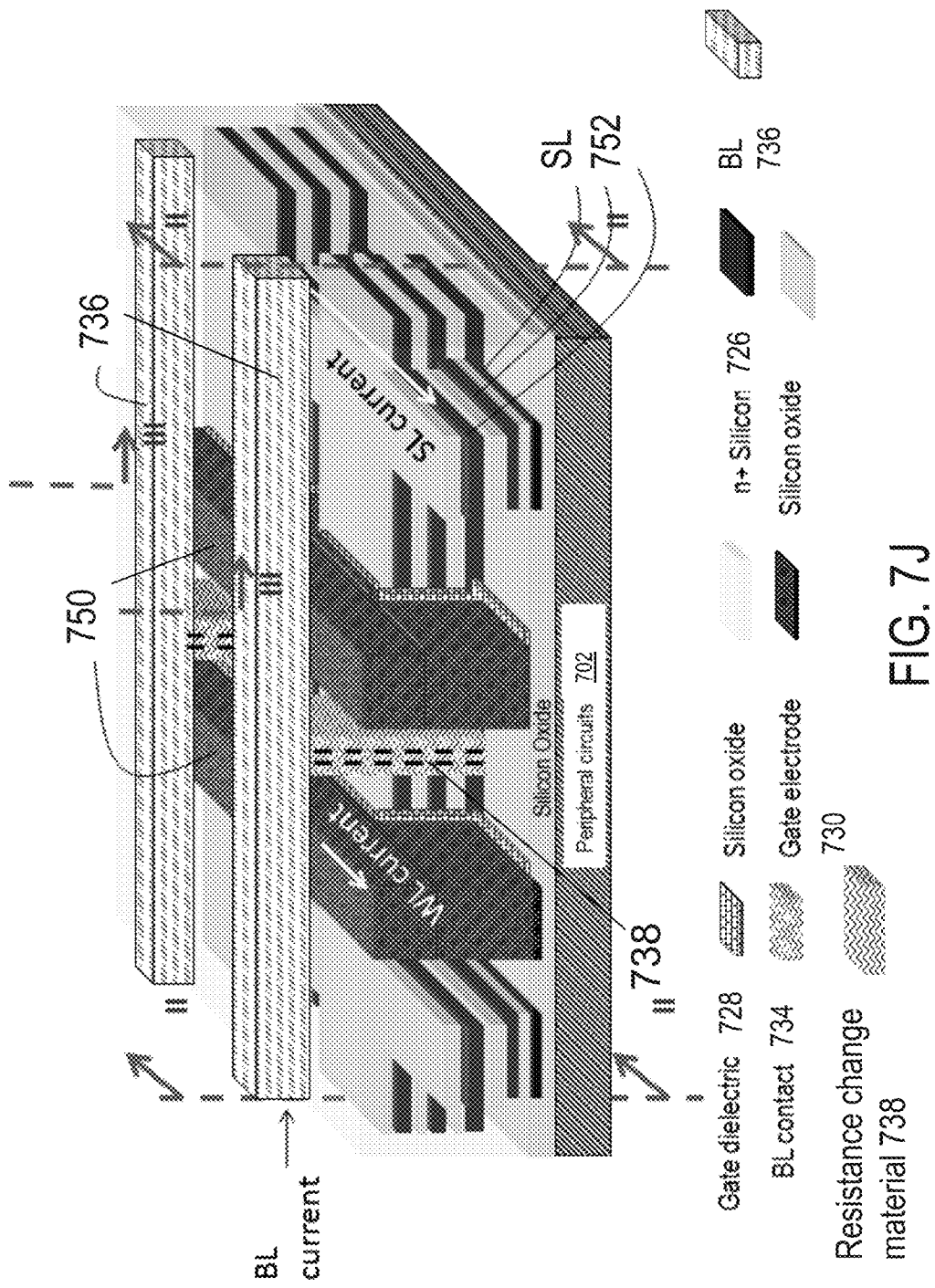

As illustrated in FIGS. 7J, 7J1 and 7J2, cross section cut II of FIG. 7J is shown in FIG. 7J1, and cross section cut III of FIG. 7J is shown in FIG. 7J2. BL metal lines 736, oxide 732, BL contact/electrode 2534, resistive change material 738, WL regions 750, gate dielectric regions 728, N+ silicon regions 726, and peripheral circuitry substrate 702 are shown in FIG. 7J1. The BL contact/electrode 2534 couples to one side of the three levels of resistive change material 738. The other side of the resistive change material 738 may be coupled to N+ regions 726. BL metal lines 736, oxide 732, gate electrodes 730, gate dielectric regions 728, N+ silicon regions 726, interlayer oxide region (ox'), and peripheral circuitry substrate 702 are shown in FIG. 7J2. The gate electrode 730 may be common to substantially all six N+ silicon regions 726 and forms six two-sided gated junction-less transistors as memory select transistors.

Figure 7K:
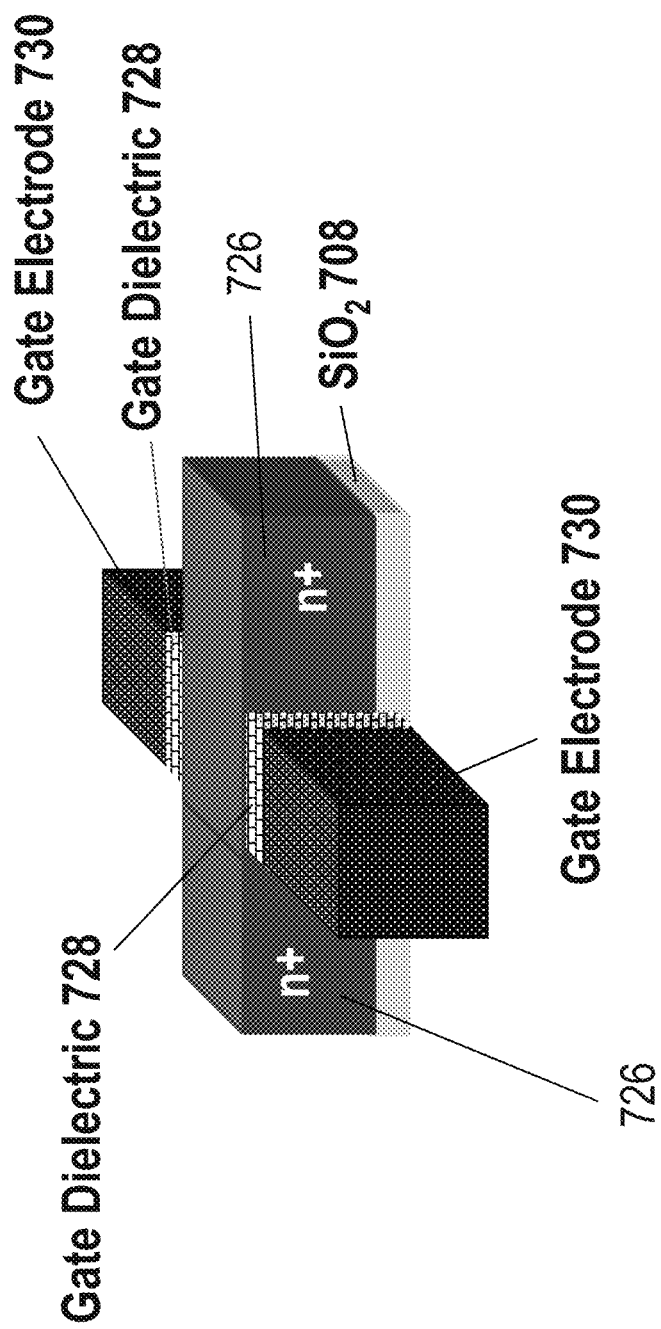

As illustrated in FIG. 7K, a single exemplary two-sided gated junction-less transistor on the first Si/SiO2 layer 723 may include N+ silicon region 726 (functioning as the source, drain, and transistor channel), and two gate electrodes 730 with associated gate dielectric regions 728. The transistor may be electrically isolated from beneath by oxide layer 708.

This flow enables the formation of a resistance-based multi-layer or 3D memory array with zero additional masking steps per memory layer, which utilizes junction-less transistors and may have a resistance-based memory element in series with a select transistor, and may be constructed by layer transfers of wafer sized doped monocrystalline silicon layers, and this 3D memory array may be connected to an underlying multi-metal layer semiconductor device.

Persons of ordinary skill in the art will appreciate that the illustrations in FIGS. 7A through 7K are exemplary only and are not drawn to scale. Such skilled persons will further appreciate that many variations are possible such as, for example, the transistors may be of another type such as RCATs. Additionally, doping of each N+ layer may be slightly different to compensate for interconnect resistances. Moreover, the stacked memory layer may be connected to a periphery circuit that may be above the memory stack. Further, each gate of the double gate 3D resistance based memory can be independently controlled for increased control of the memory cell. Many other modifications within the scope of the invention will suggest themselves to such skilled persons after reading this specification. Thus the invention is to be limited only by the appended claims.

The monolithic 3D integration concepts described in this patent application can lead to novel embodiments of poly-crystalline silicon based memory architectures. While the below concepts in FIG. 8 are explained by using resistive memory architectures as an example, it will be clear to one skilled in the art that similar concepts can be applied to the NAND flash, charge trap, and DRAM memory architectures and process flows described previously in this patent application and incorporated by reference co-owned applications.

As illustrated in FIGS. 8A to 8K, a resistance-based 3D memory with zero additional masking steps per memory layer may be constructed with methods that may be suitable for 3D IC manufacturing. This 3D memory utilizes poly-crystalline silicon junction-less transistors that may have either a positive or a negative threshold voltage and may have a resistance-based memory element in series with a select or access transistor.

Figure 8A:
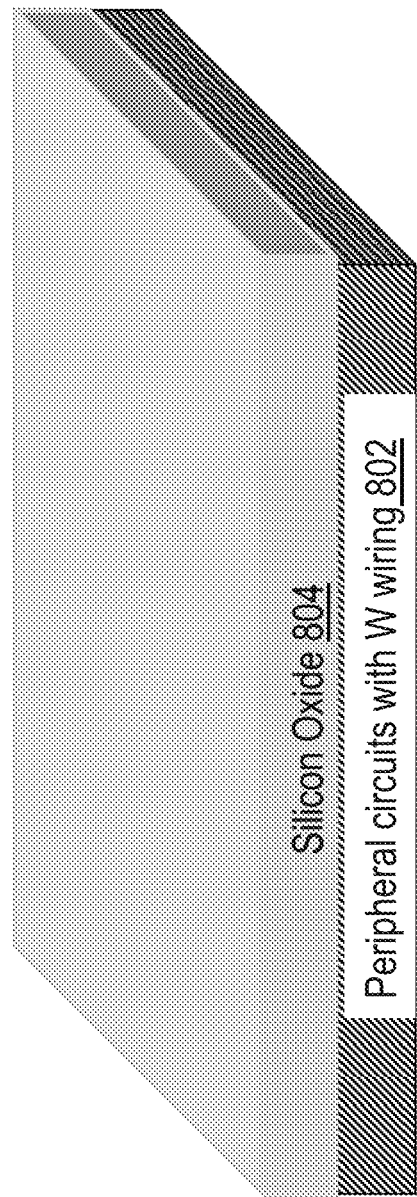

As illustrated in FIG. 8A, a silicon substrate with peripheral circuitry 802 may be constructed with high temperature (greater than approximately 400° C.) resistant wiring, such as, for example, Tungsten. The peripheral circuitry substrate 802 may include memory control circuits as well as circuitry for other purposes and of various types, such as, for example, analog, digital, RF, or memory. The peripheral circuitry substrate 802 may include peripheral circuits that can withstand an additional rapid-thermal-anneal (RTA) and still remain operational and retain good performance. For this purpose, the peripheral circuits may be formed such that they have not been subjected to a weak RTA or no RTA for activating dopants. Silicon oxide layer 804 may be deposited on the top surface of the peripheral circuitry substrate.

Figure 8B:
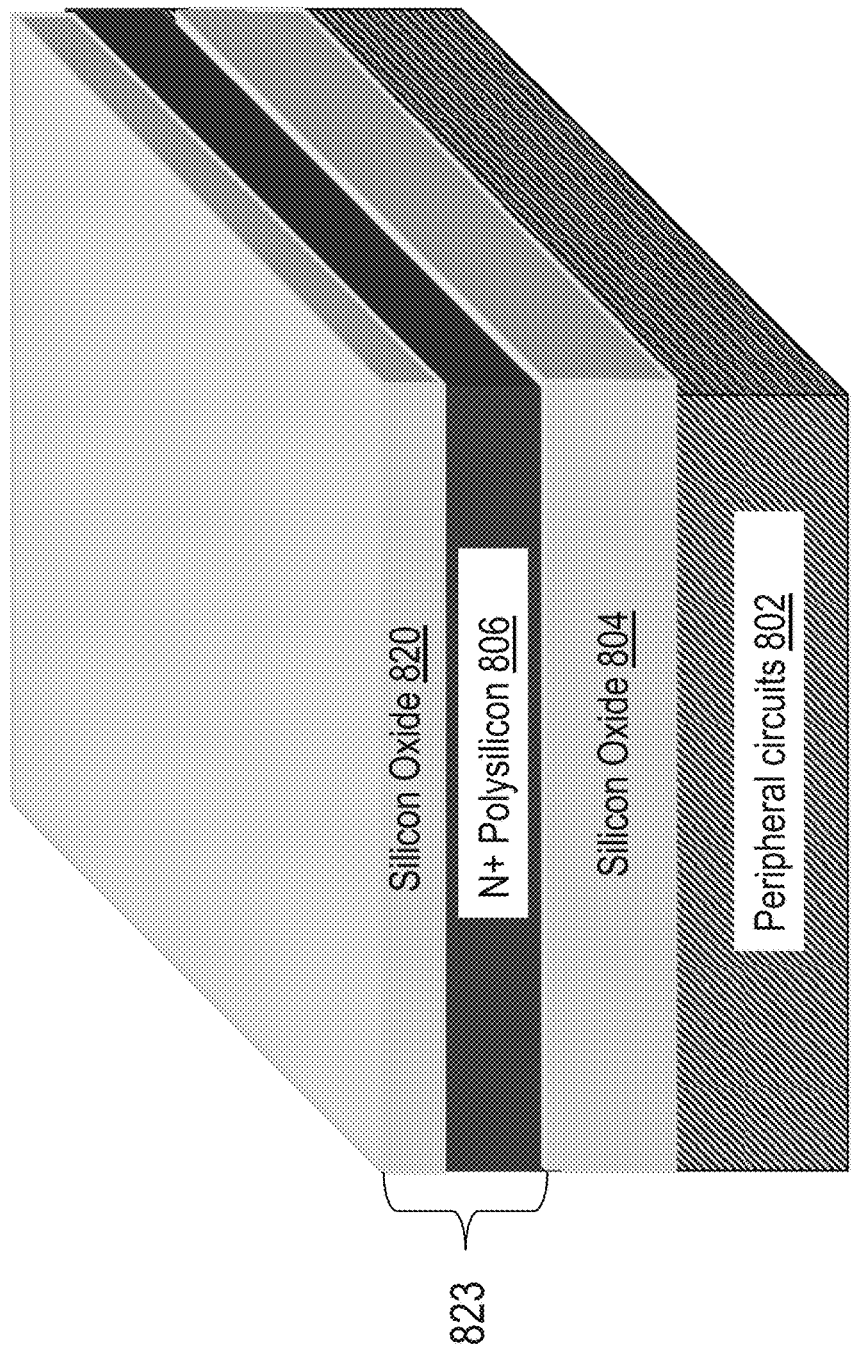

As illustrated in FIG. 8B, a layer of N+ doped poly-crystalline or amorphous silicon 806 may be deposited. The amorphous silicon or poly-crystalline silicon layer 806 may be deposited using a chemical vapor deposition process, such as, for example, LPCVD or PECVD, or other process methods, and may be deposited doped with N+ dopants, such as, for example, Arsenic or Phosphorous, or may be deposited un-doped and subsequently doped with, such as, for example, ion implantation or PLAD (PLasma Assisted Doping) techniques. Silicon Oxide 820 may then be deposited or grown. This now forms the first Si/SiO2 layer 823 which includes N+ doped poly-crystalline or amorphous silicon layer 806 and silicon oxide layer 820.

Figure 8C:
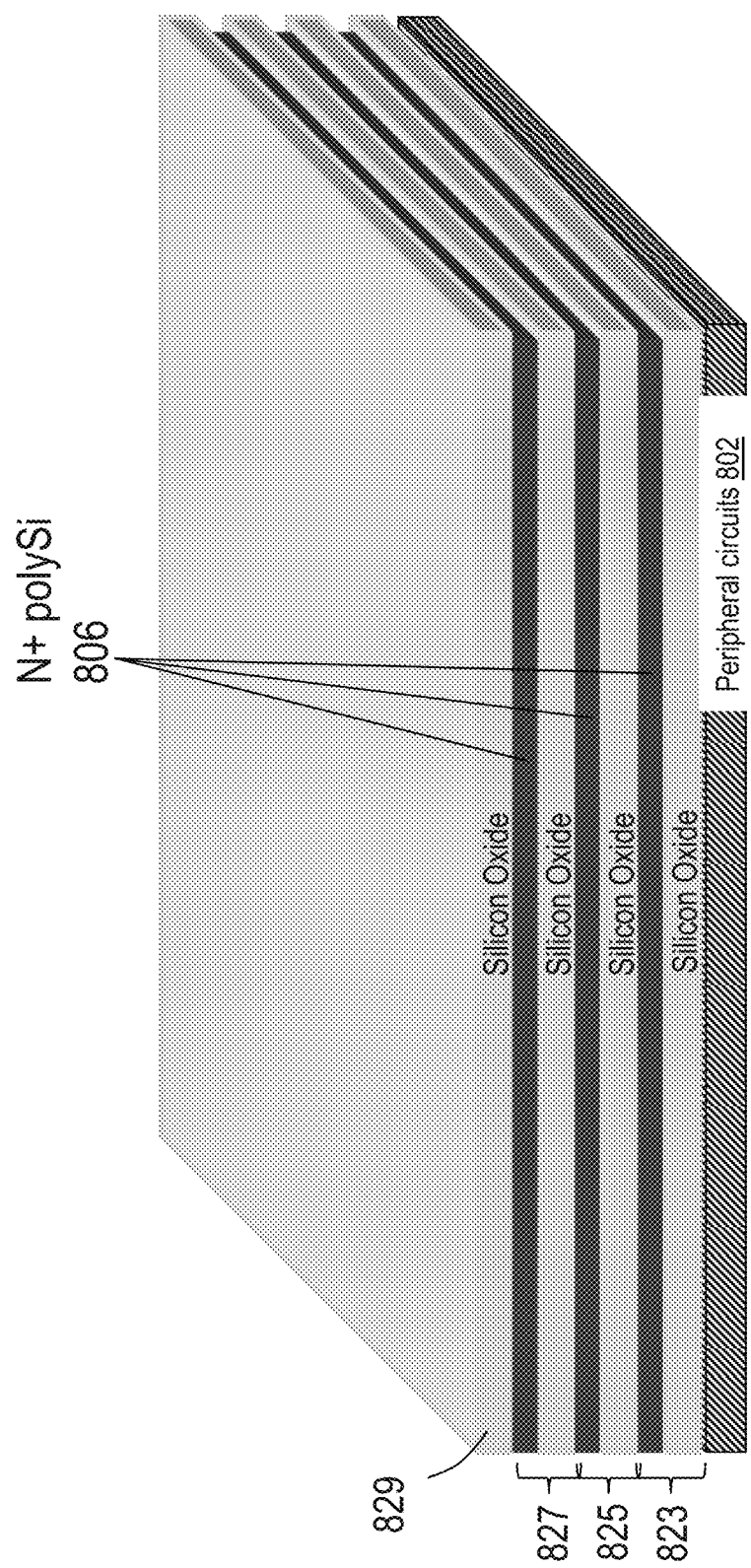

As illustrated in FIG. 8C, additional Si/SiO2 layers, such as, for example, second Si/SiO2 layer 825 and third Si/SiO2 layer 827, may each be formed as described in FIG. 8B. Oxide layer 829 may be deposited to electrically isolate the top N+ doped poly-crystalline or amorphous silicon layer.

Figure 8D:
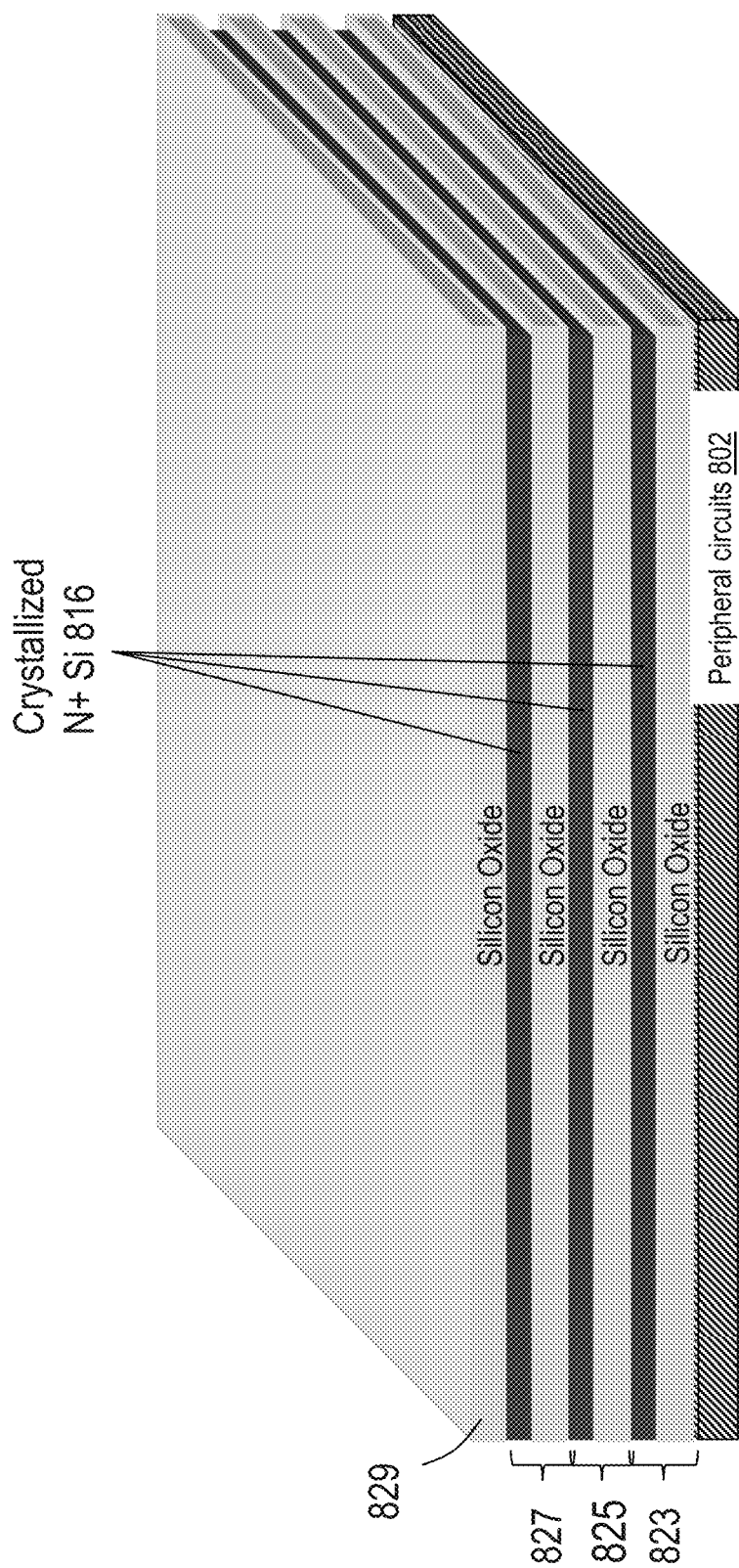

As illustrated in FIG. 8D, a Rapid Thermal Anneal (RTA) may be conducted to crystallize the N+ doped poly-crystalline silicon or amorphous silicon layers 806 of first Si/SiO2 layer 823, second Si/SiO2 layer 825, and third Si/SiO2 layer 827, forming crystallized N+ silicon layers 816. Temperatures during this RTA may be as high as approximately 800° C. Alternatively, an optical anneal, such as, for example, a laser anneal, could be performed alone or in combination with the RTA or other annealing processes.

Figure 8E:
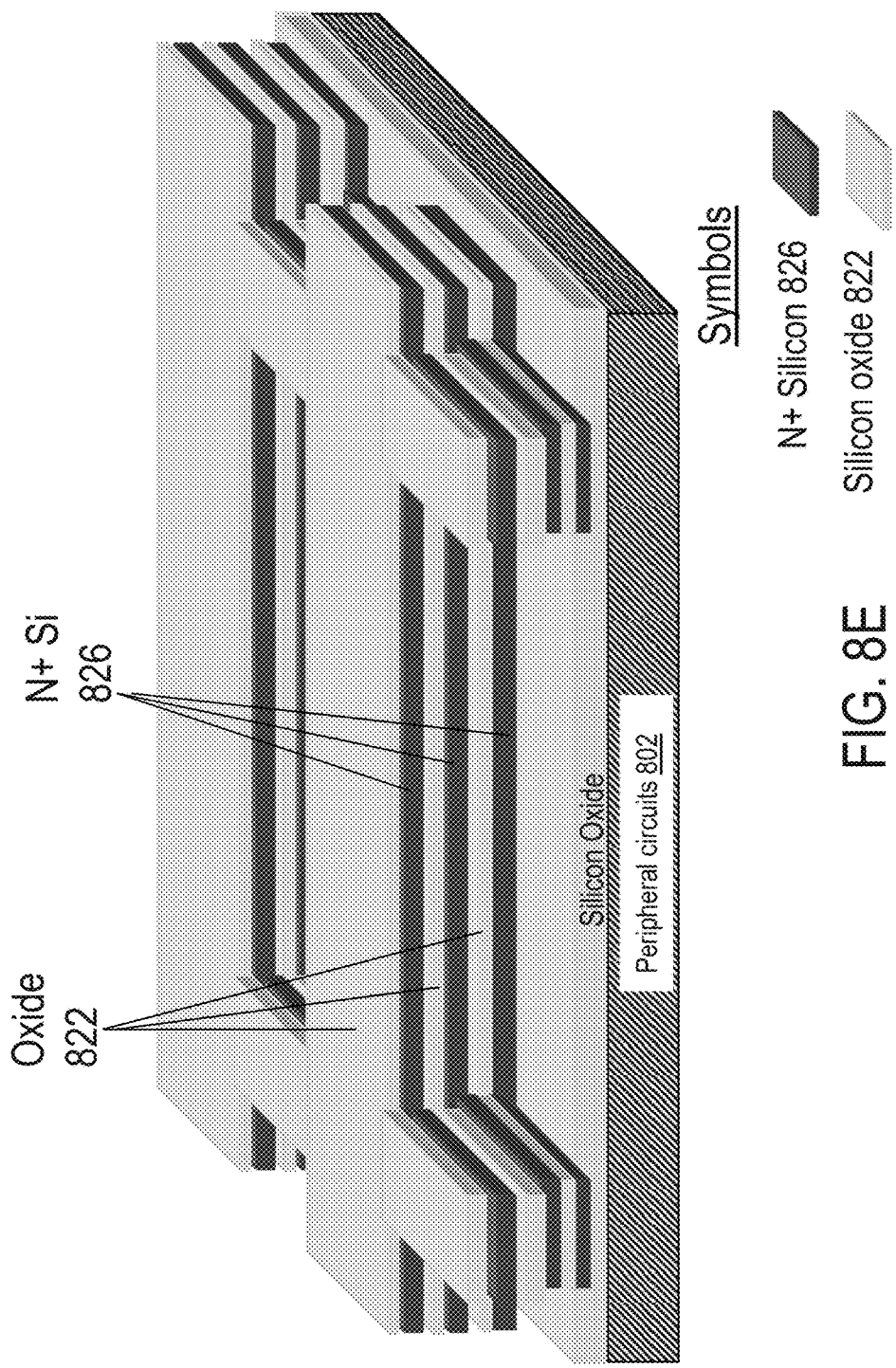

As illustrated in FIG. 8E, oxide layer 829, third Si/SiO2 layer 827, second Si/SiO2 layer 825 and first Si/SiO2 layer 823 may be lithographically defined and plasma/RIE etched to form a portion of the memory cell structure, which now includes multiple layers of regions of crystallized N+ silicon 826 (previously crystallized N+ silicon layers 816) and oxide 822.

Figure 8F:
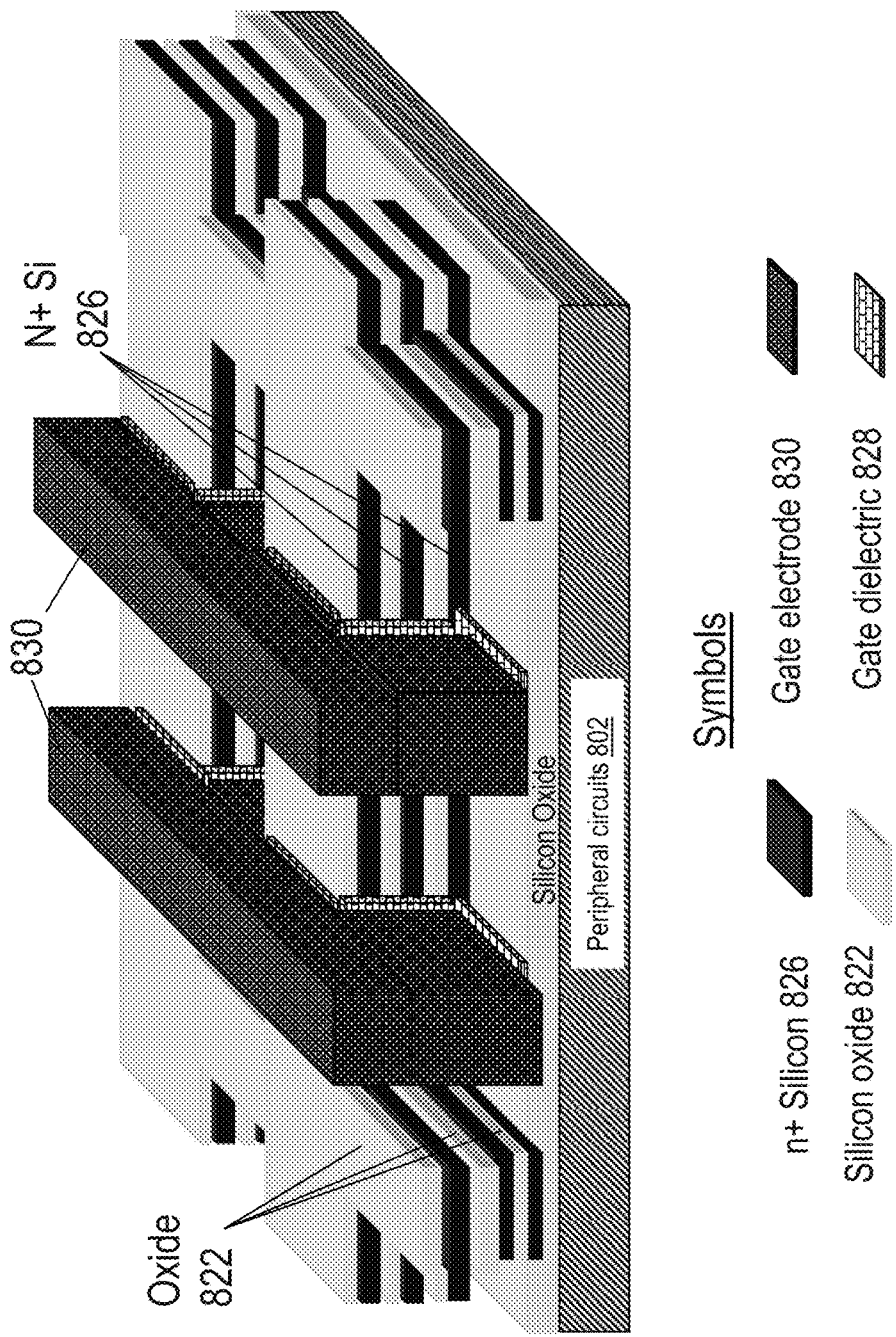

As illustrated in FIG. 8F, a gate dielectric and gate electrode material may be deposited, planarized with a chemical mechanical polish (CMP), and then lithographically defined and plasma/RIE etched to form gate dielectric regions 828 which may either be self-aligned to and substantially covered by gate electrodes 830 (shown), or substantially cover the entire crystallized N+ silicon regions 826 and oxide regions 822 multi-layer structure. The gate stack may include gate electrodes 830 and gate dielectric regions 828, and may be formed with a gate dielectric, such as, for example, thermal oxide, and a gate electrode material, such as, for example, poly-crystalline silicon. Alternatively, the gate dielectric may be an atomic layer deposited (ALD) material that may be paired with a work function specific gate metal in the industry standard high k metal gate process schemes described previously. Further, the gate dielectric may be formed with a rapid thermal oxidation (RTO), a low temperature oxide deposition or low temperature microwave plasma oxidation of the silicon surfaces and then a gate electrode such as, for example, tungsten or aluminum may be deposited.

Figure 8G:
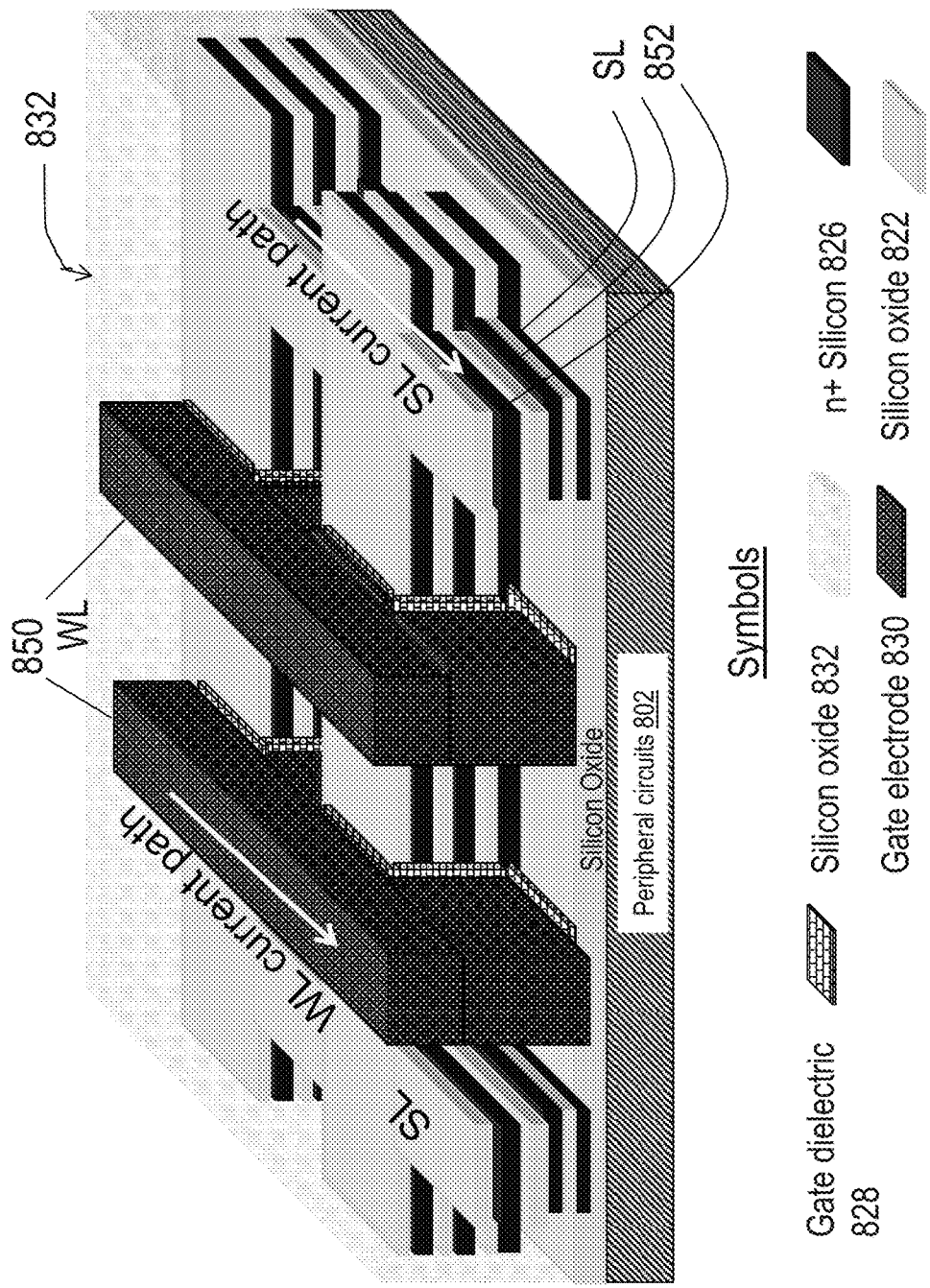

As illustrated in FIG. 8G, the entire structure may be substantially covered with a gap fill oxide 832, which may be planarized with chemical mechanical polishing. The oxide 832 is shown transparently in the figure for clarity. Word-line regions (WL) 850, coupled with and composed of gate electrodes 830, and source-line regions (SL) 852, composed of crystallized N+ silicon regions 826, are shown.

Figure 8H:
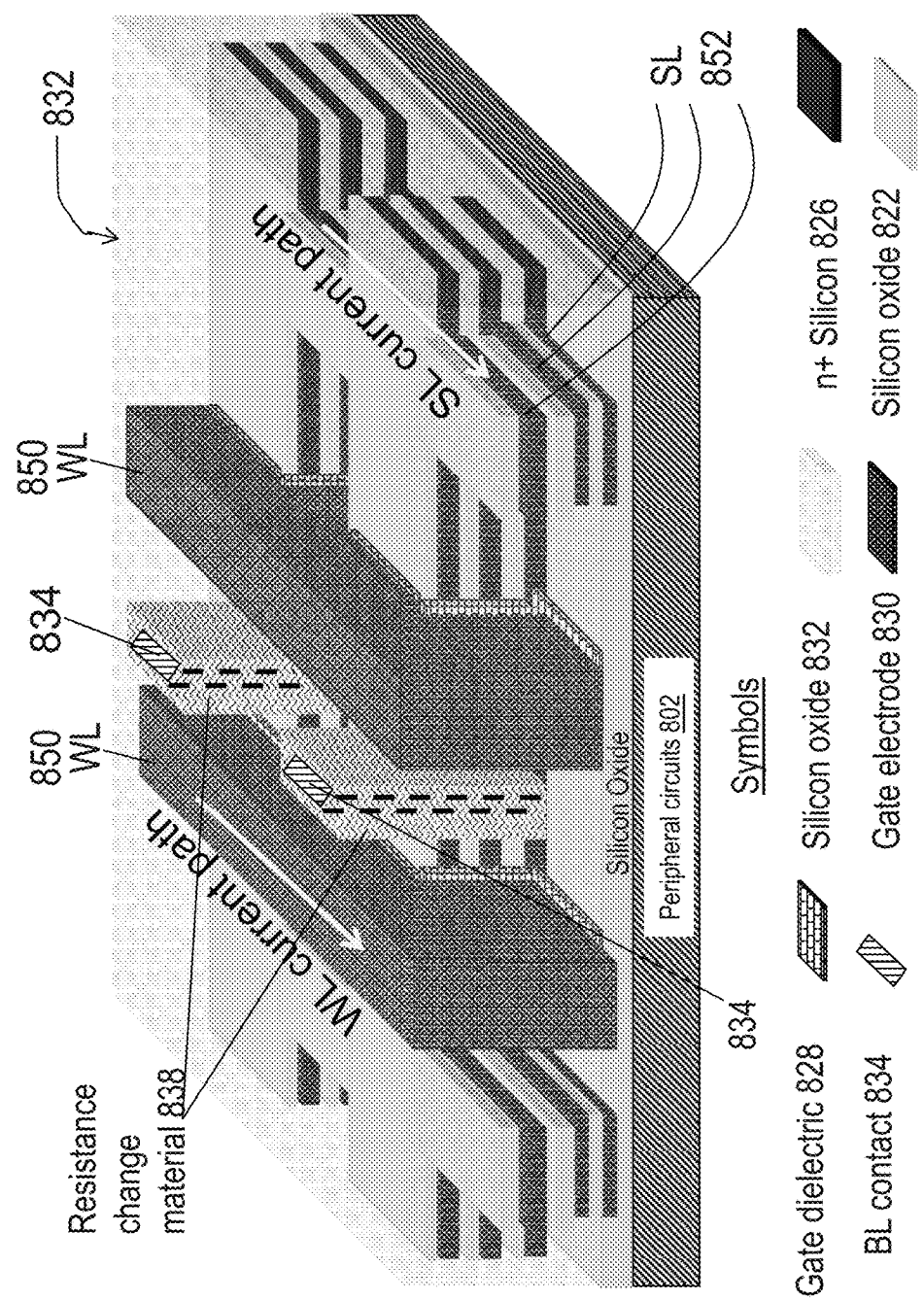

As illustrated in FIG. 8H, bit-line (BL) contacts 834 may be lithographically defined, etched with plasma/RIE through oxide 832, the three crystallized N+ silicon regions 826, and associated oxide vertical isolation regions to connect substantially all memory layers vertically, and photoresist removed. Resistance change material 838, such as, for example, hafnium oxides or titanium oxides, may then be deposited, for example, with atomic layer deposition (ALD). The electrode for the resistance change memory element may then be deposited by ALD to form the electrode/BL contact 834. The excess deposited material may be polished to planarity at or below the top of oxide 832. Each BL contact 834 with resistive change material 838 may be shared among substantially all layers of memory, shown as three layers of memory in FIG. 8H.

Figure 8I:
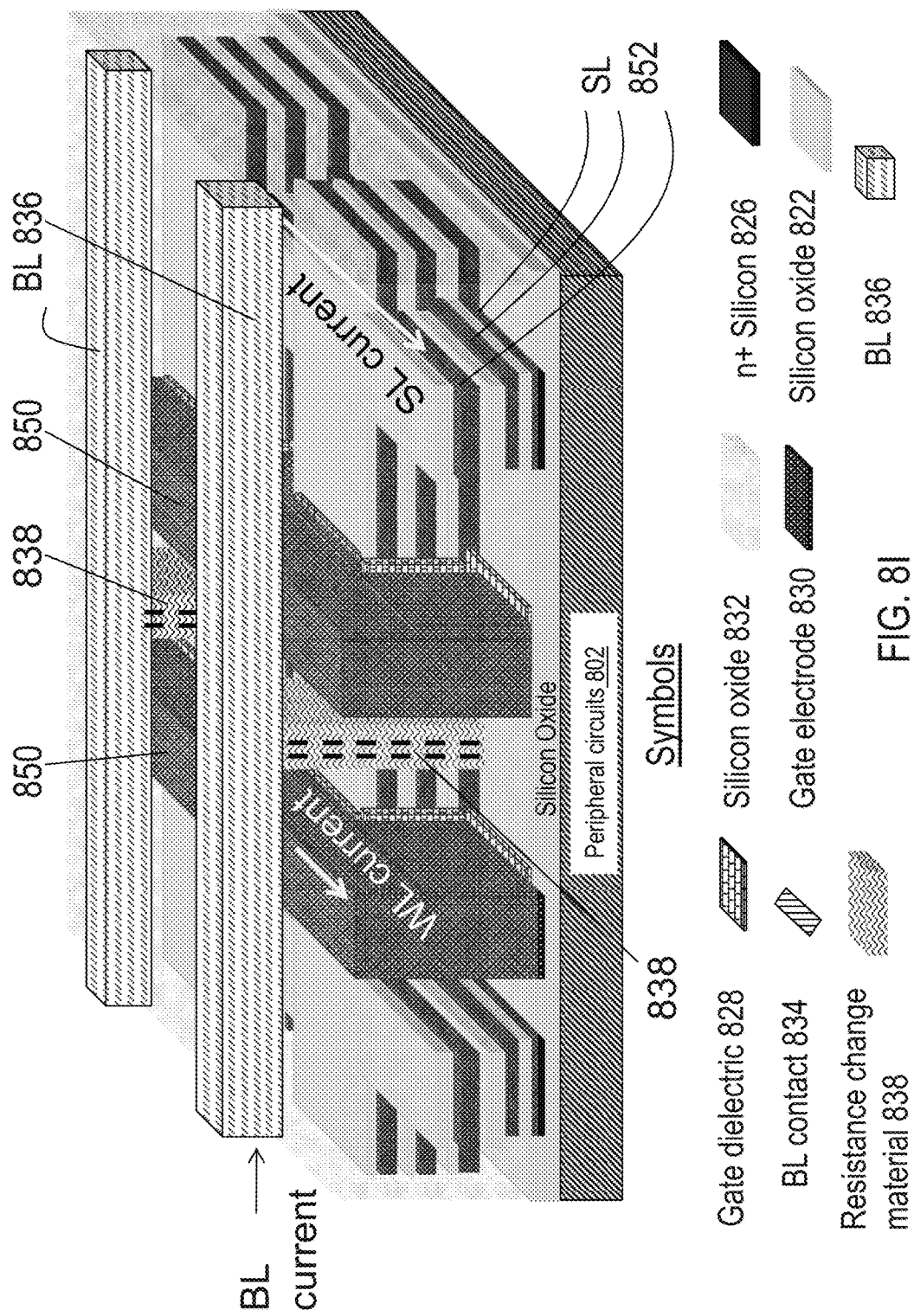

As illustrated in FIG. 8I, BL metal lines 836 may be formed and connect to the associated BL contacts 834 with resistive change material 838. Contacts and associated metal interconnect lines (not shown) may be formed for the WL and SL at the memory array edges. Thru layer vias (not shown) may be formed to electrically couple the BL, SL, and WL metallization to the acceptor substrate peripheral circuitry via acceptor wafer metal connect pads (not shown).

Figure 8J:
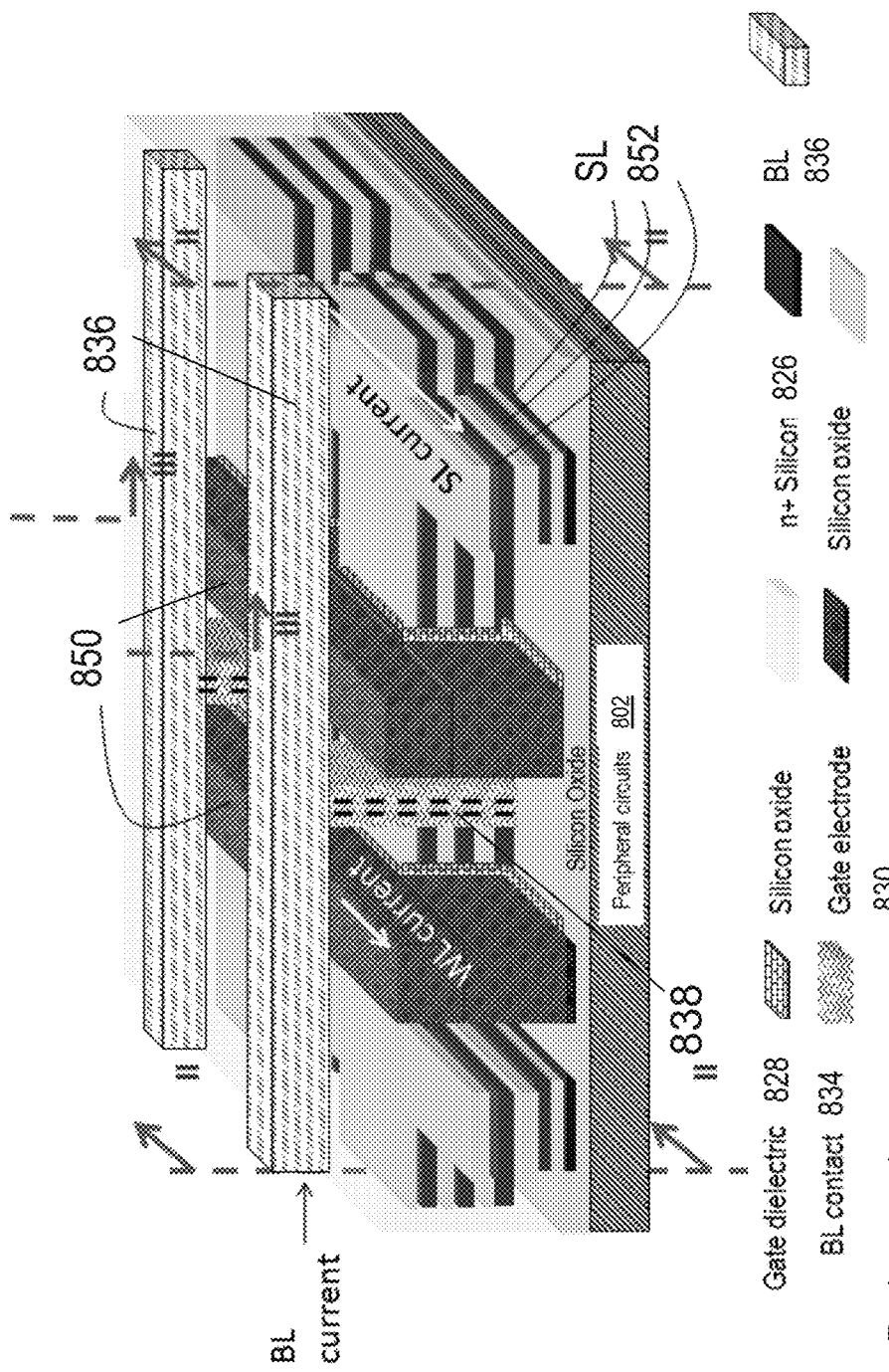

As illustrated in FIGS. 8J, 8J1 and 8J2, cross section cut II of FIG. 8J is shown in FIG. 8J1, and cross section cut III of FIG. 8J is shown in FIG. 8J2. BL metal line 836, oxide 832, BL contact/electrode 4934, resistive change material 838, WL regions 850, gate dielectric regions 828, crystallized N+ silicon regions 826, and peripheral circuitry substrate 802 are shown in FIG. 8J1. The BL contact/electrode 4934 couples to one side of the three levels of resistive change material 838. The other side of the resistive change material 838 may be coupled to crystallized N+ regions 826. BL metal lines 836, oxide 832, gate electrode 830, gate dielectric regions 828, crystallized N+ silicon regions 826, interlayer oxide region ('ox'), and peripheral circuitry substrate 802 are shown in FIG. 8J2. The gate electrode 830 may be common to substantially all six crystallized N+ silicon regions 826 and forms six two-sided gated junction-less transistors as memory select transistors.

Figure 8K:
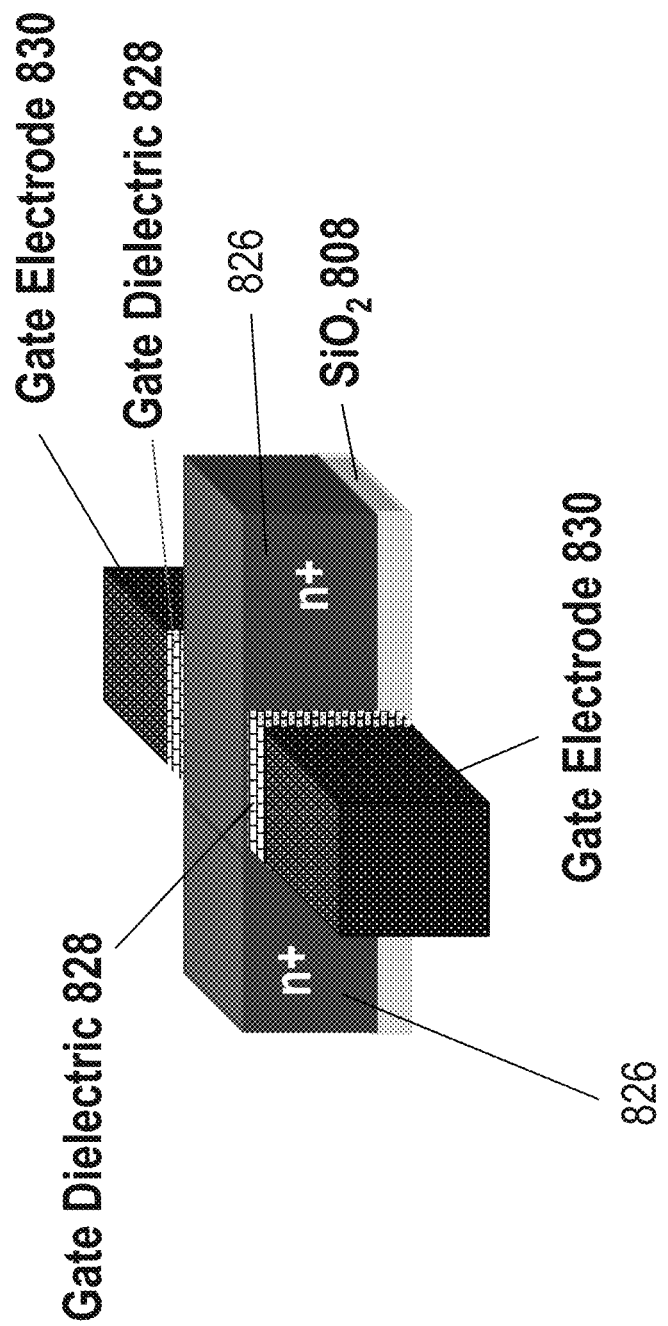

As illustrated in FIG. 8K, a single exemplary two-sided gated junction-less transistor on the first Si/SiO2 layer 823 may include crystallized N+ silicon region 826 (functioning as the source, drain, and transistor channel), and two gate electrodes 830 with associated gate dielectric regions 828. The transistor may be electrically isolated from beneath by oxide layer 808.

This flow enables the formation of a resistance-based multi-layer or 3D memory array with zero additional masking steps per memory layer, which utilizes poly-crystalline silicon junction-less transistors and may have a resistance-based memory element in series with a select transistor, and may be constructed by layer transfers of wafer sized doped poly-crystalline silicon layers, and this 3D memory array may be connected to an underlying multi-metal layer semiconductor device.

Persons of ordinary skill in the art will appreciate that the illustrations in FIGS. 8A through 8K are exemplary only and are not drawn to scale. Such skilled persons will further appreciate that many variations are possible such as, for example, the RTAs and/or optical anneals of the N+ doped poly-crystalline or amorphous silicon layers 806 as described for FIG. 8D may be performed after each Si/SiO2 layer is formed in FIG. 8C. Additionally, N+ doped poly-crystalline or amorphous silicon layers 806 may be doped P+, or with a combination of dopants and other polysilicon network modifiers to enhance the RTA or optical annealing and subsequent crystallization and lower the N+ silicon layer 816 resistivity. Moreover, the doping of each crystallized N+ layer may be slightly different to compensate for interconnect resistances. Further, each gate of the double gated 3D resistance based memory may be independently controlled for increased control of the memory cell. Many other modifications within the scope of the invention will suggest themselves to such skilled persons after reading this specification. Thus the invention is to be limited only by the appended claims.

Some embodiments of the invention may include alternative techniques to build IC (Integrated Circuit) devices including techniques and methods to construct 3D IC systems. Some embodiments of the invention may enable device solutions with far less power consumption than prior art. These device solutions could be very useful for the growing application of mobile electronic devices and mobile systems such as, for example, mobile phones, smart phone, and cameras, those mobile systems may also connect to the internet. For example, incorporating the 3D IC semiconductor devices according to some embodiments of the invention within these mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention.

In U.S. application Ser. No. 12/903,862, filed by some of the inventors and assigned to the same assignee, a 3D micro display and a 3D image sensor are presented. Integrating one or both of these with complex logic and or memory could be very effective for mobile system. Additionally, mobile systems could be customized to some specific market applications by integrating some embodiments of the invention.

Moreover, utilizing 3D programmable logic or 3D gate array as had been described in some embodiments of the invention could be very effective in forming flexible mobile systems.

The need to reduce power to allow effective use of limited battery energy and also the lightweight and small form factor derived by highly integrating functions with low waste of interconnect and substrate could be highly benefited by the redundancy and repair idea of the 3D monolithic technology as has been presented in embodiments of the invention. This unique technology could enable a mobile device that would be lower cost to produce or would require lower power to operate or would provide a lower size or lighter carry weight, and combinations of these 3D monolithic technology features may provide a competitive or desirable mobile system.

Another unique market that may be addressed by some of the embodiments of the invention could be a street corner camera with supporting electronics. The 3D image sensor described in the Ser. No. 12/903,862 application would be very effective for day/night and multi-spectrum surveillance applications. The 3D image sensor could be supported by integrated logic and memory such as, for example, a monolithic 3D IC with a combination of image processing and image compression logic and memory, both high speed memory such as 3D DRAM and high density non-volatile memory such as 3D NAND or RRAM or other memory, and other combinations. This street corner camera application would require low power, low cost, and low size or any combination of these features, and could be highly benefited from the 3D technologies described herein.

3D ICs according to some embodiments of the invention could enable electronic and semiconductor devices with much a higher performance as a result from the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These potential advantages could lead to more powerful computer systems and improved systems that have embedded computers.

Some embodiments of the invention may enable the design of state of the art electronic systems at a greatly reduced non-recurring engineering (NRE) cost by the use of high density 3D FPGAs or various forms of 3D array based ICs with reduced custom masks as described herein. These systems could be deployed in many products and in many market segments. Reduction of the NRE may enable new product family or application development and deployment early in the product lifecycle by lowering the risk of upfront investment prior to a market being developed. The above potential advantages may also be provided by various mixes such as reduced NRE using generic masks for layers of logic and other generic masks for layers of memories and building a very complex system using the repair technology to overcome the inherent yield difficulties. Another form of mix could be building a 3D FPGA and add on it 3D layers of customizable logic and memory so the end system could have field programmable logic on top of the factory customized logic. There may be many ways to mix the many innovative elements to form 3D IC to support the needs of an end system, including using multiple devices wherein more than one device incorporates elements of embodiments of the invention. An end system could benefit from a memory devices utilizing the 3D memory of some embodiments of the invention together with high performance 3D FPGA of some of the embodiments of the invention together with high density 3D logic and so forth. Using devices that can use one or multiple elements according to some embodiments of the invention may allow for increased performance or lower power and other potential advantages resulting from the use of some embodiments of the inventions to provide the end system with a competitive edge. Such end system could be electronic based products or other types of systems that may include some level of embedded electronics, such as, for example, cars and remote controlled vehicles.

Commercial wireless mobile communications have been developed for almost thirty years, and play a special role in today's information and communication technology Industries. The mobile wireless terminal device has become part of our life, as well as the Internet, and the mobile wireless terminal device may continue to have a more important role on a worldwide basis. Currently, mobile (wireless) phones are undergoing much development to provide advanced functionality. The mobile phone network is a network such as a GSM, GPRS, or WCDMA, 3G and 4G standards, and the network may allow mobile phones to communicate with each other. The base station may be for transmitting (and receiving) information to the mobile phone.

A typical mobile phone system may include, for example, a processor, a flash memory, a static random access memory, a display, a removable memory, a radio frequency (RF) receiver/transmitter, an analog base band (ABB), a digital base band (DBB), an image sensor, a high-speed bi-directional interface, a keypad, a microphone, and a speaker. A typical mobile phone system may include a multiplicity of an element, for example, two or more static random access memories, two or more displays, two or more RF receiver/transmitters, and so on.

Conventional radios used in wireless communications, such as radios used in conventional cellular telephones, typically may include several discrete RF circuit components. Some receiver architectures may employ superheterodyne techniques. In a superhetrodyne architecture an incoming signal may be frequency translated from its radio frequency (RF) to a lower intermediate frequency (IF). The signal at IF may be subsequently translated to baseband where further digital signal processing or demodulation may take place. Receiver designs may have multiple IF stages. The reason for using such a frequency translation scheme is that circuit design at the lower IF frequency may be more manageable for signal processing. It is at these IF frequencies that the selectivity of the receiver may be implemented, automatic gain control (AGC) may be introduced, etc.

A mobile phone's need of a high-speed data communication capability in addition to a speech communication capability has increased in recent years. In GSM (Global System for Mobile communications), one of European Mobile Communications Standards, GPRS (General Packet Radio Service) has been developed for speeding up data communication by allowing a plurality of time slot transmissions for one time slot transmission in the GSM with the multiplexing TDMA (Time Division Multiple Access) architecture. EDGE (Enhanced Data for GSM Evolution) architecture provides faster communications over GPRS.

4th Generation (4G) mobile systems aim to provide broadband wireless access with nominal data rates of 100 Mbit/s. 4G systems may be based on the 3GPP LTE (Long Term Evolution) cellular standard, WiMax or Flash-OFDM wireless metropolitan area network technologies. The radio interface in these systems may be based on all-IP packet switching, MIMO diversity, multi-carrier modulation schemes, Dynamic Channel Assignment (DCA) and channel-dependent scheduling.

Prior art such as U.S. application Ser. No. 12/871,984 may provide a description of a mobile device and its block-diagram.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. For example, as utilized herein, the following terms are generally defined:

(1) Mobile computing/communication device (MCD): is a device that may be a mobile communication device, such as a cell phone, or a mobile computer that performs wired and/or wireless communication via a connected wireless/wired network. In some embodiments, the MCD may include a combination of the functionality associated with both types of devices within a single standard device (e.g., a smart phones or personal digital assistant (PDA)) for use as both a communication device and a computing device.

Figure 9:
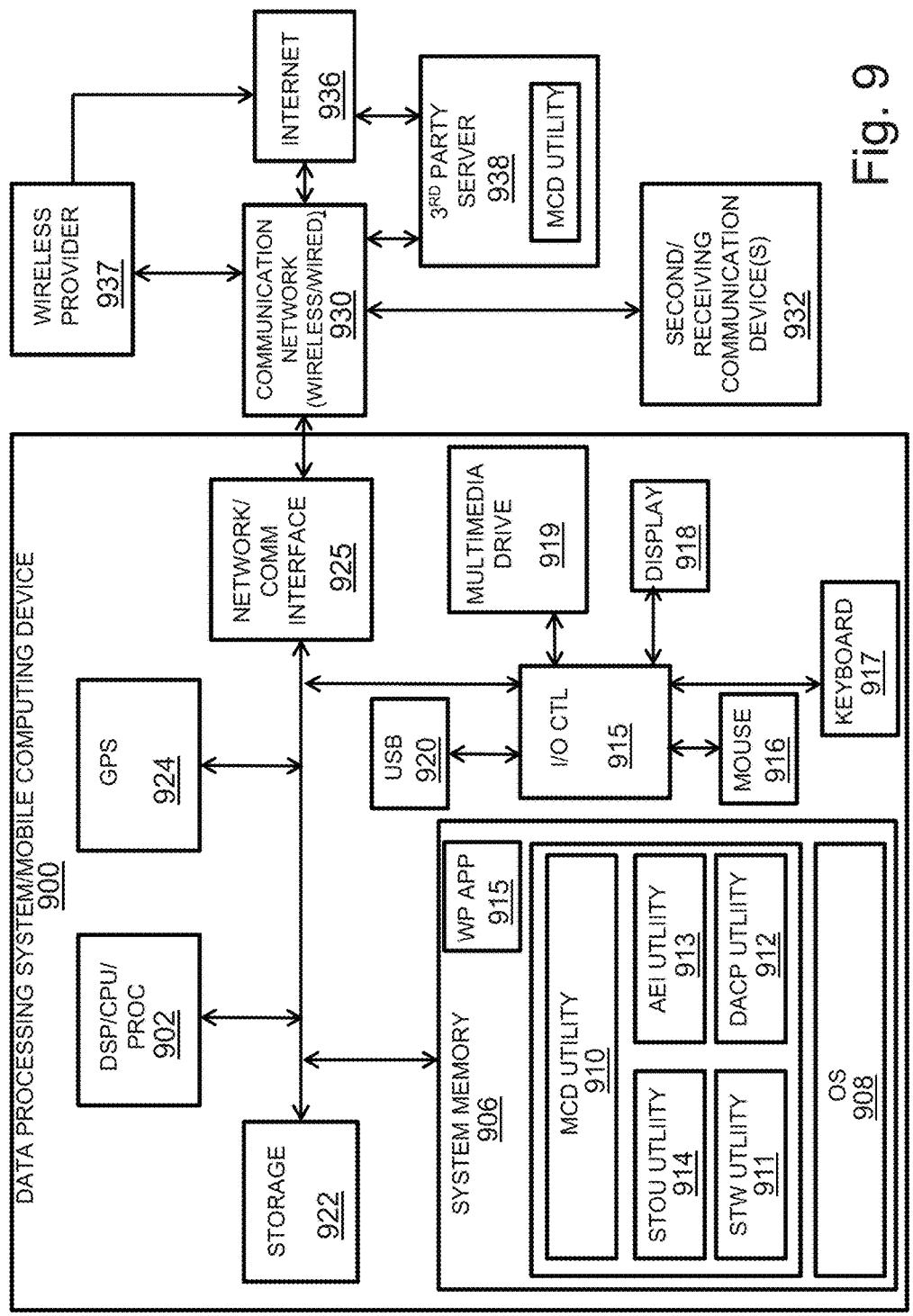
FIG. 9 is a block diagram representation of an exemplary mobile computing device (MCD).

A block diagram representation of an exemplary mobile computing device (MCD) is illustrated in FIG. 9, within which several of the features of the described embodiments may be implemented. MCD 900 may be a desktop computer, a portable computing device, such as a laptop, personal digital assistant (PDA), a smart phone, and/or other types of electronic devices that may generally be considered processing devices. As illustrated, MCD 900 may include at least one processor or central processing unit (CPU) 902 which may be connected to system memory 906 via system interconnect/bus 904. CPU 902 may include at least one digital signal processing unit (DSP). Also connected to system interconnect/bus 904 may be input/output (I/O) controller 915, which may provide connectivity and control for input devices, of which pointing device (or mouse) 916 and keyboard 917 are illustrated. I/O controller 915 may also provide connectivity and control for output devices, of which display 918 is illustrated. Additionally, a multimedia drive 919 (e.g., compact disk read/write (CDRW) or digital video disk (DVD) drive) and USB (universal serial bus) port 920 are illustrated, and may be coupled to I/O controller 915. Multimedia drive 919 and USB port 920 may enable insertion of a removable storage device (e.g., optical disk or "thumb" drive) on which data/instructions/code may be stored and/or from which data/instructions/code may be retrieved. MCD 900 may also include storage 922, within/from which data/instructions/code may also be stored/retrieved. MCD 900 may further include a global positioning system (GPS) or local position system (LPS) detection component 924 by which MCD 900 may be able to detect its current location (e.g., a geographical position) and movement of MCD 900, in real time. MCD 900 may include a network/communication interface 925, by which MCD 900 may connect to one or more second communication devices 932 or to wireless service provider server 937, or to a third party server 938 via one or more access/external communication networks, of which a wireless Communication Network 930 is provided as one example and the Internet 936 is provided as a second example. It is appreciated that MCD 900 may connect to third party server 938 through an initial connection with Communication Network 930, which in turn may connect to third party server 938 via the Internet 936.

In addition to the above described hardware components of MCD 900, various features of the described embodiments may be completed/supported via software (or firmware) code or logic stored within system memory 906 or other storage (e.g., storage 922) and may be executed by CPU 902. Thus, for example, illustrated within system memory 906 are a number of software/firmware/logic components, including operating system (OS) 908 (e.g., Microsoft Windows® or Windows Mobile®, trademarks of Microsoft Corp, or GNU®/Linux®, registered trademarks of the Free Software Foundation and The Linux Mark Institute, and AIX®, registered trademark of International Business Machines), and (word processing and/or other) application(s) 909. Also illustrated are a plurality (four illustrated) software implemented utilities, each providing different one of the various functions (or advanced features) described herein. Including within these various functional utilities are: Simultaneous Text Waiting (STW) utility 911, Dynamic Area Code Pre-pending (DACP) utility 912, Advanced Editing and Interfacing (AEI) utility 912 and Safe Texting Device Usage (STDU) utility 914. In actual implementation and for simplicity in the following descriptions, each of these different functional utilities are assumed to be packaged together as sub-components of a general MCD utility 910, and the various utilities are interchangeably referred to as MCD utility 910 when describing the utilities within the figures and claims. For simplicity, the following description will refer to a single utility, namely MCD utility 910. MCD utility 910 may, in some embodiments, be combined with one or more other software modules, including for example, word processing application(s) 909 and/or OS 908 to provide a single executable component, which then may provide the collective functions of each individual software component when the corresponding combined code of the single executable component is executed by CPU 902. Each separate utility 111/112/113/114 is illustrated and described as a standalone or separate software/firmware component/module, which provides specific functions, as described below. As a standalone component/module, MCD utility 910 may be acquired as an off-the-shelf or aftermarket or downloadable enhancement to existing program applications or device functions, such as voice call waiting functionality (not shown) and user interactive applications with editable content, such as, for example, an application within the Windows Mobile® suite of applications. In at least one implementation, MCD utility 910 may be downloaded from a server or website of a wireless provider (e.g., wireless service provider server 937) or a third party server 938, and either installed on MCD 900 or executed from the wireless service provider server 937 or third party server 913.

CPU 902 may execute MCD utility 910 as well as OS 908, which, in one embodiment, may support the user interface features of MCD utility 910, such as generation of a graphical user interface (GUI), where required/supported within MCD utility code. In several of the described embodiments, MCD utility 910 may generate/provide one or more GUIs to enable user interaction with, or manipulation of, functional features of MCD utility 910 and/or of MCD 900. MCD utility 910 may, in certain embodiments, enable certain hardware and firmware functions and may thus be generally referred to as MCD logic.

Some of the functions supported and/or provided by MCD utility 910 may be enabled as processing code/instructions/logic executing on DSP/CPU 902 and/or other device hardware, and the processor thus may complete the implementation of those function(s). Among, for example, the software code/instructions/logic provided by MCD utility 910, and which are specific to some of the described embodiments of the invention, may be code/logic for performing several (one or a plurality) of the following functions: (1) Simultaneous texting during ongoing voice communication providing a text waiting mode for both single number mobile communication devices and multiple number mobile communication devices; (2) Dynamic area code determination and automatic back-filling of area codes when a requested/desired voice or text communication is initiated without the area code while the mobile communication device is outside of its home-base area code toll area; (3) Enhanced editing functionality for applications on mobile computing devices; (4) Automatic toggle from manual texting mode to voice-to-text based communication mode on detection of high velocity movement of the mobile communication device; and (5) Enhanced e-mail notification system providing advanced e-mail notification via (sender or recipient directed) texting to a mobile communication device.

Utilizing monolithic 3D IC technology described herein and in related application Ser. Nos. 12/903,862, 12/903,847, 12/904,103 and 13/041,405 significant power and cost could be saved. Most of the elements in MCD 900 could be integrated in one 3D IC. Some of the MCD 900 elements may be logic functions which could utilize monolithic 3D transistors such as, for example, RCAT or Gate-Last. Some of the MCD 900 elements are storage devices and could be integrated on a 3D non-volatile memory device, such as, for example, 3D NAND or 3D RRAM, or volatile memory such as, for example, 3D DRAM or SRAM formed from RCAT or gate-last transistors, as been described herein. Storage 922 elements formed in monolithic 3D could be integrated on top or under a logic layer to reduce power and space. Keyboard 917 could be integrated as a touch screen or combination of image sensor and some light projection and could utilize structures described in some of the above mentioned related applications. The network/communication interface 925 could utilize another layer of silicon optimized for RF and gigahertz speed analog circuits or even may be integrated on substrates, such as GaN, that may be a better fit for such circuits. As more and more transistors might be integrated to achieve a high complexity 3D IC system there might be a need to use some embodiments of the invention such as what were called repair and redundancy so to achieve good product yield.

Some of the system elements including non-mobile elements, such as the 3rd Party Server 938, might also make use of some embodiments of the 3D IC inventions including repair and redundancy to achieve good product yield for high complexity and large integration. Such large integration may reduce power and cost of the end product which is most attractive and most desired by the system end-use customers.

Some embodiments of the 3D IC invention could be used to integrate many of the MCD 900 blocks or elements into one or a few devices. As various blocks get tightly integrated, much of the power required to transfer signals between these elements may be reduced and similarly costs associated with these connections may be saved. Form factor may be compacted as the space associated with the individual substrate and the associated connections may be reduced by use of some embodiments of the 3D IC invention. For mobile device these may be very important competitive advantages. Some of these blocks might be better processed in different process flow or wafer fab location. For example the DSP/CPU 902 is a logic function that might use a logic process flow while the storage 922 might better be done using a NAND Flash technology process flow or wafer fab. An important advantage of some of the embodiments of the monolithic 3D inventions may be to allow some of the layers in the 3D structure to be processed using a logic process flow while another layer in the 3D structure might utilize a memory process flow, and then some other function the modems of the GPS or local position system (LPS) detection component 924 might use a high speed analog process flow or wafer fab. As those diverse functions may be structured in one device onto many different layers, these diverse functions could be very effectively and densely vertically interconnected.

It will also be appreciated by persons of ordinary skill in the art that the invention is not limited to what has been particularly shown and described hereinabove. For example, drawings or illustrations may not show n or p wells for clarity in illustration. Further, combinations and sub-combinations of the various features described hereinabove may be utilized to form a 3D IC based system. Rather, the scope of the invention includes both combinations and sub-combinations of the various features described hereinabove as well as modifications and variations which would occur to such skilled persons upon reading the foregoing description. Thus the invention is to be limited only by the appended claims.

What is claimed is:

1. A 3D integrated circuit device, comprising:
a first transistor;
a second transistor; and
a third transistor,
wherein said third transistor is overlaying said second transistor and said second transistor is overlaying said first transistor,
wherein said first transistor controls the supply of a ground or a power signal to said third transistor, and
wherein said first transistor, said second transistor and said third transistor are aligned to each other with less than 100 nm misalignment.

2. The device according to claim 1,
wherein said second transistor and said third transistor are junction-less transistors.

3. The device according to claim 1, further comprising:
a second transistor gate dielectric; and
a third transistor gate dielectric,
wherein said second transistor gate dielectric and said third transistor gate dielectric are part of the same layer.

4. The device according to claim 1,
wherein said second transistor and said third transistor each have a first gate and a second gate.

5. The device according to claim 1,
wherein said second transistor and said third transistor each have a first gate and a second gate,
wherein said second transistor first gate is connected to said third transistor first gate, and
wherein said first gate is not connected to said second gate.

6. The device according to claim 1,
wherein said third transistor is controlled by a third control line,
wherein said second transistor is controlled by a second control line, and
wherein said first transistor is part of a control circuit controlling said second control line and third control line.

7. The device according to claim 1,
wherein said second transistor is self-aligned to said third transistor.

8. A 3D integrated circuit device, comprising:
a first transistor;
a second transistor, said second transistor has a second transistor gate dielectric; and
a third transistor, said third transistor has a third transistor gate dielectric,
wherein said third transistor is overlaying said second transistor and said second transistor is overlaying said first transistor,
wherein said second transistor and said third transistor are junction-less transistors,
wherein said second transistor gate dielectric and said third transistor gate dielectric are part of the same layer, and
wherein said first transistor, said second transistor and said third transistor are aligned to each other with less than 100 nm misalignment.

9. The device according to claim 8, further comprising:
a third memory cell comprising said third transistor;
a second memory cell comprising said second transistor; and
a memory periphery circuit comprising said first transistor,
wherein said memory periphery circuits control said third memory cell and second memory cell.

10. The device according to claim 8,
wherein said second transistor is connected to said third transistor with an ohmic connection.

11. The device according to claim 8,
wherein said second transistor and said third transistor each have a first gate and a second gate.

12. The device according to claim 8,
wherein said second transistor and said third transistor each have a first gate and a second gate,
wherein said second transistor first gate is connected to said third transistor first gate, and
wherein said first gate is not connected to said second gate.

13. The device according to claim 8,
wherein said third transistor is controlled by a third control line,
wherein said second transistor is controlled by a second control line, and
wherein said first transistor is part of a control circuit controlling said second control line and third control line.

14. The device according to claim 8,
wherein said second transistor is self-aligned to said third transistor.

15. A 3D integrated circuit device, comprising:
a first transistor;
a second transistor; and
a third transistor,
   wherein said third transistor is overlaying said second transistor and said second transistor is overlaying said first transistor,
   wherein said second transistor and said third transistor each have a first gate and a second gate,
   wherein said second transistor first gate is connected to said third transistor first gate,
   wherein said first gate is not connected to said second gate, and
   wherein said first transistor, said second transistor and said third transistor are aligned to each other with less than 100 nm misalignment.

16. The device according to claim 15, further comprising:
a third memory cell comprising said third transistor;
a second memory cell comprising said second transistor; and
a memory periphery circuit comprising said first transistor,
   wherein said memory periphery circuit controls said third memory cell and second memory cell.

17. The device according to claim 15,
wherein said second transistor is connected to said third transistor with an ohmic connection.

18. The device according to claim 15,
wherein said second transistor and said third transistor are junction-less transistors.

19. The device according to claim 15, further comprising:
a second transistor gate dielectric; and
a third transistor gate dielectric,
   wherein said second transistor gate dielectric and said third transistor gate dielectric are part of the same layer.

20. The device according to claim 15,
wherein said second transistor is self-aligned to said third transistor.

* * * * *